(12) United States Patent
Baenninger et al.

(10) Patent No.: US 9,419,135 B2
(45) Date of Patent: Aug. 16, 2016

(54) THREE DIMENSIONAL NAND DEVICE HAVING REDUCED WAFER BOWING AND METHOD OF MAKING THEREOF

(71) Applicant: SanDisk Technologies, Inc., Plano, TX (US)

(72) Inventors: Matthias Baenninger, Menlo Park, CA (US); Jayavel Pachamuthu, San Jose, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/540,479

(22) Filed: Nov. 13, 2014

(65) Prior Publication Data
US 2016/0141419 A1 May 19, 2016

(51) Int. Cl.
*H01L 29/78* (2006.01)
*H01L 27/115* (2006.01)
*H01L 29/788* (2006.01)
*H01L 29/792* (2006.01)
*H01L 29/66* (2006.01)

(52) U.S. Cl.
CPC ........ *H01L 29/7846* (2013.01); *H01L 27/1157* (2013.01); *H01L 27/11524* (2013.01); *H01L 27/11551* (2013.01); *H01L 27/11578* (2013.01); *H01L 29/66825* (2013.01); *H01L 29/66833* (2013.01); *H01L 29/7889* (2013.01); *H01L 29/7926* (2013.01)

(58) Field of Classification Search
CPC ............... H01L 27/11524; H01L 27/11551; H01L 27/1157; H01L 27/11578; H01L 27/11529; H01L 27/11556; H01L 27/11582; H01L 29/7926; H01L 29/7889; H01L 29/7842; H01L 29/7843; H01L 29/7845; H01L 29/7846; H01L 29/66825; H01L 29/66833
See application file for complete search history.

(56) References Cited

U.S. PATENT DOCUMENTS

| | | | |
|---|---|---|---|
| 5,915,167 | A | 6/1999 | Leedy |
| 2010/0078622 | A1 | 4/2010 | Yoshimizu |
| 2011/0151667 | A1 | 6/2011 | Hwang et al. |
| 2012/0064682 | A1 | 3/2012 | Jang |
| 2012/0208347 | A1 | 8/2012 | Hwang |

(Continued)

OTHER PUBLICATIONS

Office Communication Concerning Corresponding U.S. Appl No. 14/501,539, filed Sep. 30, 2014, (19 pages).

(Continued)

*Primary Examiner* — Armando Rodriguez
(74) *Attorney, Agent, or Firm* — The Marbury Law Group PLLC

(57) ABSTRACT

A monolithic three dimensional NAND string includes a plurality of control gate electrodes extending substantially parallel to a major surface of a substrate, and at least one trench extending substantially perpendicular to the major surface of the substrate. The trench is filled with at least a first trench material and a second trench material. The first trench material includes a material under a first magnitude of a first stress type, and the second trench material includes a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate.

14 Claims, 54 Drawing Sheets

(56) References Cited

U.S. PATENT DOCUMENTS

2013/0126957 A1    5/2013    Higashitani et al.
2013/0161629 A1    6/2013    Han

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/468,743, filed Aug. 26, 2014, SanDisk Technologies Inc.
U.S. Appl. No. 14/501,539, filed Sep. 30, 2014, SanDisk Technologies Inc.
U.S. Appl. No. 14/491,315, filed Sep. 19, 2014, SanDisk Technologies Inc.
U.S. Appl. No. 14/491,026, filed Sep. 19, 2014, SanDisk Technologies Inc.
U.S. Appl. No. 14/462,209, filed Aug. 14, 2014, SanDisk Technologies Inc.
International Search Report and Written Opinion, International Application No. PCT/US2015/052712, issued Dec. 9, 2015, 11pgs.

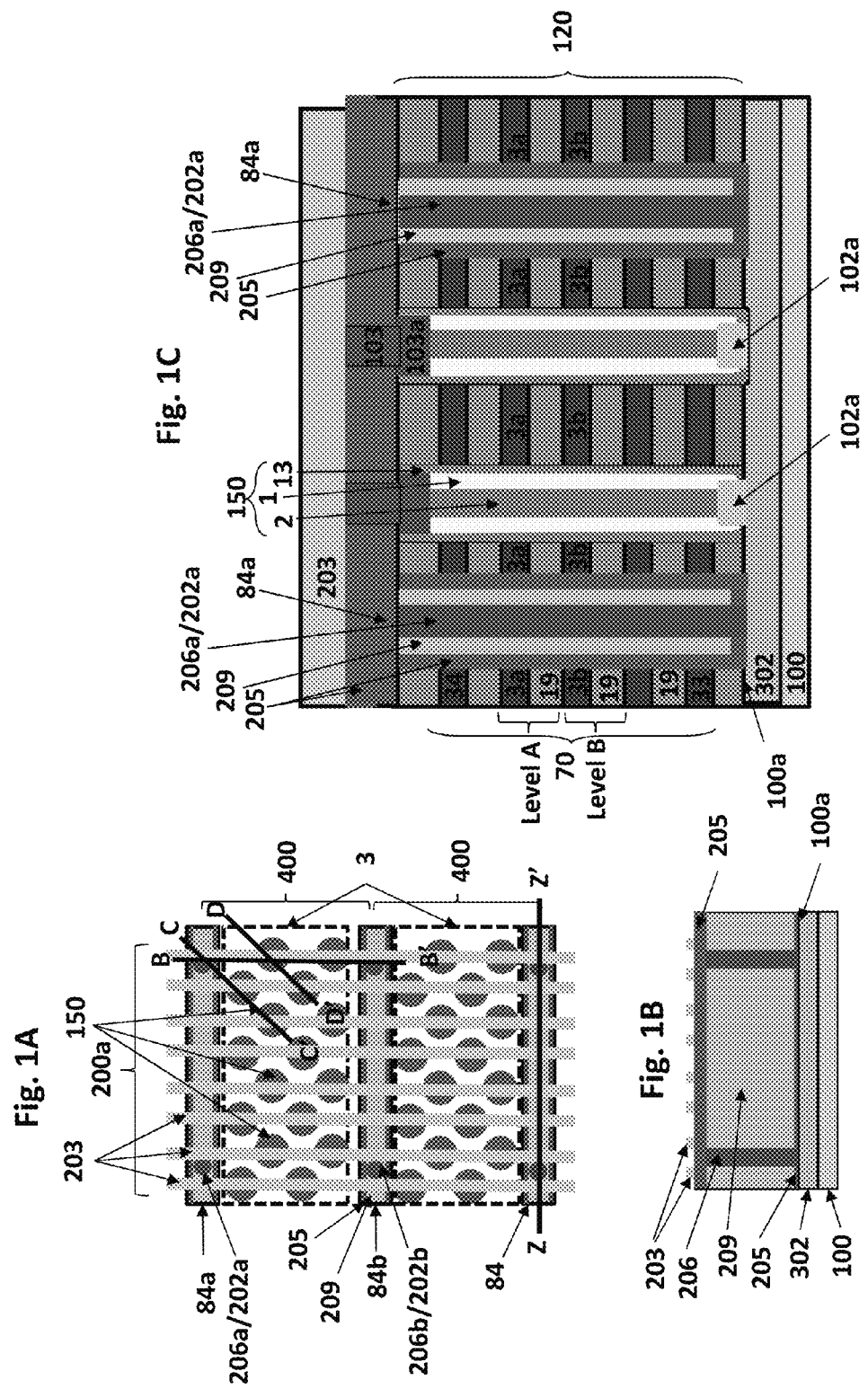

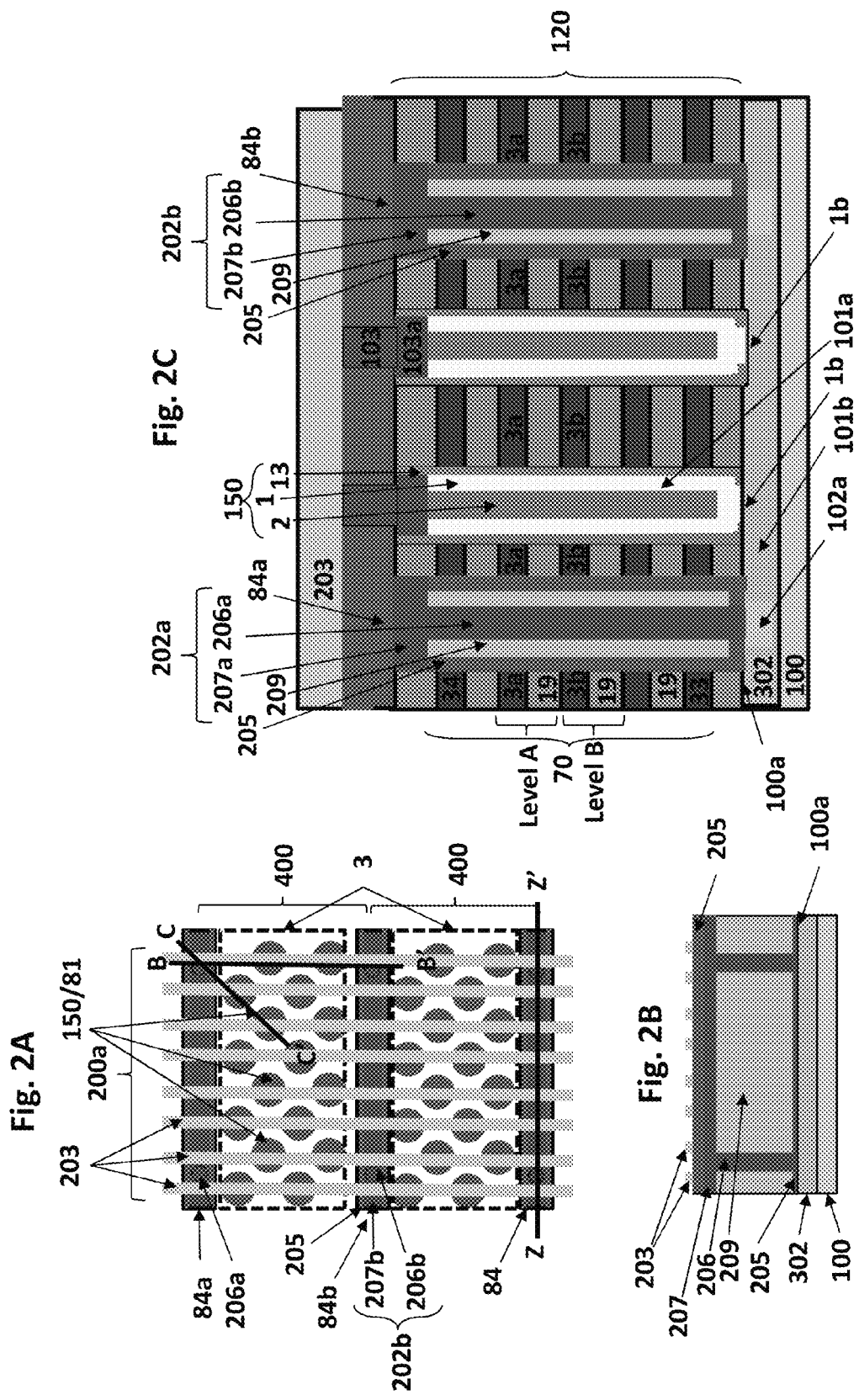

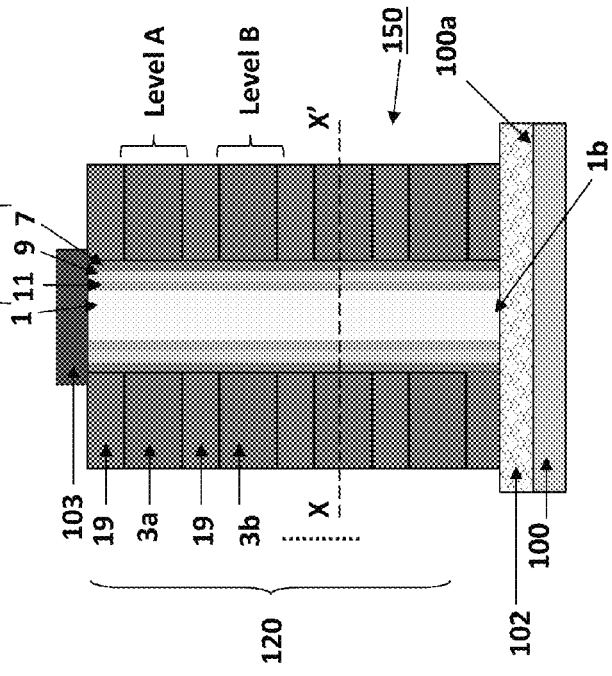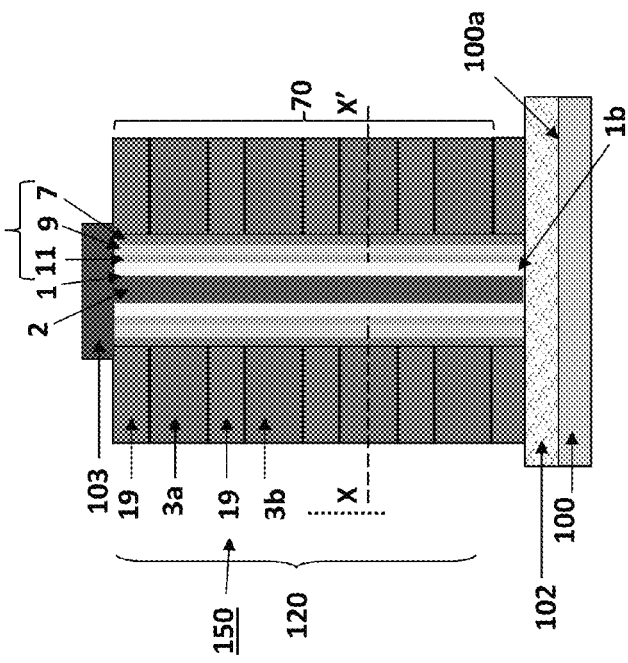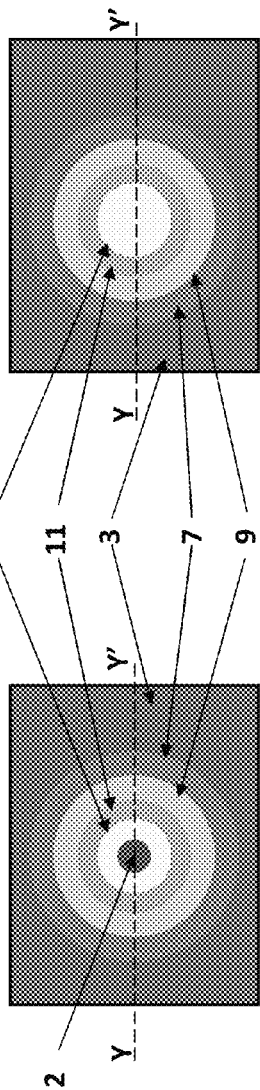

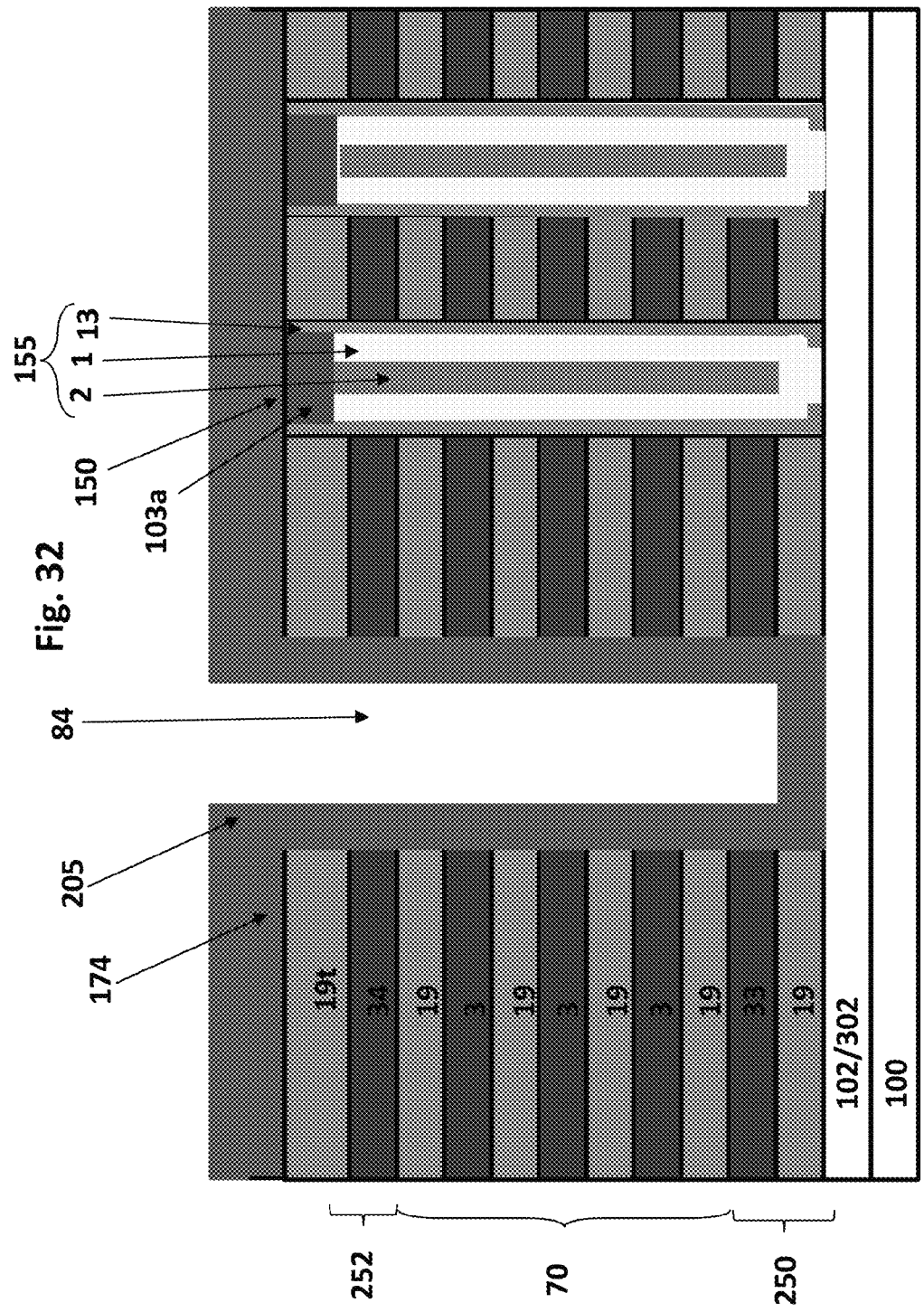

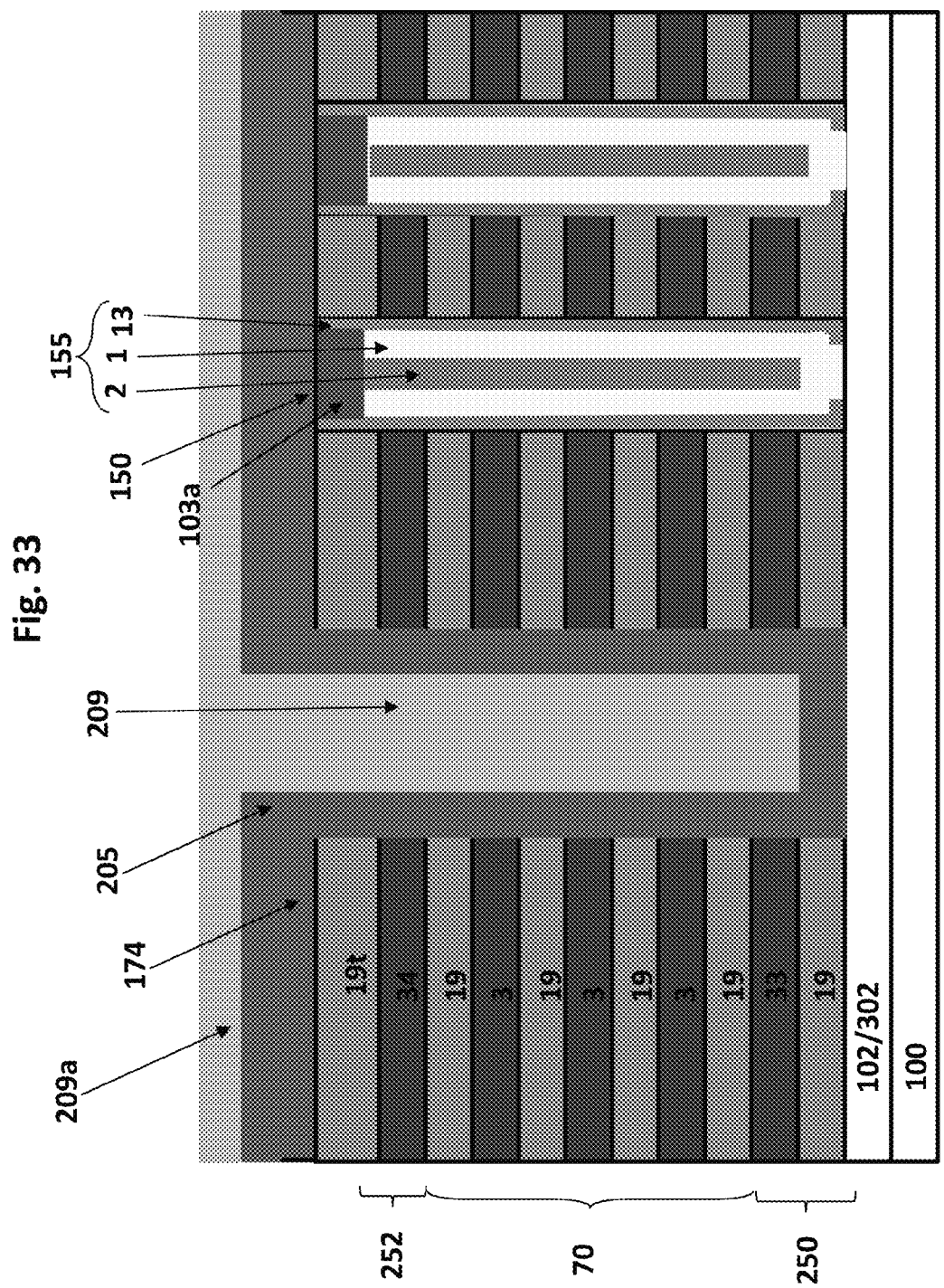

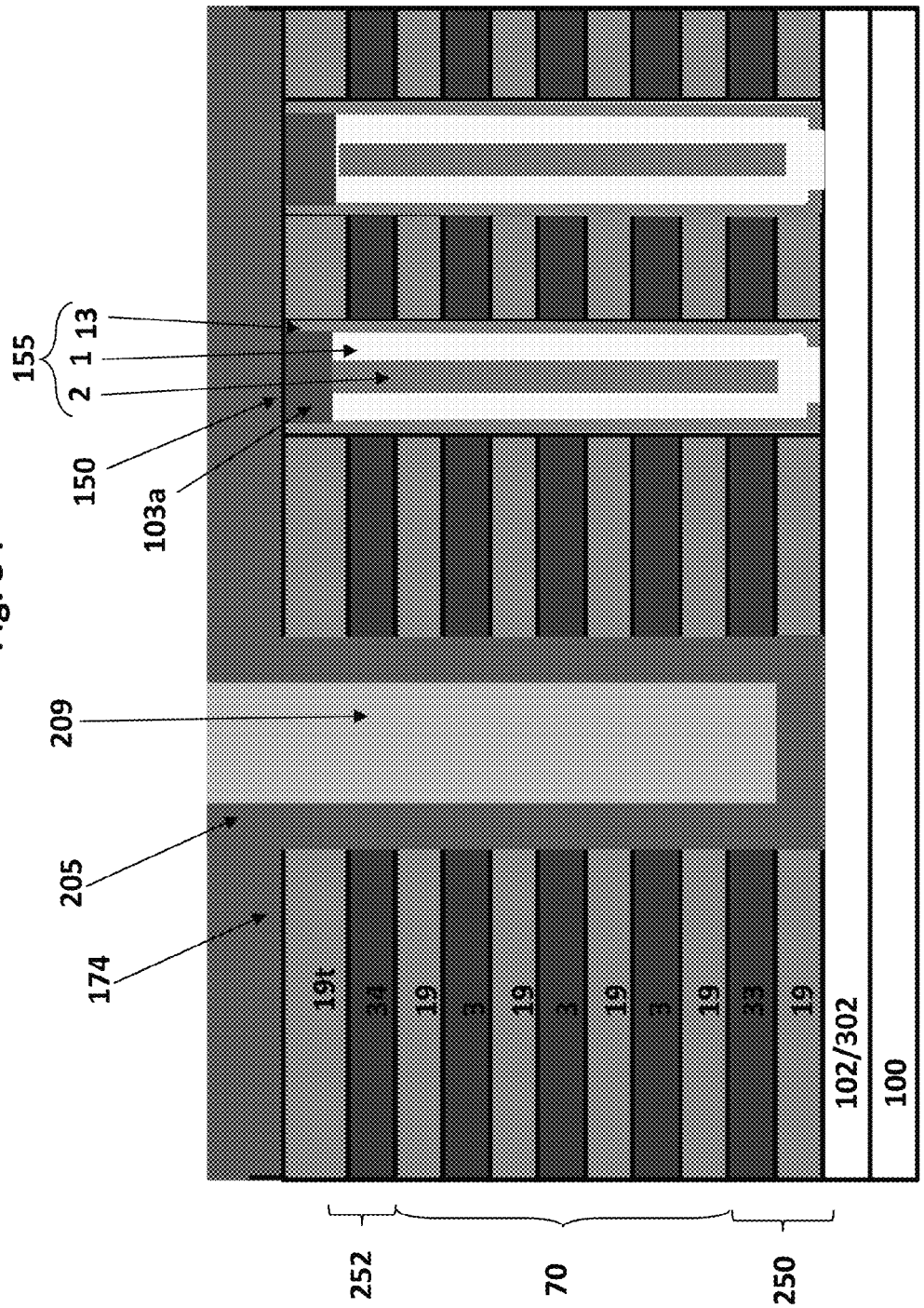

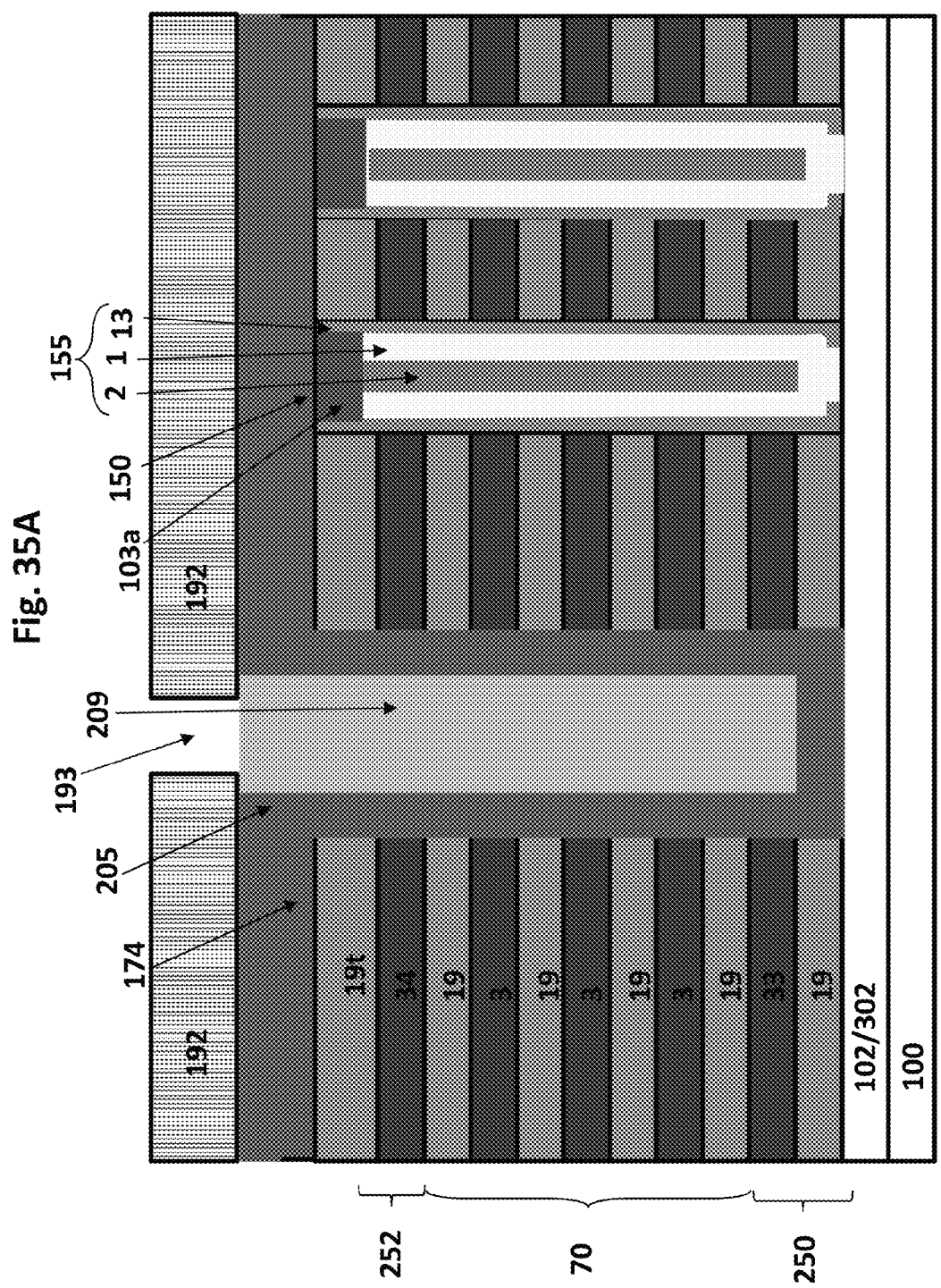

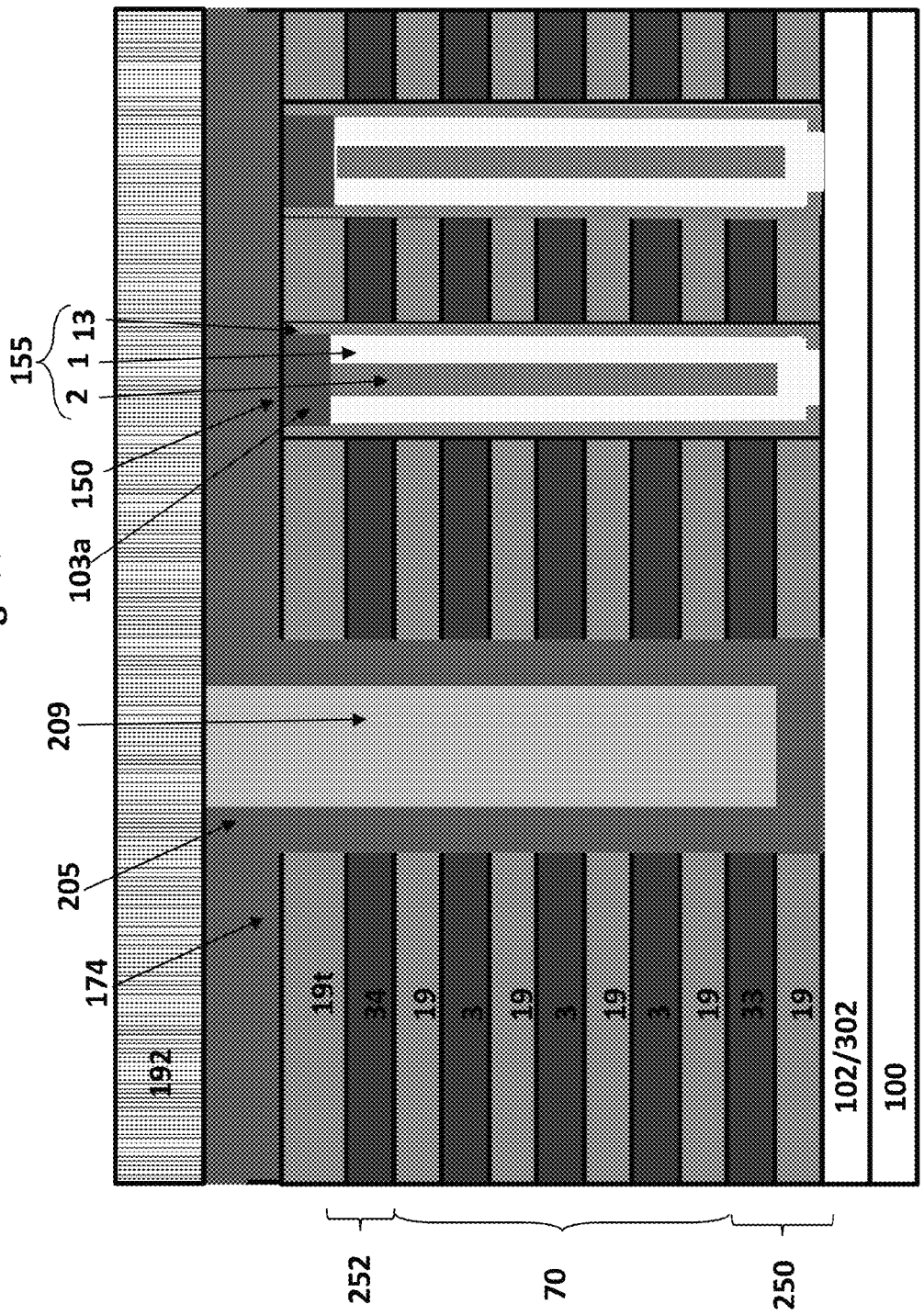

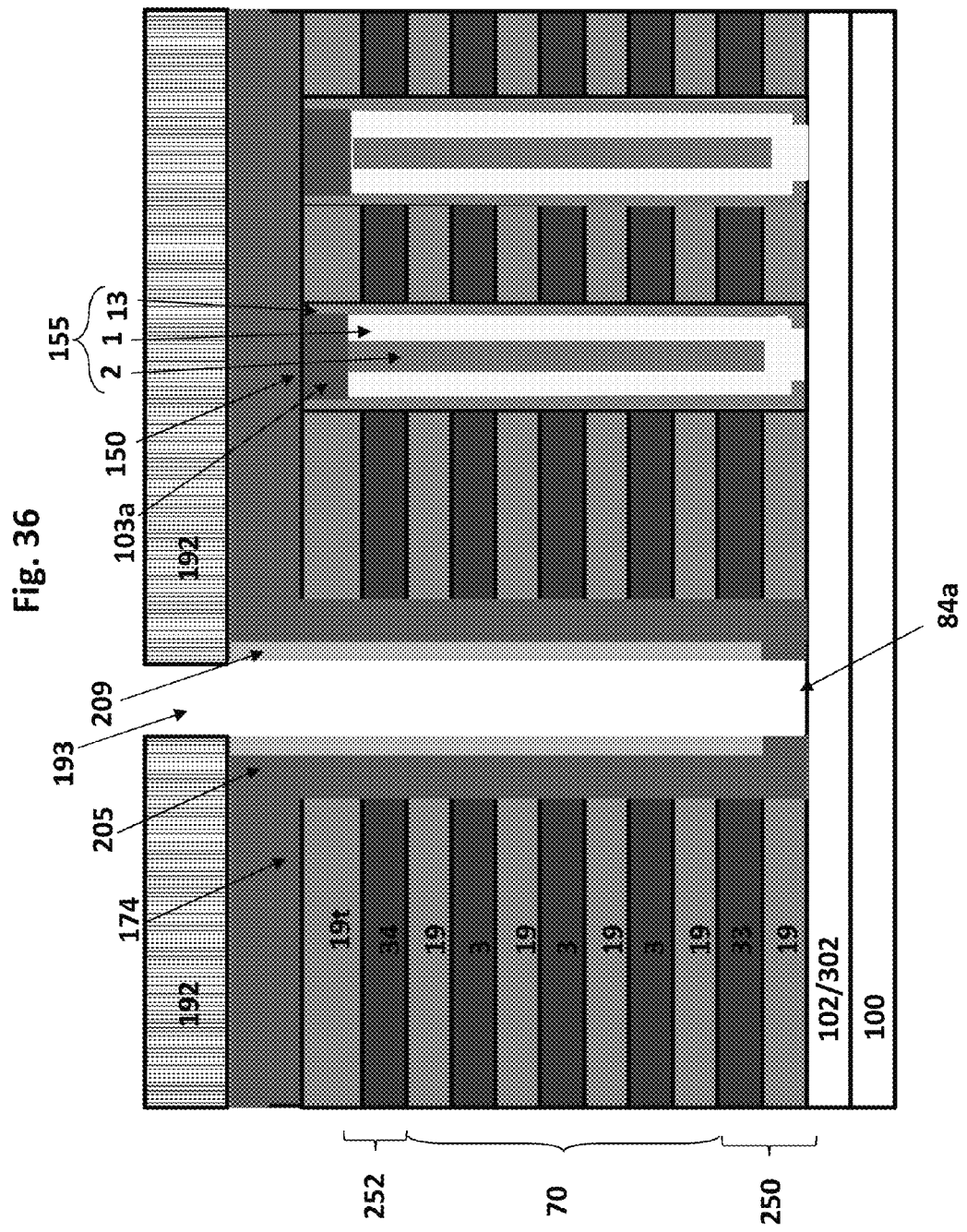

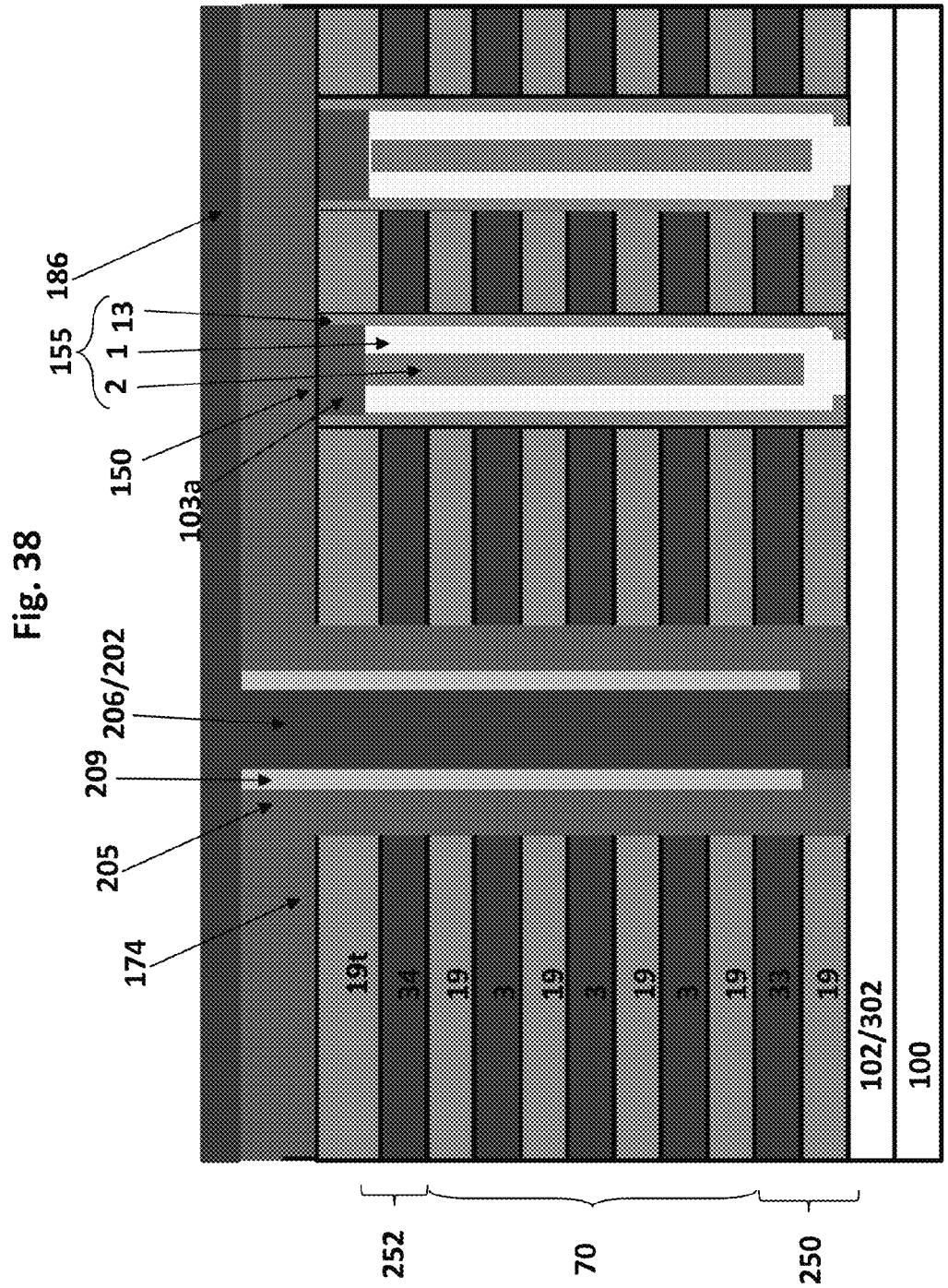

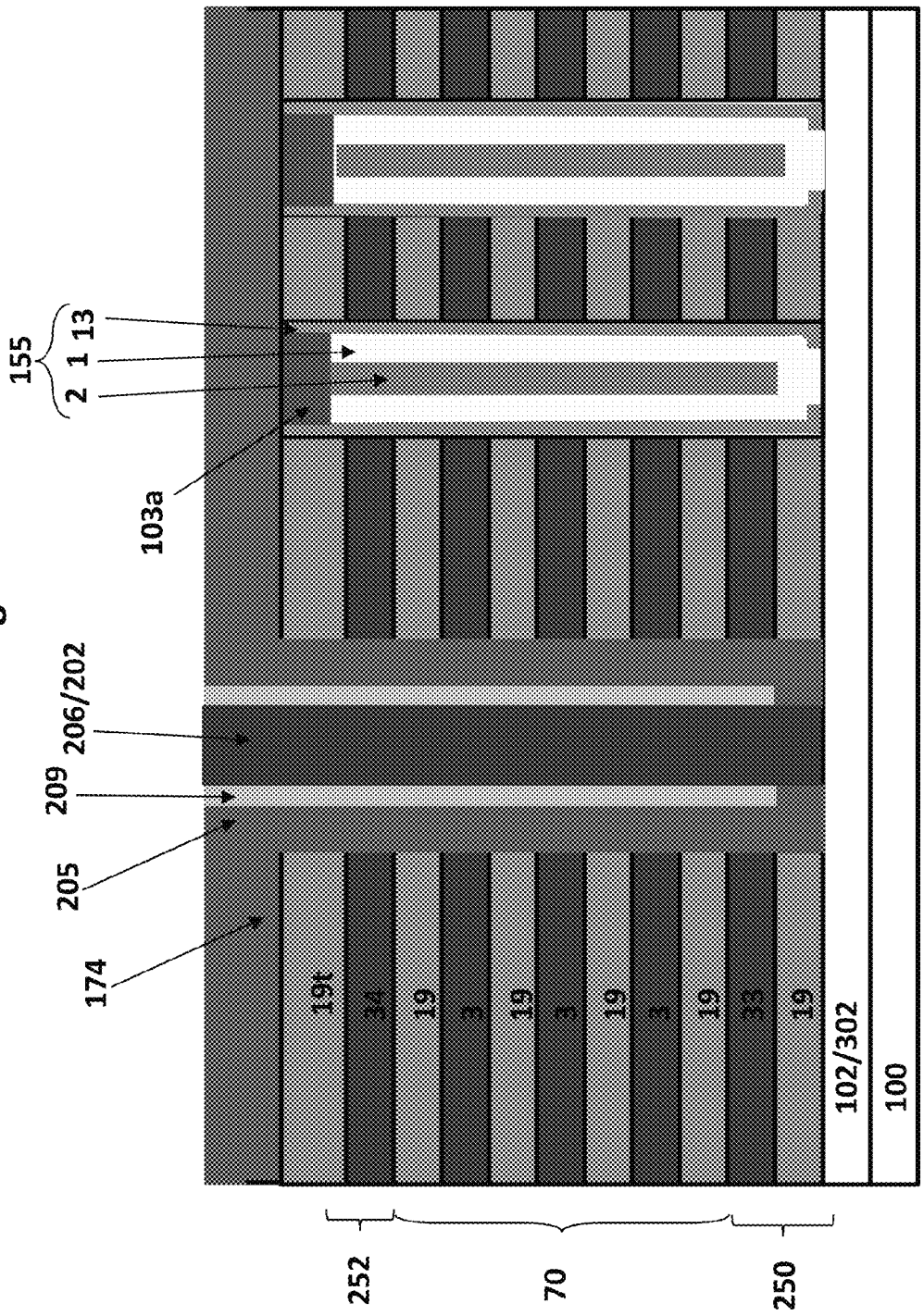

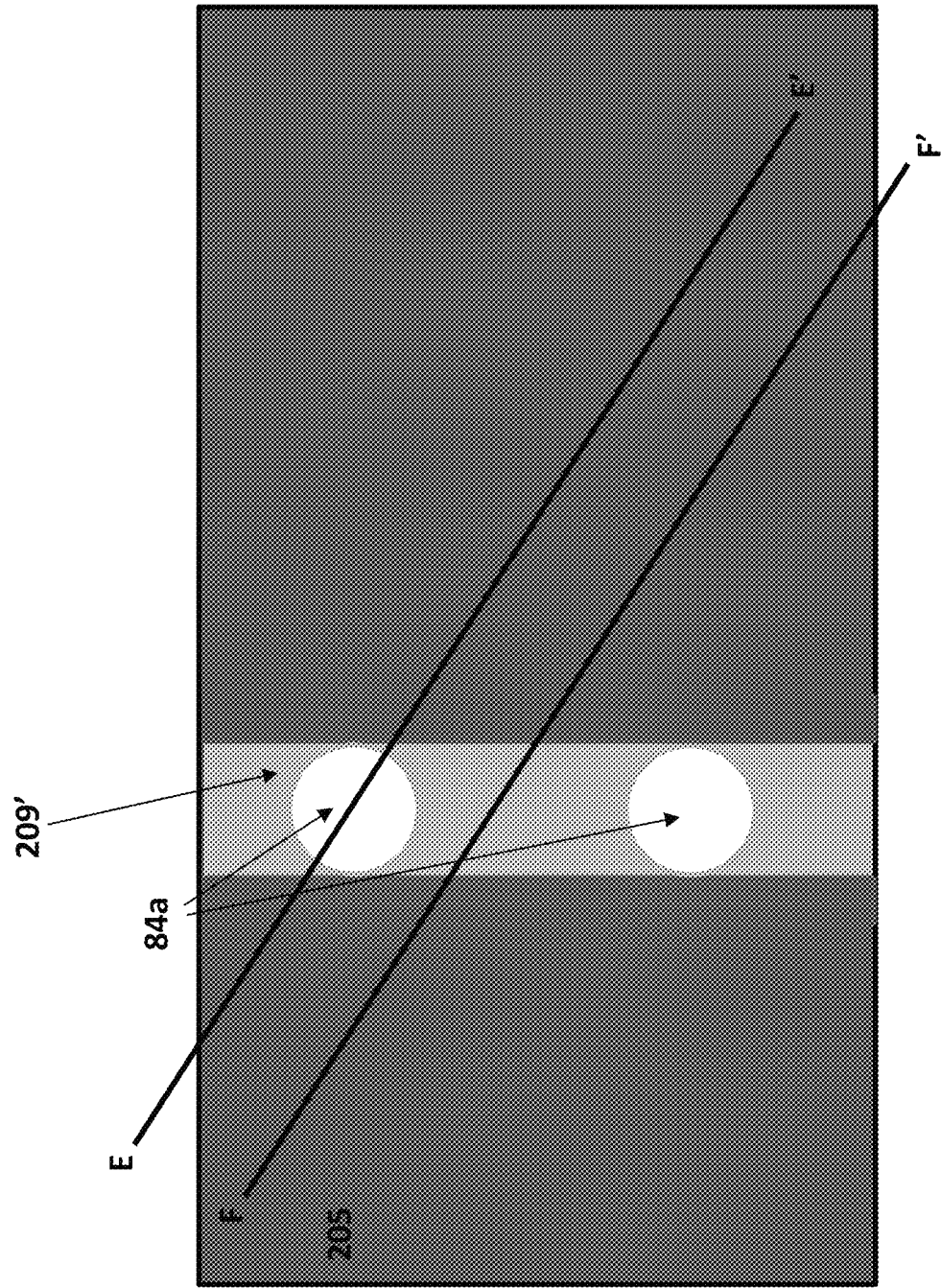

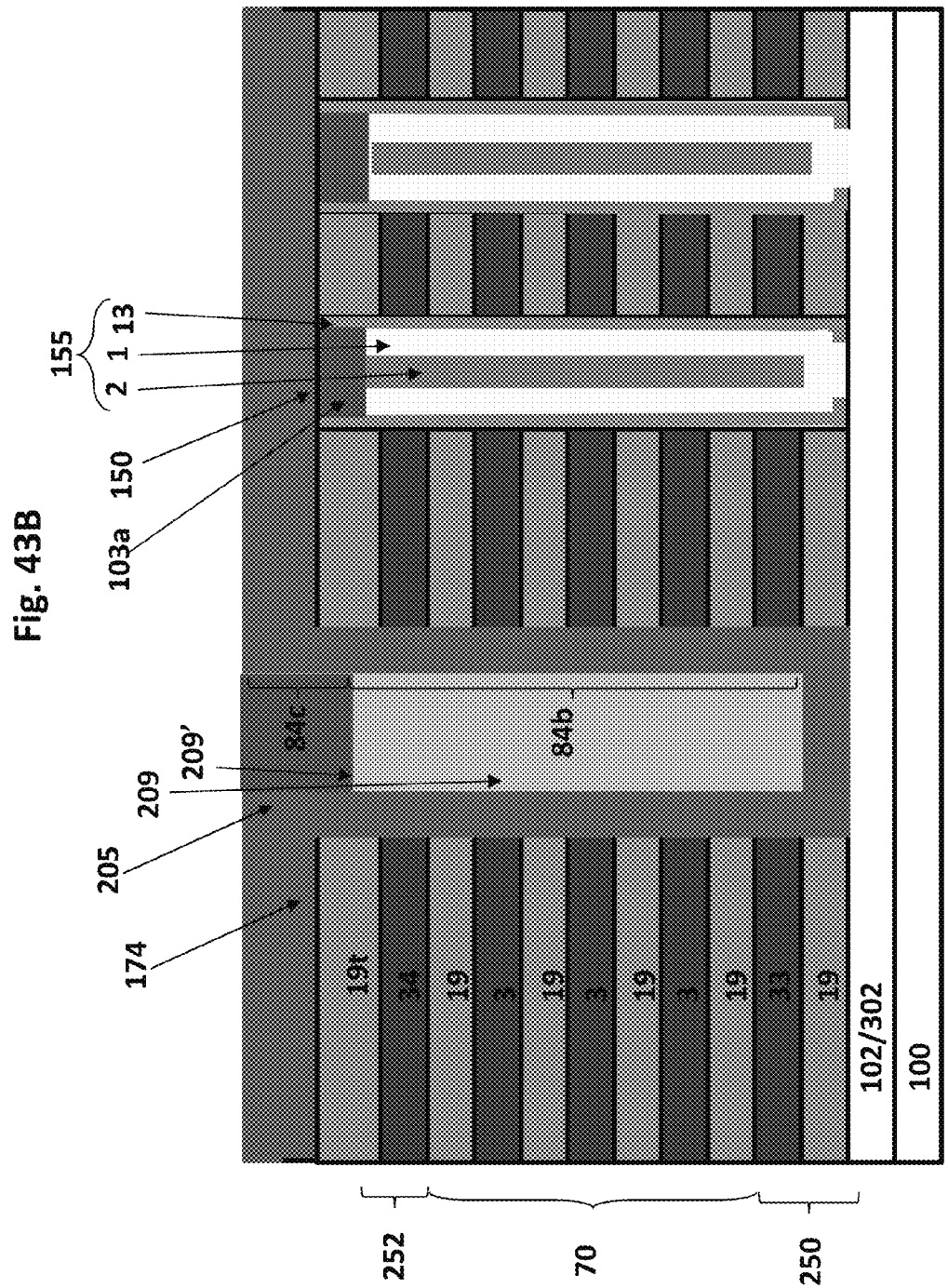

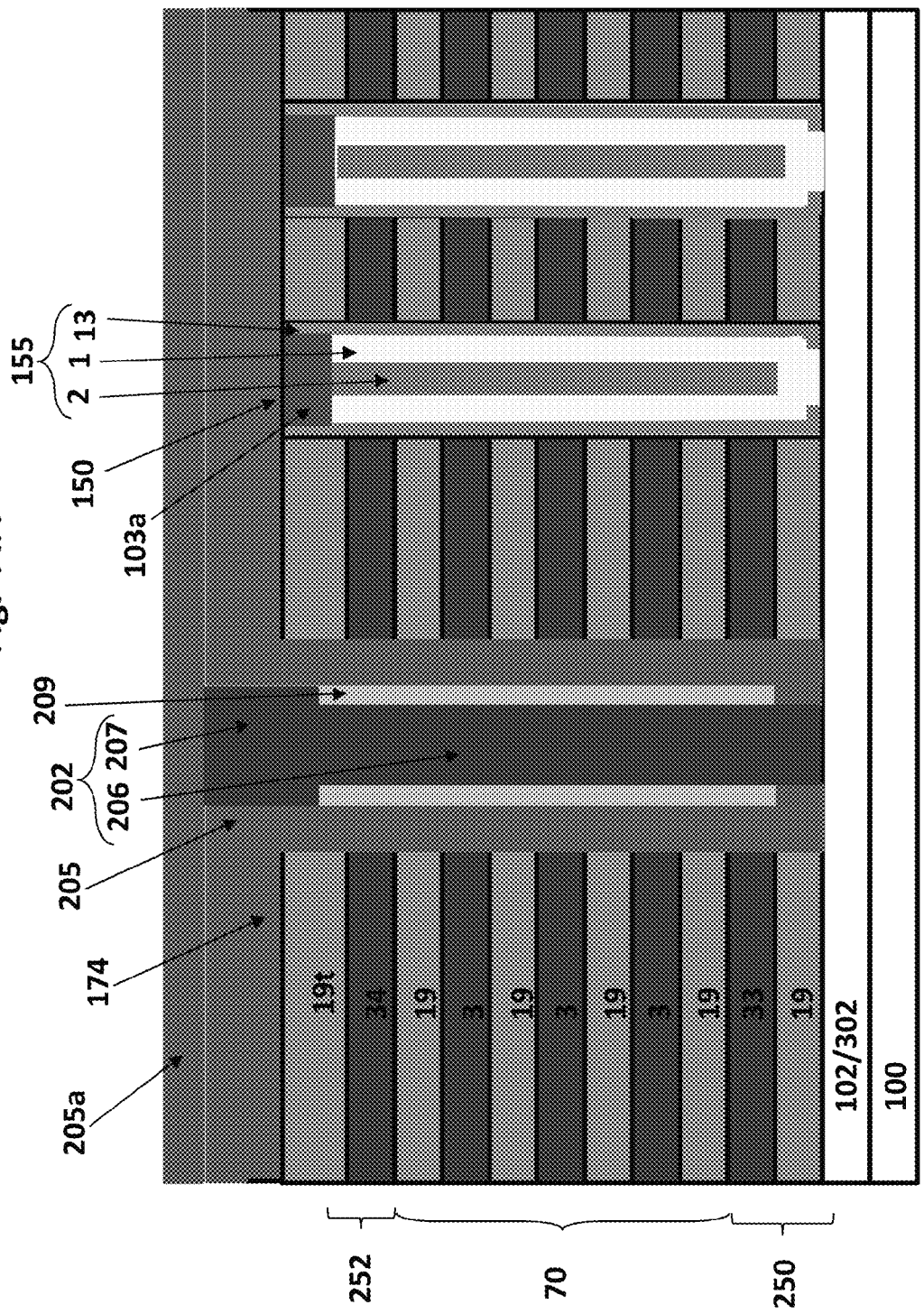

THREE DIMENSIONAL NAND DEVICE HAVING REDUCED WAFER BOWING AND METHOD OF MAKING THEREOF

FIELD

The present disclosure relates generally to the field of semiconductor devices and specifically to three dimensional vertical NAND strings and other three dimensional devices and methods of making thereof.

BACKGROUND

Three dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to one embodiment of the disclosure, a method of making a monolithic three dimensional NAND device comprises a plurality of control gate electrodes extending substantially parallel to a major surface of a substrate. The plurality of control gate electrodes comprises at least a first control gate electrode located in a first device level and a second control gate electrode located in a second device level located over the major surface of the substrate and below the first device level. The monolithic three dimensional NAND device further comprises an interlevel insulating layer located between the first control gate electrode and the second control gate electrode; a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level; at least one memory film located between each of the plurality of control gate electrodes and each respective semiconductor channel of the plurality of semiconductor channels; and at least one first trench extending substantially perpendicular to the major surface of the substrate. The at least one first trench filled with at least a first trench material and a second trench material, and the trench further comprises an electrically insulating material located on the walls of the trench to electrically insulate the plurality of control gate electrodes from the first trench material. The first trench material comprises a material under a first magnitude of a first stress type, and the second trench material comprises a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate.

According to another embodiment of the disclosure, a method of making a monolithic three dimensional NAND device comprises forming a stack of alternating first layers and second layers, wherein the stack of alternating first layers and second layers extend substantially parallel to a major surface of a substrate; etching the stack to form at least one trench extending substantially perpendicular to the major surface of the substrate; forming a first trench material in the at least one trench; and forming a second trench material which is different from the first trench material in the at least one trench. The first trench material comprises a plurality of electrically conductive pillars having a major axis substantially perpendicular to the major surface of the substrate. The first trench material comprises a material under a first magnitude of a first stress type, and the second trench material comprises a material under no stress, a second stress type opposite the first stress type, or a second magnitude of the first stress type lower than the first magnitude of the first stress type to offset warpage of the substrate due to the stress imposed by the first trench material on the substrate.

According to another embodiment of the disclosure, a monolithic three dimensional NAND memory device comprises a silicon substrate; an array of monolithic three dimensional NAND strings having a plurality of device levels disposed above the silicon substrate; and a driver circuit associated with the array located above or in the silicon substrate. Each monolithic three dimensional NAND string of the array of monolithic three dimensional NAND strings comprises: a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level; an interlevel insulating layer located between the first control gate electrode and the second control gate electrode; a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level; at least one memory film located between each of the plurality of control gate electrodes and each respective semiconductor channel of the plurality of semiconductor channels; and at least one first trench extending substantially perpendicular to the major surface of the substrate, the at least one first trench filled with at least a first trench material and a second trench material. The first trench material comprises a plurality of electrically conductive pillars having a major axis substantially perpendicular to the major surface of the substrate. The first trench material comprises a material under a first magnitude of a first stress type, and the second trench material comprises a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate.

BRIEF DESCRIPTION OF THE DRAWINGS

FIG. 1A is a top view of a memory block according to embodiments of the disclosure. FIG. 1B is a side cross sectional view of the device along line Z-Z' in FIG. 1A. FIG. 1C is a side cross sectional view of the device along line B-B' in FIG. 1A.

FIG. 2A is a top view of a memory block according to embodiments of the disclosure. FIG. 2B is a side cross sectional view of the device along line Z-Z' in FIG. 2A. FIG. 2C is a side cross sectional view of the device along line B-B' in FIG. 2A.

FIGS. 3A and 3B are respectively side cross sectional and top cross sectional views of a NAND string of one embodiment. FIG. 3A is a side cross sectional view of the device along line Y-Y' in FIG. 3B, while FIG. 3B is a side cross sectional view of the device along line X-X' in FIG. 3A.

FIGS. 3C and 3D are respectively side cross sectional and top cross sectional views of a NAND string of one embodiment. FIG. 3C is a side cross sectional view of the device along line Y-Y' in FIG. 3D, while FIG. 3D is a side cross sectional view of the device along line X-X' in FIG. 3C.

FIGS. 6 to 20, 25 to 35A, 36 to 39A, 40A, and 40B are side cross sectional views illustrating steps in an embodiment method of making the device illustrated in FIGS. 1A,1B, and 1C along line C-C' in FIG. 1A. FIG. 35A is a side cross sectional view of the device along line E-E' in FIG. 35C. FIG. 35B is a side cross sectional view of the device along line F-F' in FIG. 35C. FIG. 39A is a side cross sectional view of the device along line E-E' in FIG. 39C.

FIGS. 41A, 42, 43A, 44A, and 44B are side cross sectional views illustrating steps in an embodiment method of making the device illustrated in FIGS. 2A, 2B, and 2C along line C-C' in FIG. 2A. FIG. 41C is a top view of the step shown in FIGS. 41A and 41B. FIG. 41A is a side cross sectional view of the device along line E-E' in FIG. 41C. FIG. 43A is a side cross sectional view of the device along line E-E' in FIG. 43C. FIG. 43B is a side cross sectional view of the device along line F-F' in FIG. 43C.

DETAILED DESCRIPTION

Figure 4:
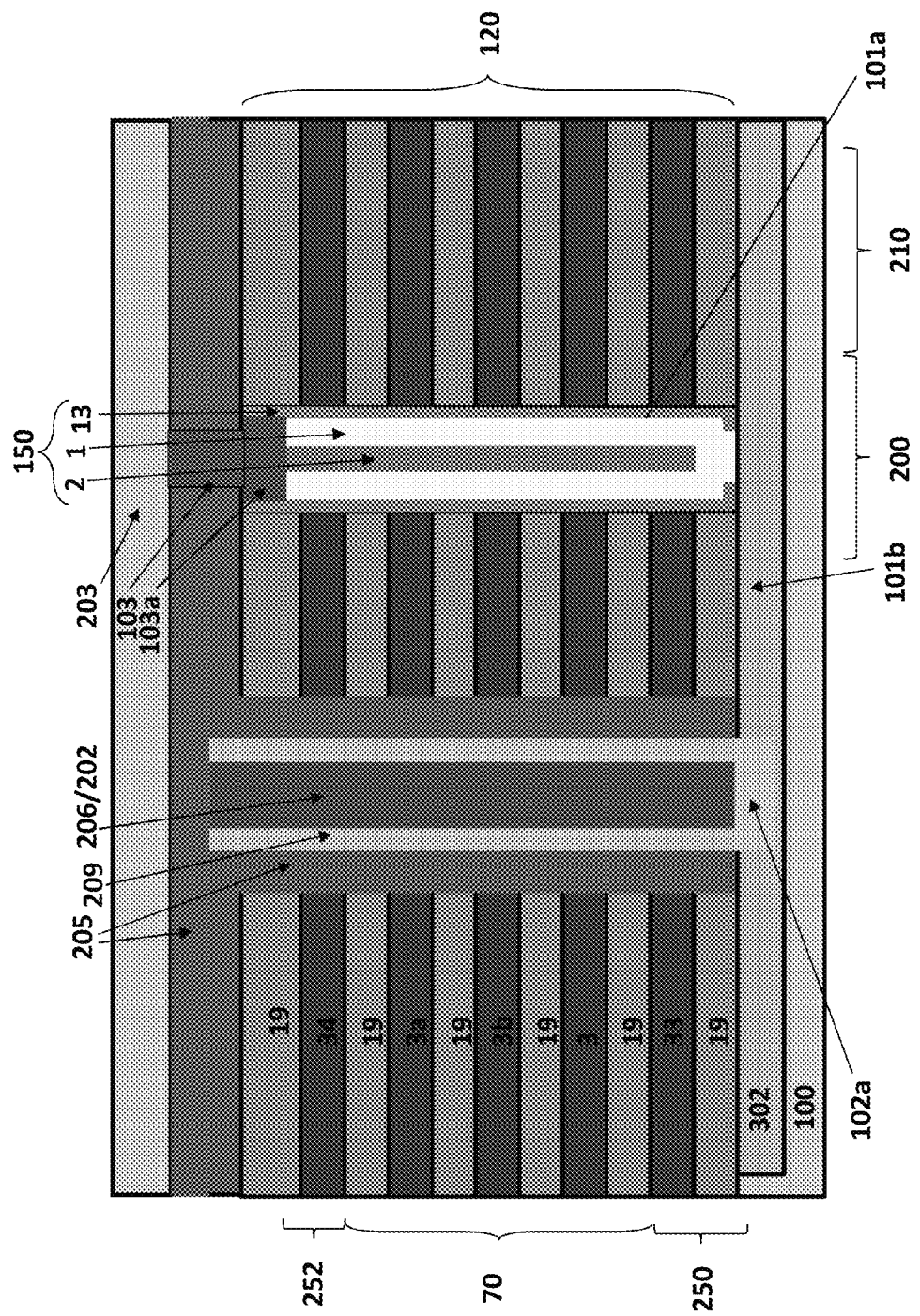
FIG. 4 is a side cross sectional view of a NAND string according to another alternative embodiment of the disclosure.

Embodiments of the present disclosure will be described below with reference to the accompanying drawings. It should be understood that the following description is intended to describe various embodiments of the disclosure, and not to limit the disclosure.

The embodiments of the disclosure provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

FIGS. 1A and 2A are schematic "see through" top views of a memory block of embodiments of the disclosure showing underlying layers through overlying layers. FIG. 1B is a side cross sectional view of the device along line Z-Z' in FIG. 1A, while FIG. 2B is a side cross sectional view of the device along line Z-Z' in FIG. 2A. FIG. 1C is a side cross sectional view of the device along line B-B' in FIG. 1A and FIG. 2C is a side cross sectional view of the device along line B-B' in FIG. 2A.

In some embodiments, the monolithic three dimensional NAND memory device comprises an array of monolithic three dimensional NAND strings 150 filled with a memory film 13, a semiconductor channel 1, and optionally an insulating fill material 2, as shown in FIGS. 1A, 2A, 1C, and 2C.

As shown in FIGS. 1C and 2C, the monolithic three dimensional NAND memory device further comprises a plurality of control gate electrodes 3 separated by a plurality of insulating layers 19, each of which extend substantially parallel to a major surface 100a of a substrate 100 to form a stack 120 of alternating layers.

The monolithic three dimensional NAND memory device further comprises at least one trench 84 extending substantially perpendicular to a major surface 100a of a substrate 100, as shown in FIGS. 1A, 1B, 2A, and 2B. At least one source electrode 202 located in the trench 84. In some embodiments, the source electrode 202 (e.g., 202a, 202b, etc.) comprises electrically conductive pillars 206 comprising at least one first trench material, as shown in FIGS. 1A and 1B.

In certain embodiments, the source electrode 202 comprises electrically conductive pillars 206 contacting an overlying, electrically conductive layer 207 that is substantially parallel to the major surface 100a of the substrate 100, as shown in FIGS. 2A and 2B. The electrically conductive pillars 206 and the electrically conductive layer 207 may each comprise the first trench material.

Figure 28:
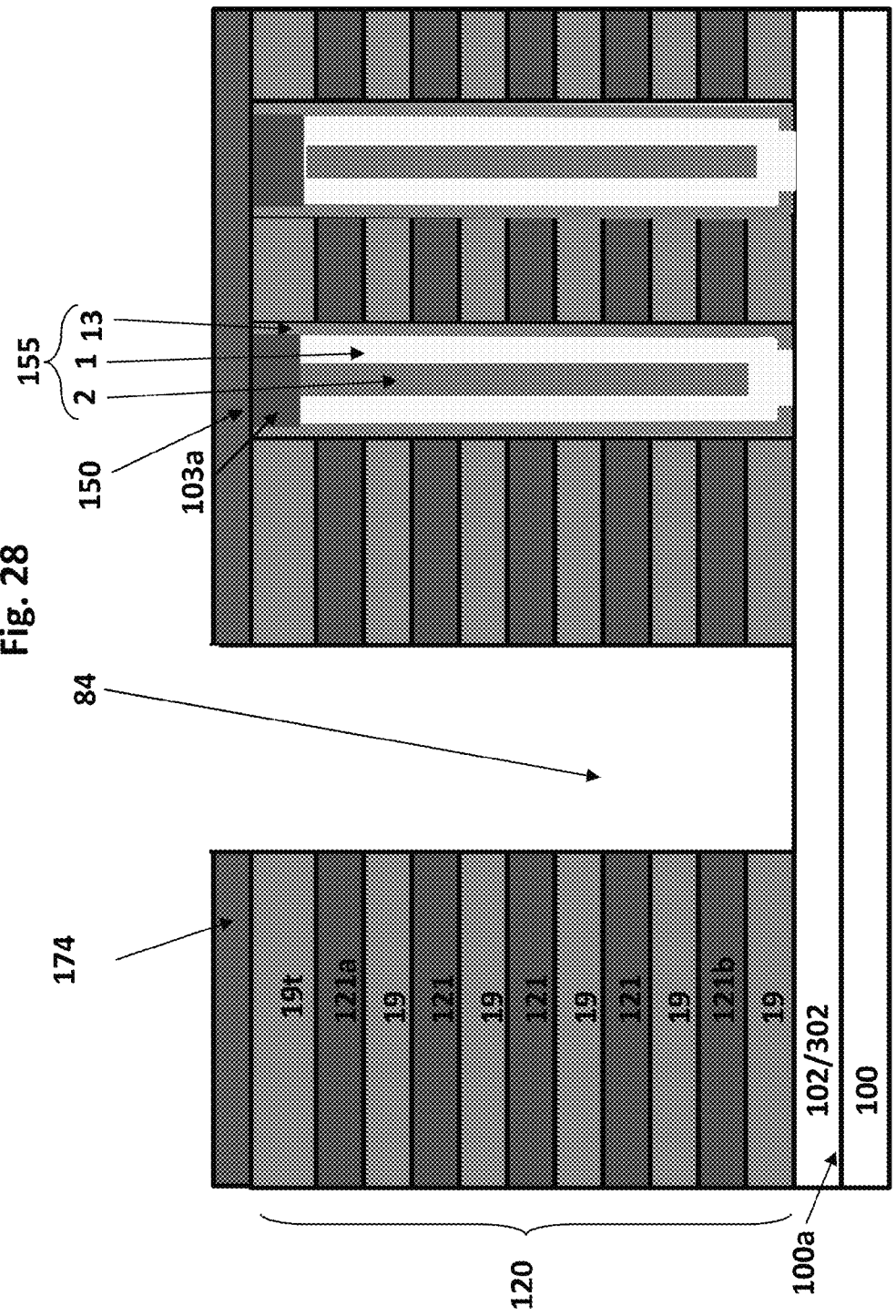
Figure 29:
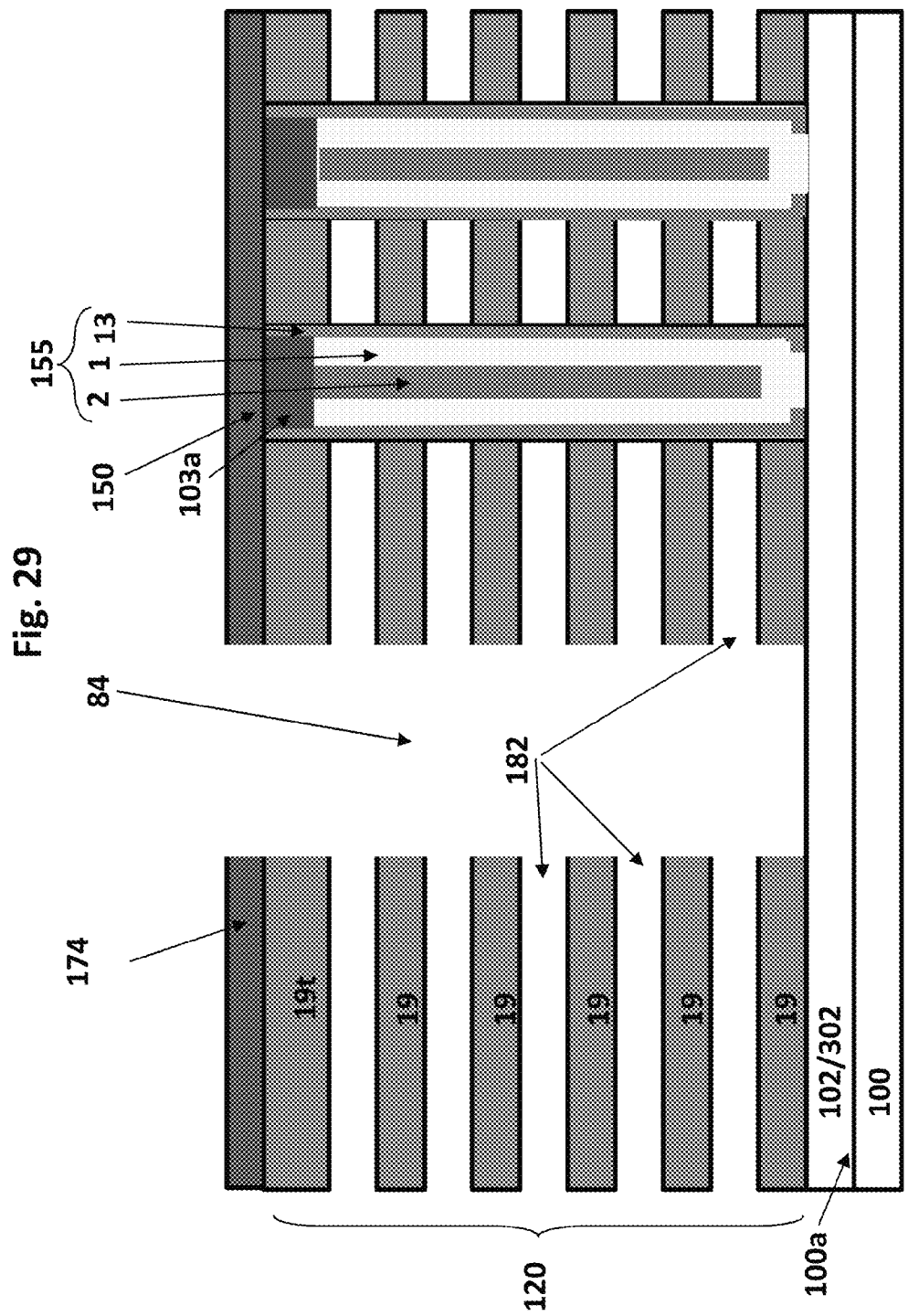
Figure 30:
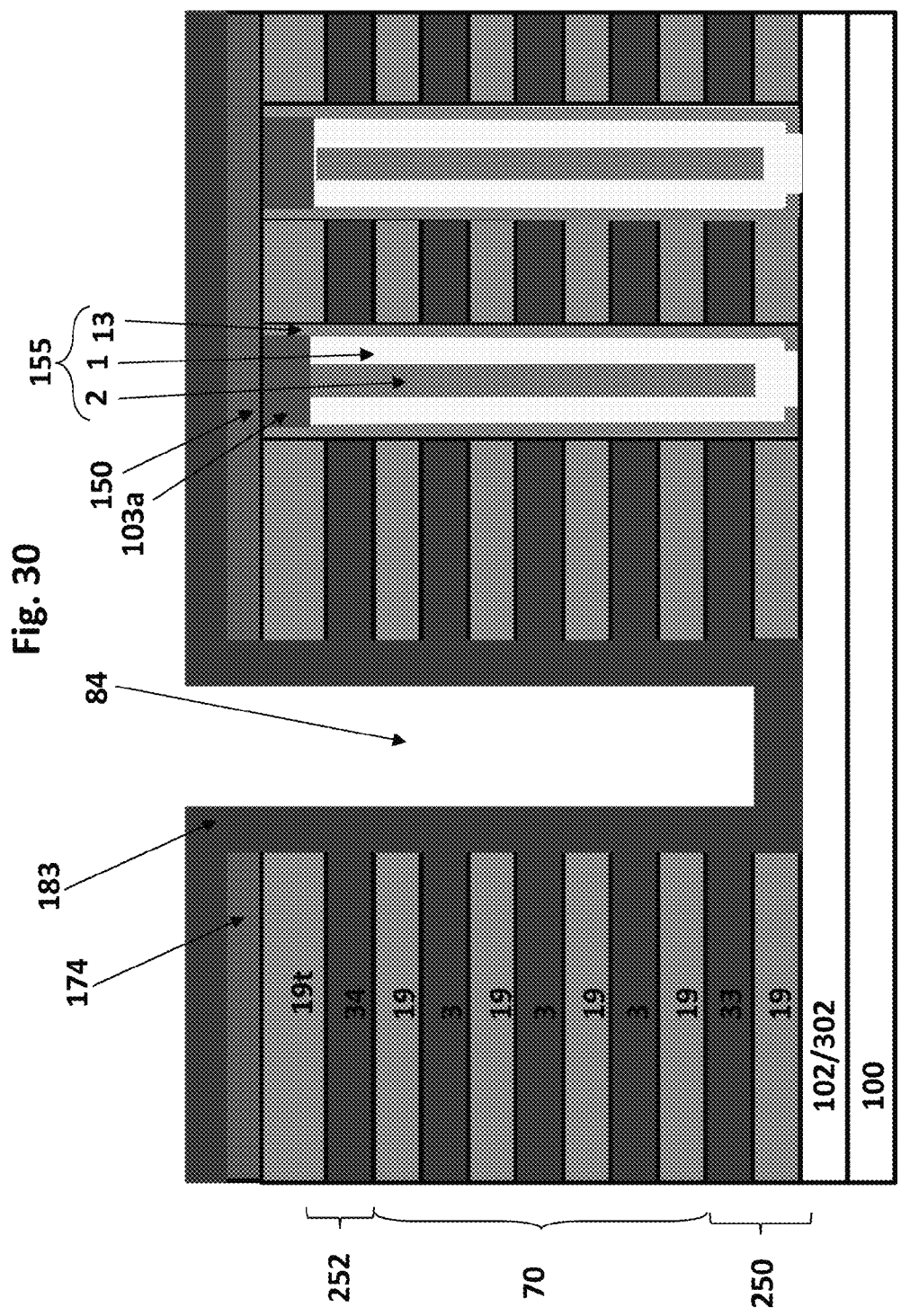
Figure 31:
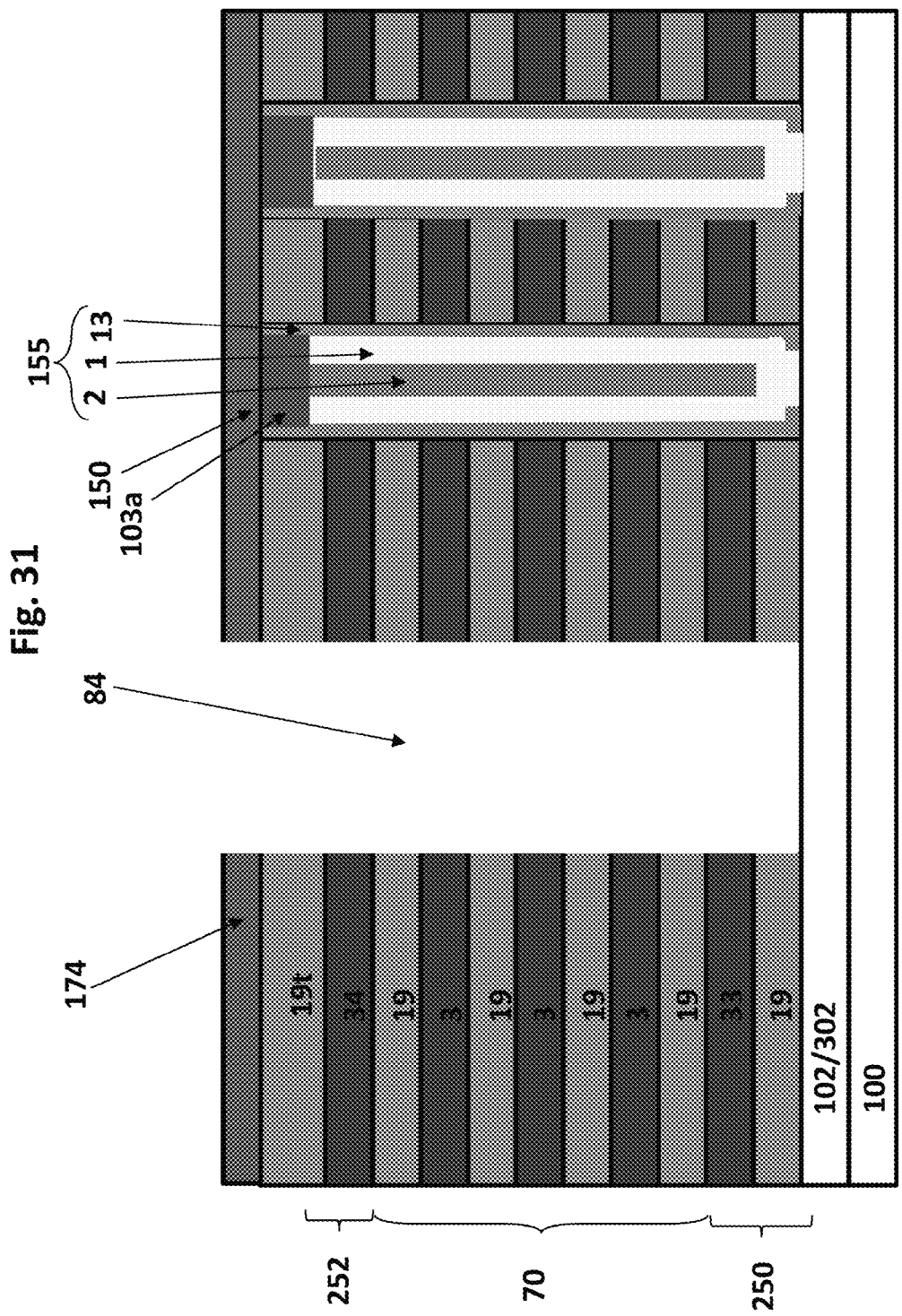

In some embodiments, as described in more detail below with respect to FIGS. 6 to 47, the plurality of control gate electrodes 3 is formed by first forming a plurality of sacrificial layers 121 as shown in FIGS. 7 to 28, then removing the plurality of sacrificial layers 121 and filling the resulting openings (e.g., recesses) 182 with a conductive material to form a plurality of control gate electrodes 3, as shown in FIGS. 29 to 31. This fill step may result in warpage of the substrate 100 due to a compressive or tensile stress imposed by the plurality of control gate electrodes 3 on the substrate, such as a tensile stress imposed by tungsten control gate electrodes.

In some embodiments, the source electrode 202 is formed by etching a trench 84 in the stack 120 of alternating layers as shown in FIGS. 26 to 31, and filling the trench 84 with the first trench material, the second material 209, and the insulator material 205, as shown in FIGS. 32 to 40B and 41A to 44B. This fill step may result in warpage of the substrate 100 due to a compressive or tensile stress imposed by the first trench material, e.g. pillars 206 and/or layers 207 on the substrate 100. In some embodiments, greater amounts of the first trench material such as tungsten lead to greater tensile stress in the device.

To counteract the compressive or tensile stress imposed by the plurality of control gate electrodes and/or the electrically conductive pillars on the substrate, the trench 84 is at least partially filled with at least one second trench material 209. When the first trench material comprises a material under a first magnitude of a first stress type, the second trench material comprises a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate. In some embodiments, the first stress type is tensile stress and the second stress type is compressive stress. In other embodiments, the first stress type is compressive stress and the second stress type is tensile stress. In some embodiments, the first trench material is under a first magnitude of tensile stress, and the second trench material is under compressive stress. In some embodiments, the second trench material is under compressive stress, and the plurality of control gate electrodes 3 are under tensile stress. Alternatively, pillars 206, layers 207, and/or control gate electrodes 3 are under compressive stress, and the second trench material is under tensile stress.

Each pillar 206 may have a substantially circular cross sectional shape in a plane substantially parallel to the major surface 100a of the substrate 100, as shown in FIGS. 1A and 2A. Each pillar 206 may have other cross sectional shapes, such as ovoid, polygonal or irregular cross sectional shapes. The cross sectional shape of each pillar 206 may be uniform or non-uniform within the pillar 206 or between pillars 206. In some embodiments, as shown in FIGS. 1B, 1C, 2B, and 2C, the pillars 206 have a generally cylindrical shape. In other embodiments, each pillar 206 may have cross sectional shape that varies with distance from the substrate, for example a tapered shape such as a cone shape or a truncated cone shape.

FIGS. 1A and 2A illustrate memory devices including a plurality of memory blocks 400, with each memory block 400 containing an array of a plurality of vertical NAND strings 150 according to embodiments of the disclosure. Each string includes memory device levels 70, respectively, as shown in FIGS. 1C and 2C.

Each NAND string 150 contains at least one memory film 13 which is located adjacent to the semiconductor channel 1 in the memory device levels 70, as shown in FIGS. 1C and 2C. Specifically, the memory film 13 is located between the semiconductor channel 1 and the plurality of control gate electrodes 3. The memory film 13 contains a tunnel dielectric 11, a charge storage region(s) 9 (e.g., a dielectric charge trapping layer or floating gates), and a blocking dielectric 7, as shown in FIGS. 3A and 3C.

As shown in FIGS. 1C and 2C, the memory device levels 70 include the semiconductor channel 1 having at least one end portion extending substantially perpendicular to a major surface 100a of a substrate 100. For example, the semiconductor channel 1 may have a pillar shape in the memory device levels 70 and the entire pillar-shaped semiconductor channel in the memory device levels 70 extends substantially perpendicularly to the major surface of the substrate 100, as shown in FIGS. 1C, 3A, and 3C. In some embodiments, the opposite end portions of the semiconductor channel 1 include respective semiconductor source and drain regions 102a, 103a doped with opposite conductivity type dopants (e.g., n-type) than that of the channel (e.g., p-type), as shown in FIG. 1C. The source and drain regions 102a, 103a electrically contact a respective source contact 102 and drain contact 103. In one embodiment, the source/drain contacts of the device can include a first contact 102 formed under and a second contact 103 formed over the semiconductor channel 1, as shown in FIGS. 3A and 3C. In some embodiments, the first contact 102 is a source contact, and the second contact 103 is a drain contact. For example, a bottom portion 1b of the channel 1 contacts the source contact 102, (if the source contact 102 is a semiconductor of opposite conductivity type to that of the channel 1 and acts as a source region of the device) as shown in FIGS. 3A and 3C, and a drain region 103a in the upper portion of the channel 1 is electrically connected to the drain contact 103, as shown in FIGS. 1C, 3A, and 3C.

In an alternative embodiment shown in FIGS. 2C and 4, the semiconductor channel 1 may have a J-shaped pipe shape. A first wing portion 101a of the J-shaped pipe shape semiconductor channel 1 may extend substantially perpendicular to the major surface of the substrate 100, and a second horizontal portion 101b of the J-shaped pipe shape semiconductor channel extends substantially parallel to the major surface of the substrate 100. The device shown in FIGS. 2C and 4 is similar to a side cross sectional view along line B-B' in FIG. 1A of device shown in FIGS. 1A-1C, except that the contact 102 below the channel 1 of FIG. 1C is omitted in FIG. 4. One of the source or drain electrodes (e.g., drain electrode 203) contacts the drain region 103a via the drain contact 103 over the wing portion 101a of the semiconductor channel 1 from above, and another one of a source or drain electrodes (e.g., source electrode) 202 contacts the source region 102a next to the second portion 101b of the semiconductor channel from above. In these embodiments, a horizontal source contact 102 of FIGS. 3A and 3C is not necessary. In some embodiments, the source electrode 202 is located in a dielectric 205 insulated trench 84, which extends substantially parallel to the control gate electrodes 3, similar to that shown in FIGS. 1A and 2A. In some embodiments, the drain electrode is a bit line 203 located above the semiconductor channel 1, and the bit line extends substantially perpendicular to the plurality of control gate electrodes 3 and to the source electrode 202, as shown in FIGS. 1A, 1C, 2A, and 2C.

In some embodiments, the semiconductor channel 1 may be a filled feature, as shown in FIGS. 3C and 3D. In some other embodiments, the semiconductor channel 1 may be hollow, for example a hollow substantially cylindrical shape (e.g., tapered cylinder with increasing diameter, such as a hollow truncated cone, or a cylinder with a substantially uniform diameter as a function of height throughout most of the channel, with the bottom portion 1b, as shown in FIGS. 3A and 3C) filled with the insulating fill material 2, as shown in FIGS. 3A and 3B. In these embodiments, an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The channels 1 are electrically connected to source contact 102 having at least one end portion extending substantially parallel to the major surface 100a of the substrate 100, as shown in FIGS. 3A and 3C. For example, the source contact 102 may have a planar shape and the entire planar-shaped source contact extends substantially parallel to the major surface of the substrate 100, as shown in FIGS. 3A and 3C. In other embodiments, the source contact 102 has a rail shape.

Alternatively, the source contact 102 may be omitted, for example if a source electrode 202 contacts a source region 102a in or over the substrate 100, and a portion 101b of the semiconductor channel 1 extends parallel to the major surface of the substrate 100a in or over the substrate 100, such as in a semiconductor channel having a J-shaped pipe shape described above and illustrated in FIGS. 2C and 4.

In various embodiments, the semiconductor channel 1 comprises amorphous silicon or polysilicon having a first conductivity type (e.g., p-type), the source contact 102 comprises single crystal silicon or polysilicon having a second conductivity type (e.g., n-type) and a higher doping concentration than the semiconductor channel 1, and the substrate 100 comprises a single crystal silicon substrate having a lower doping concentration than the source contact 102. For example, the upper portion of the substrate 100 may include a well of the first conductivity type (e.g., p-well 302) below the source contact 102, or in the absence of source contact 102, below and laterally surrounding the source 102b as shown in FIGS. 1C and 2C.

In some embodiments, at least the top major surface 100a of the substrate 100 comprises single crystal silicon. The entire substrate 100 may comprise a single crystal silicon substrate, such as a silicon wafer. Alternatively, the substrate may comprise a single crystal silicon layer which forms the top major surface 100a located over a silicon wafer or another supporting material.

The monolithic three dimensional NAND strings 150 in memory device levels 70 further comprise the plurality of control gate electrodes 3, as shown in FIGS. 1C, 2C, 3A, 3C, and 4, which extend substantially parallel to the major surface 100a of the substrate 100. The portions of the control gate electrodes 3 which include NAND strings 150 may be referred to as "word lines" herein. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A, as shown in FIGS. 1C and 2C. The control gate material may comprise any one or more suitable conductive or semiconductor control gate material known in the art, such as doped polysilicon, tungsten, copper, aluminum, tantalum, titanium, cobalt, titanium nitride, alloys thereof or combination of these materials.

A blocking dielectric 7 is located adjacent to the control gate electrode(s) 3. In some embodiments, the blocking dielectric is located adjacent to the control gate electrode 3 and parallel to the channel 1, as shown in FIGS. 3A and 3C. In other embodiments, the blocking dielectric 7 may surround the control gate electrode 3. The blocking dielectric 7 may comprise one or more layers having plurality of blocking dielectric segments located in contact with a respective one of the plurality of control gate electrodes 3. Alternatively, the blocking dielectric may comprise one or more continuous layers which extend the entire length of the memory cell portion of the NAND string.

The monolithic three dimensional NAND string 150 also comprise at least one charge storage region 9. The charge storage region 9 may comprise one or more continuous layers which extend the entire length of the memory cell portion of the NAND string. Alternatively, the charge storage region may comprise a plurality of discrete charge storage regions or segments 9 located between the blocking dielectric 7 and the channel 1.

The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the charge storage region 9 may comprise an insulating charge trapping material, such as a silicon nitride layer or silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1. The tunnel dielectric layer 11 may comprise a silicon oxide. For example, the tunnel dielectric layer 11 may be a silicon dioxide layer, or a silicon dioxide/silicon nitride/silicon dioxide multi-layer.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 may include multiple different layers, such as silicon oxide and metal oxide (e.g., $Al_2O_3$) layers. The tunnel dielectric 11 may include multiple layers of silicon oxide, silicon nitride and/or silicon oxynitride (e.g., ONO layers).

In one embodiment, the tunnel dielectric 11 comprises a silicon oxide layer which extends perpendicular to the major surface 100a of the substrate 100, and the charge trapping layer 9 comprises a silicon nitride layer which extends perpendicular to the major surface 100a of the substrate 100 and which contacts the tunnel dielectric 11. The blocking dielectric 7 comprises a first silicon oxide layer or a combination of silicon oxide and metal oxide layers which is patterned into regions which extend perpendicular to the major surface 100a of the substrate 100 and which contacts the charge trapping layer 9.

A plurality of drain electrodes (e.g., bit lines) 203 are located over the array of NAND strings 150 in each block 400, as shown in FIGS. 1A and 2A. The drain electrodes 203 extend in the bit line direction B-B' from the first dielectric filled trench 84a to the second dielectric filled trench 84b in each block 400, as shown in FIGS. 1A and 2A. Furthermore, as shown in FIGS. 1A and 2A, each trench 84 extends in the word line direction and separates two adjacent blocks 400. The drain electrodes 203 extend over and perpendicular to the trenches over plural memory blocks 400, as shown in FIGS. 1B, 1C, 2B, and 2C. Each drain electrode 203 is electrically connected to an upper portion of a semiconductor channel 1 (e.g., to a doped drain region 103a over the channel 1) in one NAND string 150 via a drain contact 103.

The density of the drain electrodes 203 depends on the number of rows of NAND strings 150 and on the spacing between adjacent NAND strings in each row, as shown in FIGS. 1A and 2A. For example, as shown in FIGS. 1A and 2A, each NAND string 150 has one drain electrode 203 passing over it. A respective drain contact 103 connects the channel 1 in each NAND string 150 to the respective drain electrode 203 passing over the NAND string 150, as shown in FIGS. 1C and 2C. In this case, the drain contact 103 may be located over the middle of the NAND string 150.

In other embodiments, each memory opening 81 may have more than one drain electrode, for example two drain electrodes, passing over it. A respective drain contact connects the channel in each NAND string to only one of the drain electrodes passing over the NAND string. In this case, the drain contact may be located off center of the NAND string (e.g., closer to the periphery than to the middle), and the drain contact contacts the channel at the periphery of the NAND string. In some embodiments, the drain contact 103 is a two-part drain contact having a wide section beneath a narrow section. The wide section may provide a good electrical contact between the two-part drain contact and the doped drain region 103a. The narrow section, in certain embodiments having multiple drain electrodes passing over each memory opening 81, allows the two-part drain contact 103 to maintain electrical contact with a single drain electrode of the multiple drain electrodes.

FIGS. 1A and 2A each illustrate a top view of a memory block 400. The memory block includes an array of NAND strings including at least one row of monolithic three dimensional NAND strings 150 described above, a first trench 84a located on a first side of the array, and a second trench 84b located on a second side of the array opposite to the first side of the array.

A first source electrode 202a is located in the first trench 84a and a second source electrode 202b is located in the second trench 84b in each block 400, as shown in FIGS. 1A and 2A. In the embodiment shown in FIG. 1A, the first source electrode 202a comprises a first material comprising a plurality of electrically conductive pillars 206a having a major axis substantially perpendicular to the major surface 100a of the substrate 100. In the embodiment shown in FIG. 2A, the first source electrode 202a comprises a first material comprising a plurality of electrically conductive pillars 206a contacting an overlying electrically conductive layer 207 that extends substantially parallel to the major surface 100a of the substrate 100. In some embodiments, the electrically conductive layer 207 is a rail shaped source contact.

The electrically conductive material of the source electrode 202 may comprise any electrically conductive material, for example tungsten or a tungsten alloy, or a tungsten electrode and a titanium nitride or tungsten nitride liner.

The second trench material 209 is located in the trench 84 and may comprise an electrically insulating, electrically conductive, or semiconductor material. In some embodiments, the second trench material 209 comprises a material selected from diamond-like carbon, N+ doped polycrystalline silicon, amorphous carbon, silicon carbide, silicon nitride, silicon oxynitride, or silicon carbonitride. Alternatively, the second trench material may be an air gap.

In some embodiments, the source electrode 202 comprises a first trench material comprising a plurality of electrically conductive pillars 206 having a major axis substantially perpendicular to the major surface of the substrate, and the second trench material 209 is located in the trench 84 between each of the plurality of electrically conductive pillars 206, as shown in FIGS. 1B and 2B.

In other embodiments, the source electrode 202 comprises a first trench material comprising a plurality of electrically conductive pillars 206 having a major axis substantially perpendicular to the major surface 100a of the substrate 100, and an electrically conductive layer 207 extending substantially parallel to the major surface 100a of the substrate 100, and the second trench material 209 is located in the trench 84 between each of the plurality of electrically conductive pillars 206 and under the electrically conductive layer 207, as shown in FIG. 2B.

In the memory device levels 70, the trench 84 may comprise any suitable insulating layer 205, such as silicon oxide, etc., which is located on both walls of the trench 84. Each source electrode 202 comprising a plurality of electrically conductive pillars 206 and optionally an electrically conductive layer 207 is separated from the control gate electrodes 3 by the insulating layer 205, as shown in FIGS. 1C, 2C, and 4. In some embodiments, the electrically conductive pillar 206 of the source electrode 202 contacts a source region in the substrate 100, for example the source contact 102, or the source 102a in the p-well 302, as shown in FIGS. 1C, 2C, and 4, respectively.

Figure 5:
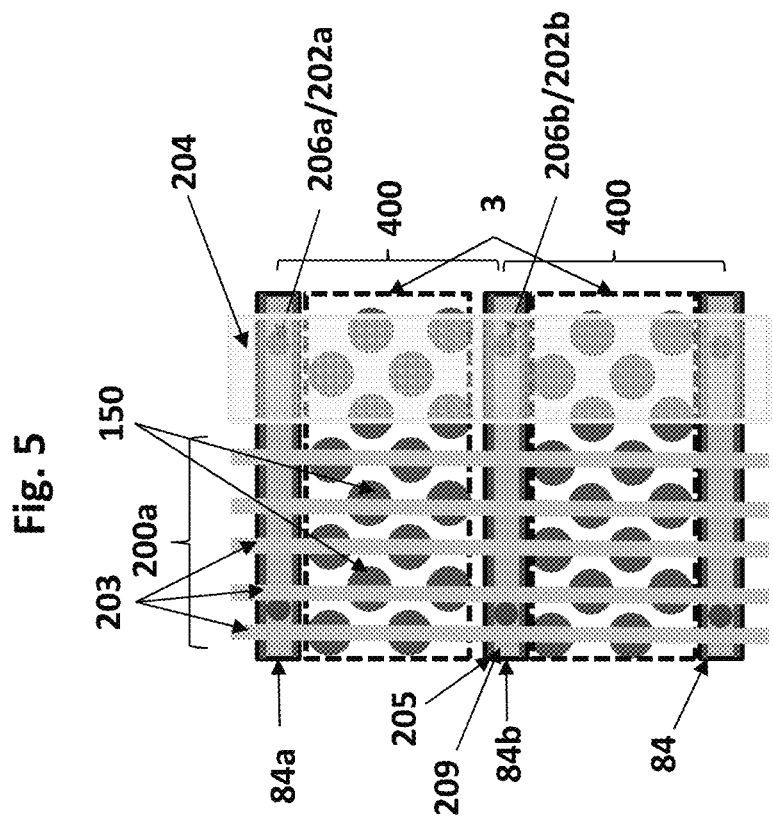
FIG. 5 is a top view of a memory block according to embodiments of the disclosure.

In some embodiments, an electrode shunt 204 extends substantially parallel to the major surface 100a of the substrate 100 and the bit lines 203 and electrically connects multiple source electrodes 202 (e.g., 202a, 202b, etc.). The electrode shunt 204 may electrically contact the electrically conductive pillars 206 (e.g., 206a, 206b, etc.), as shown in FIG. 5. In other embodiments, the electrode shunt 204 may electrically contact a rail shaped source contact, for example the electrically conductive layer 207. The electrode shunt comprises any suitable conductive materials known in the art.

The array NAND strings may include any number of rows of NAND strings 150. For example, the arrays shown in FIGS. 1A and 2A each comprise at least a 4×1, such as at least a 4×3, or 4×4, array of NAND strings. In other words, the array shown in these figures has four rows of NAND strings, and there is at least one NAND string in each row. The rows of NAND strings extend in the word line direction (e.g., along line Z-Z' in FIGS. 1A and 2A). Thus, the array in the block 400 comprises first, second, third, and fourth rows of NAND strings 150 extending in the word line direction. As shown in FIGS. 1A and 2A, the semiconductor channels in the first and the third rows of NAND strings are offset from respective semiconductor channels in the second and fourth rows of NAND strings along the word line direction. In general, the semiconductor channels in the odd numbered rows of NAND strings are offset from respective semiconductor channels in the even numbered rows of NAND strings along the word line direction. Alternatively, semiconductor channels in adjacent rows may be aligned.

In alternative embodiments, each memory block 400 may have an array with fewer than 4 rows of NAND strings. Alternatively, the array in each block may have more than 4 rows, such as 5 to 20 rows of NAND strings. FIGS. 1A and 2A show a plurality of 4×4 arrays of NAND strings, where each array has four rows of NAND strings, and each row contains 4 NAND strings.

As shown in FIGS. 2A and 2C, the first semiconductor channel 1 in each of the first and the second rows of NAND strings 150 comprises a bottom side 1b which contacts the p-well 302. The p-well 302 in turn contacts the first source electrode 202a (e.g., the left side source electrode in FIG. 2C which corresponds to the source electrode positioned in the "upper" trench 84a in FIG. 2A) and the second source electrode 202b (e.g., the right side source electrode in FIG. 2C which corresponds to the source electrode positioned in the "lower" trench 84b in FIG. 2A).

As shown in FIG. 2A, the control gate electrodes 3 extend in the word line direction Z-Z' which is perpendicular to the bit line direction B-B'. The control gate electrodes 3 are continuous in the array in the memory block 400. In other words, the control gate electrodes 3 have a shape of a continuous strip or sheet with discrete openings 81 (which are referred to herein as front side openings or memory openings) which contain the NAND strings 150. However, the control gate electrodes 3 have electrical and physical continuity in the bit line direction between the trenches 84 and in the word line direction throughout the block 400. In other words, the memory openings 81 do not completely sever the continuous electrical and physical path in the control gate electrodes from one trench 84 to the opposite trench 84 in each block.

The memory block 400 contains a common control gate electrode 3 in each of the plurality of memory device levels 70 for the first, second, third and fourth rows of NAND strings shown in FIGS. 1A and 2A. The common control gate electrode 3 may also be referred to as a word line or a word line finger (shown as dashed lines in FIGS. 1A and 2A). In various embodiments, the memory block 400 optionally includes a select gate electrode 33 (e.g., source side select gate electrode 33 shown in FIGS. 1C and 2C) located between the p-well 302 and the control gate electrodes 3, and the select gate electrode is continuous in the array. The memory block 400 may optionally include a drain side select gate electrode 34 located over the control gate electrodes 3, shown in FIGS. 1C and 2C, and the drain side select gate electrode is continuous in the array. In various embodiments, the source electrode 202 contacts a common source contact 102, or, if the source contact 102 is omitted, the source region 102a in the substrate 100 or the p-well 302, as shown in FIGS. 1C and 2C, for the first second, third and fourth rows of NAND strings in the block 400. Therefore, all of the NAND strings in the array in each block 400 can be erased together in the same erase step. For example, one specific memory cell can be selected by selecting (i.e., applying a current or voltage) to one source electrode 202, one bit line (i.e., drain electrode) 203 and one word line (e.g., control gate electrode) 3. Specifically, a particular block 400 is selected with the common source electrode 202 in that block, the specific memory opening 81/NAND string 150 is selected with the bit line (drain electrode) 203, and the particular cell in one memory device level 70 in the NAND string 150 is selected with the word line 3. In various embodiments, the memory block 400 may include a source side select transistor 250 (containing the source side select gate electrode 33 and adjacent portions of the channel and memory film as shown in FIGS. 1C and 2C) located between the substrate and the plurality of control gate electrodes 3. In various embodiments, the memory block 400 may include a drain side select transistor (containing the drain side select gate electrode 34 and adjacent portions of the channel and memory film) located over the NAND memory cell region (i.e., over the memory device levels 70 in region 200 and below the doped drain region 103a).

As described above, in various embodiments, the semiconductor channel 1 may be a solid rod shape or a hollow substantially cylindrical shape in the memory device levels 70. The tunnel dielectric 11 comprises a cylinder or inverse truncated cone which surrounds the semiconductor channel 1. The charge storage region 9 comprises a cylinder or inverse truncated cone which surrounds the tunnel dielectric 11. The blocking dielectric 7 comprises a cylinder or inverse truncated cone which surrounds the charge storage region 9. The plurality of control gate electrodes 3 comprise metal or metal alloy control gate electrodes which surround the blocking dielectric 7 in each NAND string 150.

FIGS. 6 to 47 illustrate methods of making a NAND device having a trench filled with a first material, a second material, and having an insulating layer according to non-limiting embodiments of the disclosure. Specifically, the methods result in lower wafer warpage due to the mechanical stress imposed by the plurality of control gate electrodes and/or the first trench material on the substrate.

Specifically, in the prior art method, the control gate electrodes are formed by first forming a stack of sacrificial layers separated by insulating layers. The sacrificial layers are removed and the resulting space is filled with a conductive material, for example tungsten. However, this fill method results in mechanical stress imposed on the substrate. Although high temperature annealing can alleviate some of the stress, high temperatures are not acceptable for some devices, for example devices including CMOS technology.

Figure 6:
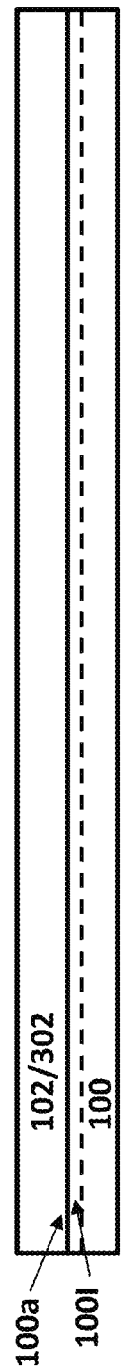

In contrast, as will be explained in more detail with reference to FIGS. 6-47, in the embodiment methods of the present disclosure, a stack 120 of alternating layers of a first material and a second material is deposited over a major surface 100a of a substrate 100, and at least one trench 84 is subsequently etched in the stack 120. The trench 84 extends substantially perpendicular to the major surface of the substrate. The trench 84 is filled with a first trench material and a second trench material, wherein the first trench material comprises a material under a first magnitude of a first stress type, and the second trench material comprises a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate FIGS. 6-40B illustrate a method of making one embodiment of the NAND device of FIG. 4. FIG. 6 illustrates a first step in the embodiment method of making the NAND device. FIG. 6 shows an optional conductive source contact 102 formed substantially parallel to a major surface 100a of a substrate 100. In various embodiments, the substrate is single crystal silicon, optionally doped with a first conductivity type (e.g., n or p-type, such as containing the p-well 302 shown in FIGS. 1C and 2C) at a concentration of less than $10^{18}$ cm$^3$, for example from $10^{15}$-$10^{17}$ cm$^3$. In various embodiments, the conductive source contact 102 comprises a doped upper portion of the substrate 100 or a deposited semiconductor layer having a higher doping concentration than the substrate. In some embodiments, the conductive source contact 102 is polysilicon or single crystal silicon doped with a second conductivity type (e.g., p or n-type opposite to that of the substrate) at a concentration of at least $10^{18}$ cm$^3$.

In some embodiments, an optional insulating layer (e.g., silicon oxide, etc.) 100I is formed directly on or over the substrate 100 (e.g., a silicon substrate), and the optional conductive source contact 102 is formed directly on or over the insulating layer. In these embodiments, the NAND strings are formed on the resulting silicon on insulator (SOI) substrate.

Alternatively, the source contact 102 can be omitted, as shown in FIGS. 2C and 4. In these embodiments, the p-well 302 is formed in the substrate 100, as shown in FIGS. 7-47.

Figure 7:
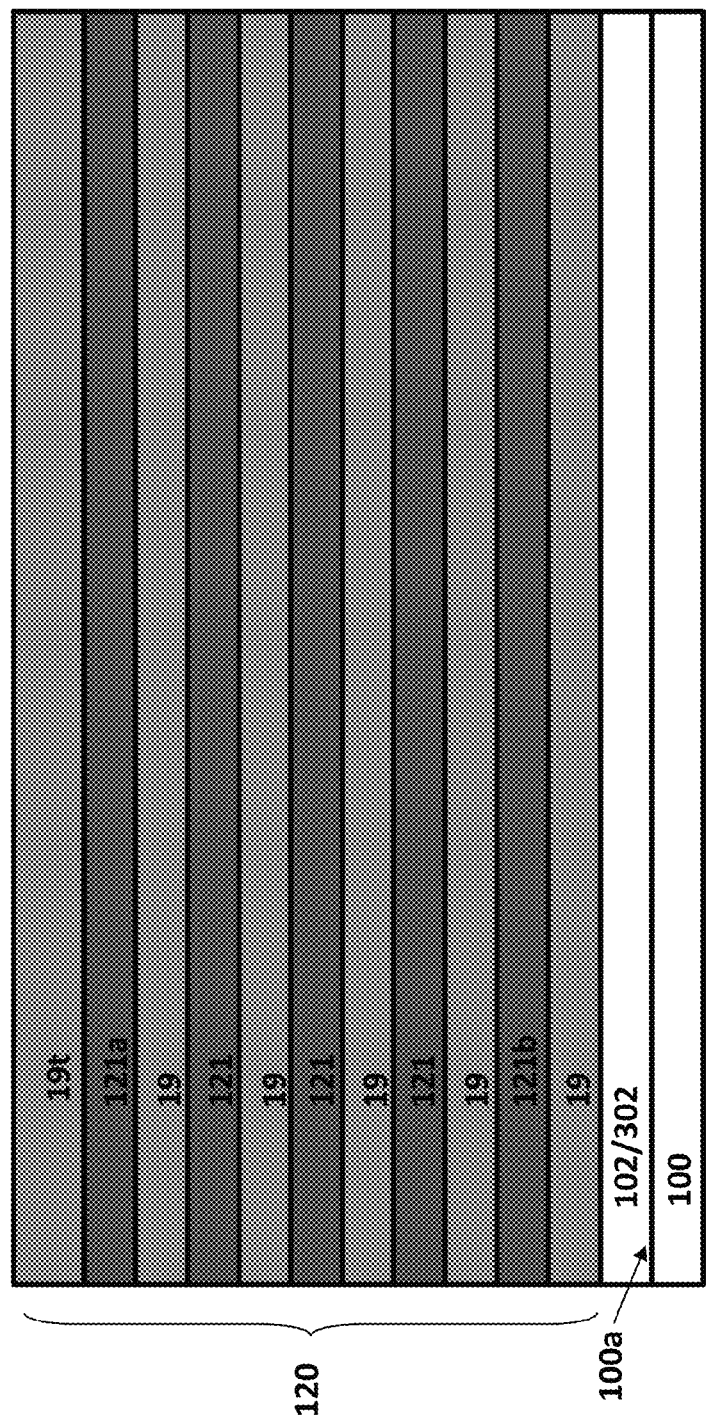

As shown in FIG. 7, a stack 120 of alternating layers 19 and 121 are formed over the p-well 302. Layers 19, 121 may be deposited by any suitable deposition method, such as sputtering, CVD, PECVD, MBE, etc. The layers 19, 121 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 121 comprise a sacrificial material, such an insulating or semiconductor material. For example, layers 19 may comprise silicon oxide and layers 121 may comprise silicon nitride or silicon, such as amorphous silicon or polysilicon, or another semiconductor material, such as a group IV semiconductor, including silicon-germanium and germanium. In some embodiments, layers 121 comprise silicon nitride.

Figure 8:
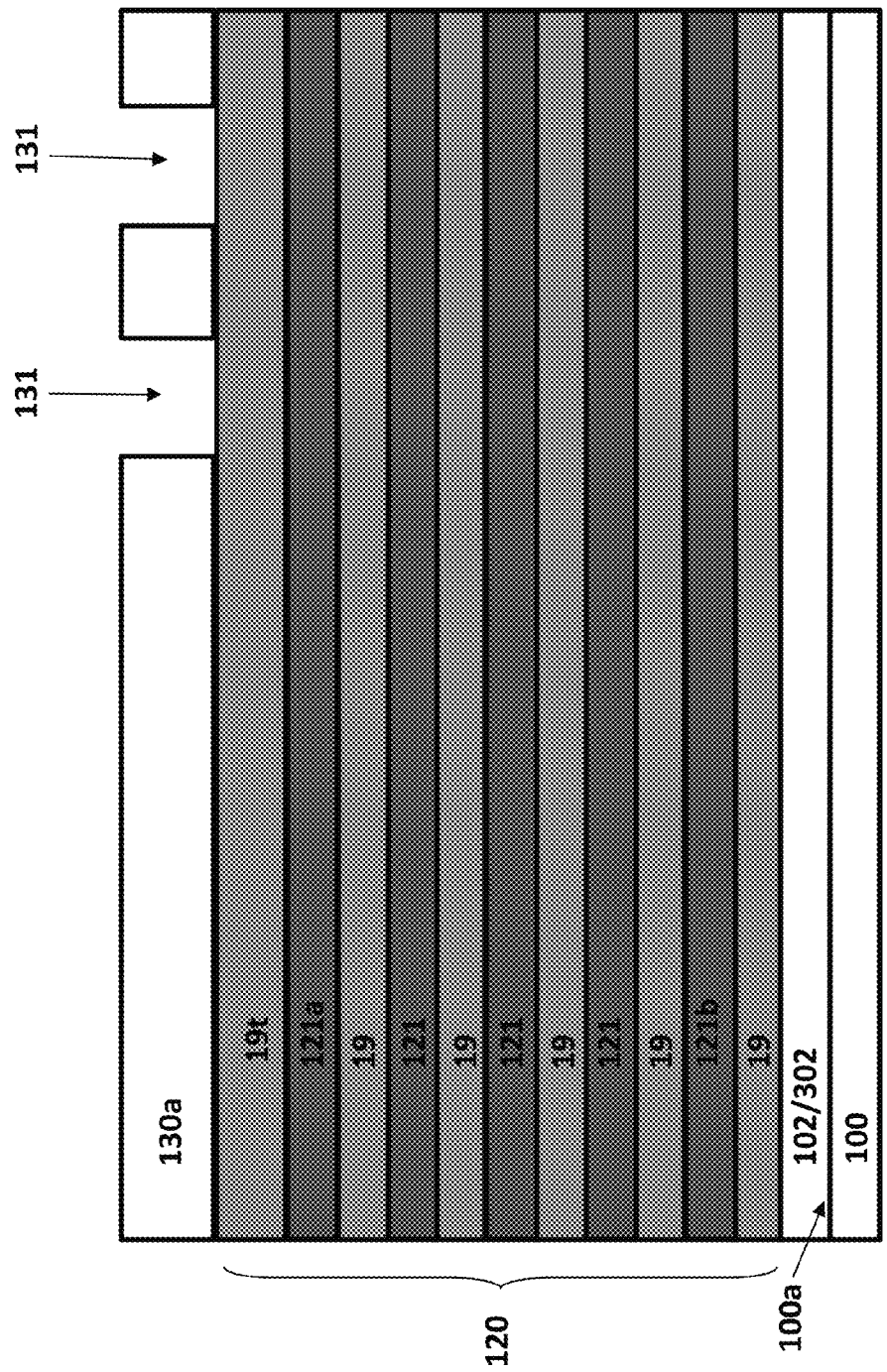
Figure 9:
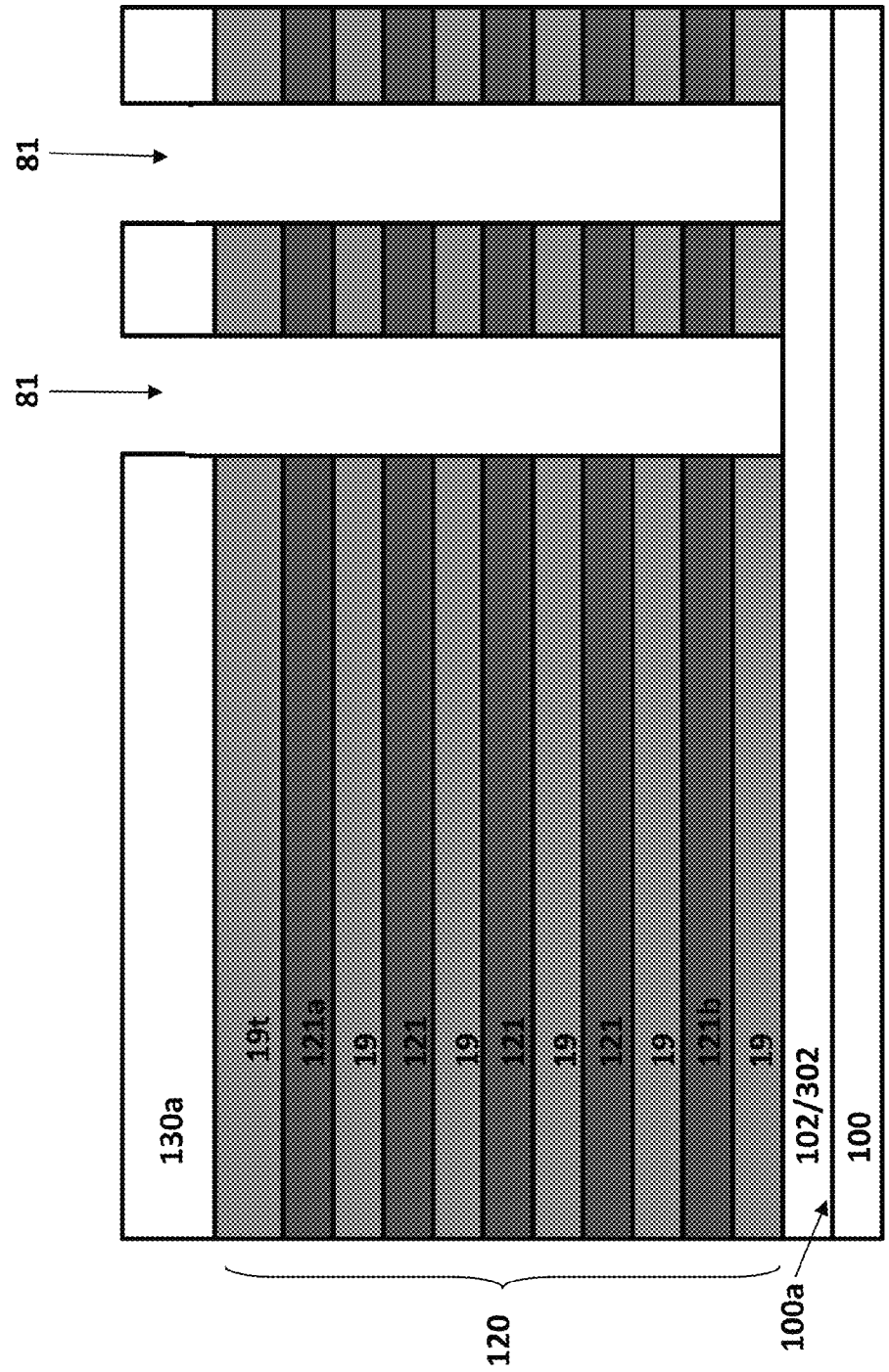

The deposition of layers 19, 121, is followed by etching the stack 120 to form at least one a front side opening 81 in the stack 120. An array of a memory openings 81 (e.g., cylindrical memory openings or holes) may be formed in locations where vertical channels of NAND strings 150 will be subsequently formed, as shown in FIGS. 8 and 9. The memory openings 81 may have circular cross sections when viewed from above. For the sake of clarity, two memory openings 81 are shown in FIGS. 8 to 15.

The memory openings 81 may be formed by photolithography and etching, as follows. First, a memory opening mask 130a is formed over the top layer 19t of the stack and patterned to form mask openings 131 exposing the stack 120, as shown in FIG. 8. Mask 130a may comprise any suitable material, such as one or more layer of photoresist and/or hard mask material. Then, the stack 120 is etched using RIE to form the memory opening 81 in the stack through the mask openings 131 in mask 130. Each front side memory opening 81 is etched until the source contact 102 (or the substrate 100 or p-well 302 if the source contact 102 is omitted) is exposed in the opening 81, as shown in FIG. 9.

Figure 10:
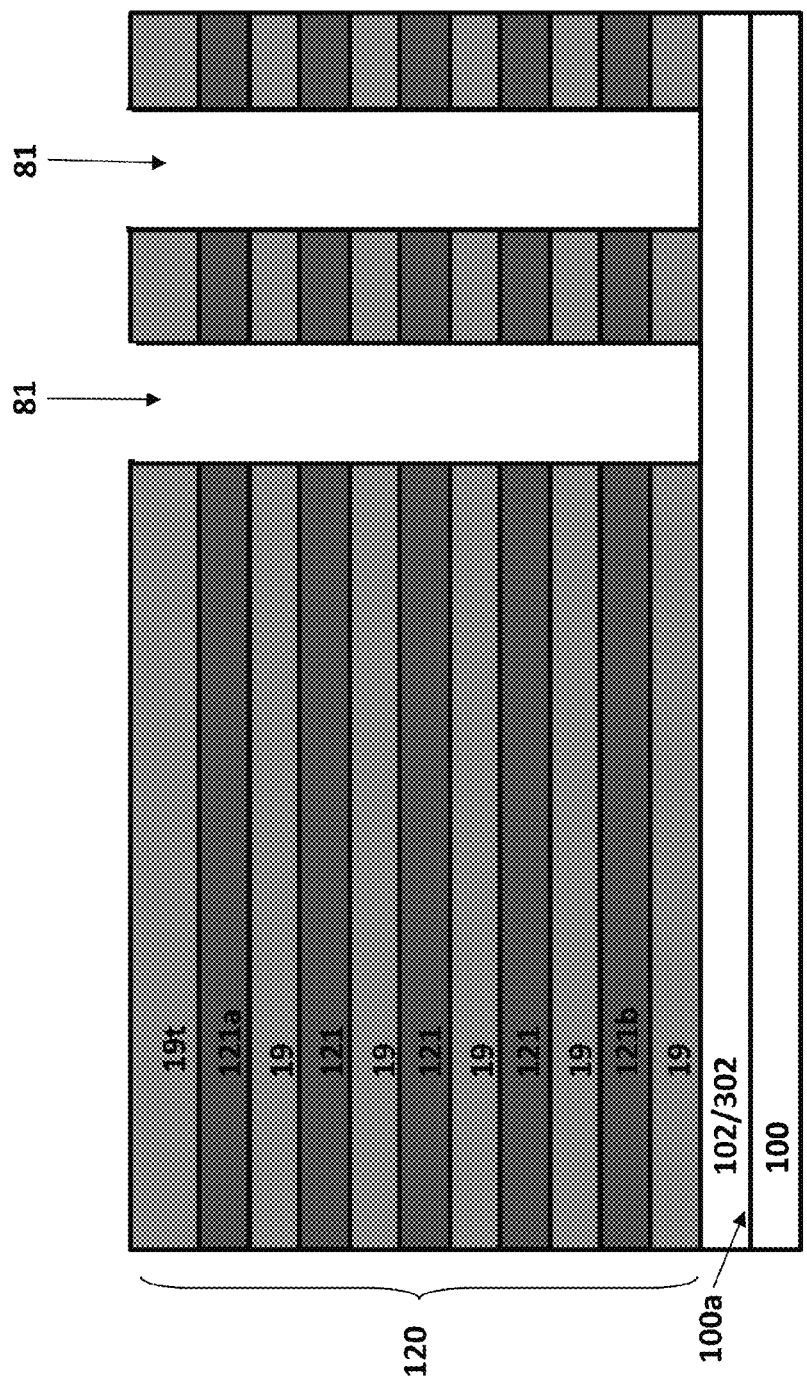

The mask 130a is then removed, as shown in FIG. 10.

Figure 11:
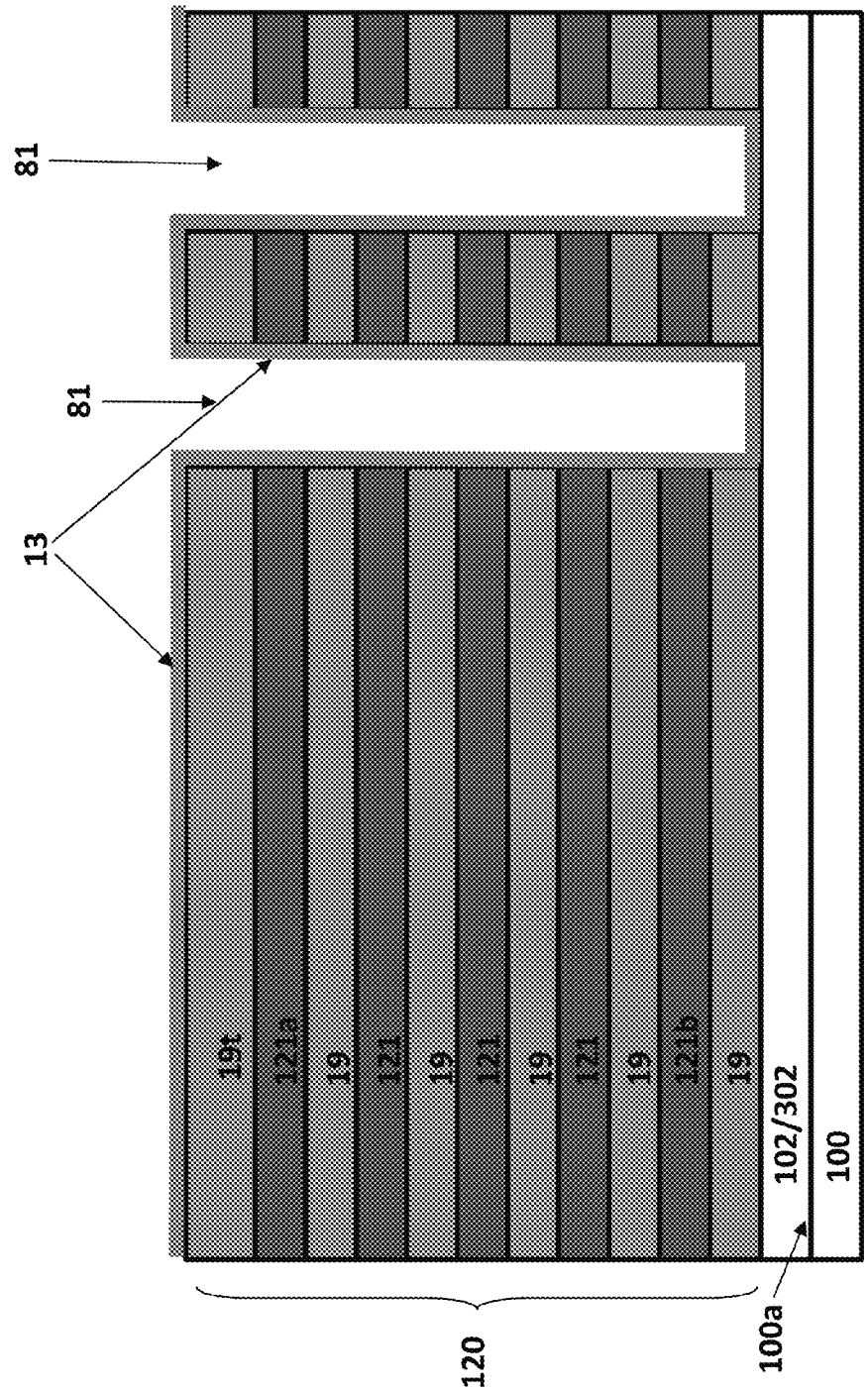

Then, as shown in FIG. 11, the memory film 13 is formed in the memory openings 81 and over the stack 120. Specifically, this step optionally includes forming a blocking dielectric in the memory openings 81, forming a charge storage region (e.g., silicon nitride layer or floating gates) over the optional blocking dielectric in the memory opening, and forming a tunneling dielectric over the charge storage region in the memory opening 81. Alternatively, the blocking dielectric is formed from the back side at a later step in the process. If the charge storage region comprises the floating gates, then each floating gate should be electrically insulated and vertically separated from the floating gates in other device levels.

Then, the channel 1 is formed by depositing channel material, such as a lightly doped or intrinsic polysilicon over the tunnel dielectric layer portion of the memory film 13 in the memory openings 81. In some embodiments, a high temperature anneal may be performed after forming the channel 1. As discussed above, the entire memory opening 81 may be filled to form the device illustrated in FIG. 3D. Alternatively, a layer of channel material may first be deposited in the memory opening 81 followed by deposition of an insulating fill material 2 to form the device illustrated in FIG. 3B.

Figure 12:
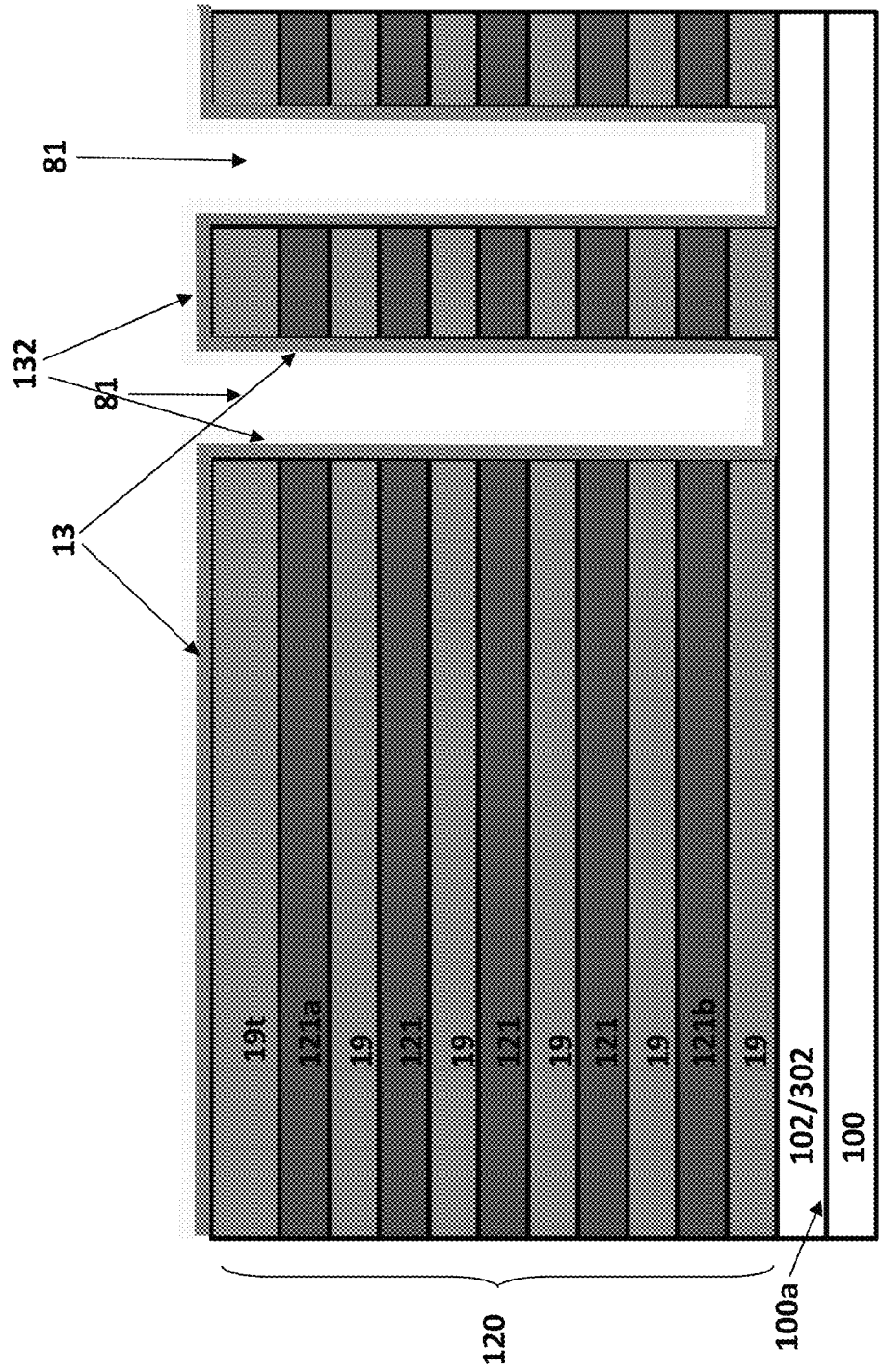

In some embodiments, the channel may be formed by a multi-step process utilizing a protective layer, as will be described below with reference to FIGS. 12 to 20. First, as shown in FIG. 12, a cover semiconductor layer 132, such as an amorphous silicon or polysilicon layer, is formed in the memory openings 81 over the memory film 13 and over the stack 120. Layer 132 protects the memory film 13 from damage during a subsequent etching step.

Figure 13:
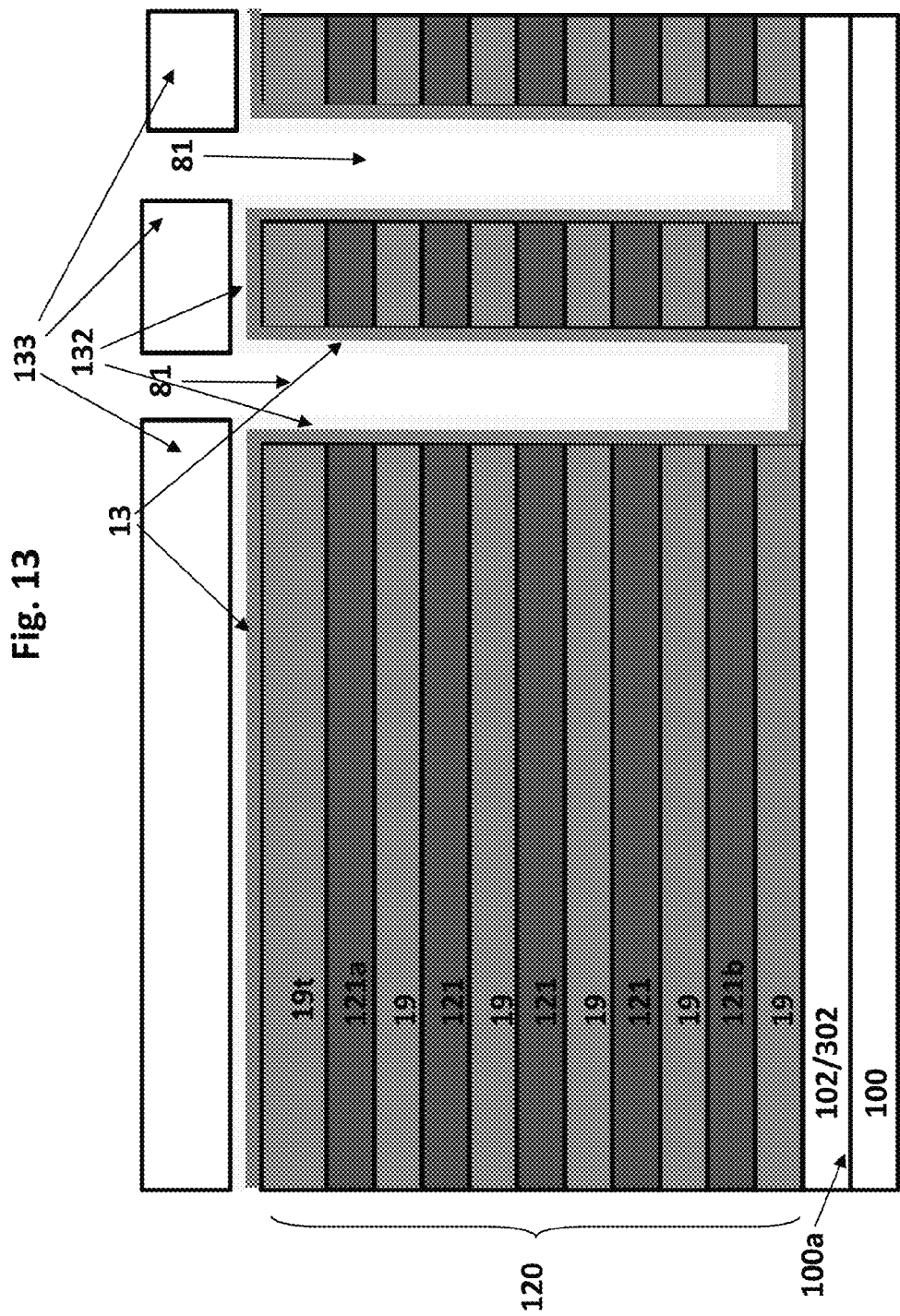

Then, an optional hard mask cover layer 133 is formed over layer 132. The hard mask cover layer 133 may comprise an amorphous carbon layer for example. Layer 133 is deposited non-conformally such that layer 133 is located over layer 132 on top of the stack 120, but does not extend into the memory openings 81, as shown in FIG. 13. Alternatively, layer 133 may be deposited conformally and then patterned by photolithography and etching to be removed from the memory opening 81. Alternatively, hard mask cover layer 133 can be omitted.

Figure 14:
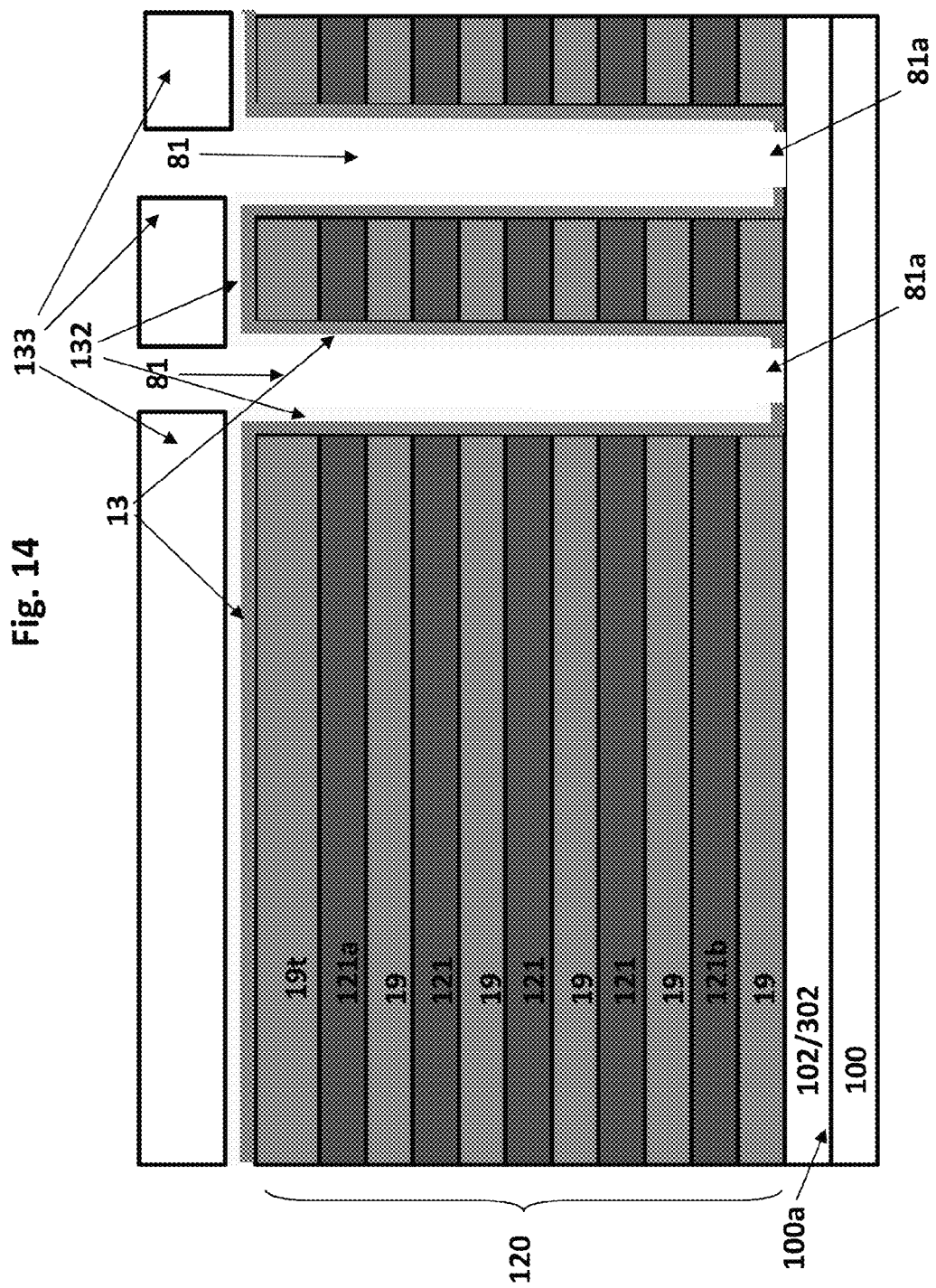

As shown in FIG. 14, the memory film 13 (e.g., the blocking dielectric, the charge storage region and the tunnel dielectric) and cover semiconductor layer 132 are removed from a bottom of the memory openings 81 using RIE or another suitable anisotropic etching method. The cover semiconductor layer 132 protects the memory film 13 on the sidewalls of the memory openings 81 from etching damage, and the optional hard mask cover layer 133 protects the rest of the stack from being etched. Alternatively, the top of cover semiconductor layer 132 is removed and the top stack layer 19t protects the rest of the stack from being etched. The etching step forms extension portions 81A of the openings 81 which expose the substrate 100, or p-well 302 at the bottom of the memory openings 81. The hard mask cover layer 133 is then removed by any suitable method, such as ashing or selective wet etching.

Figure 15:
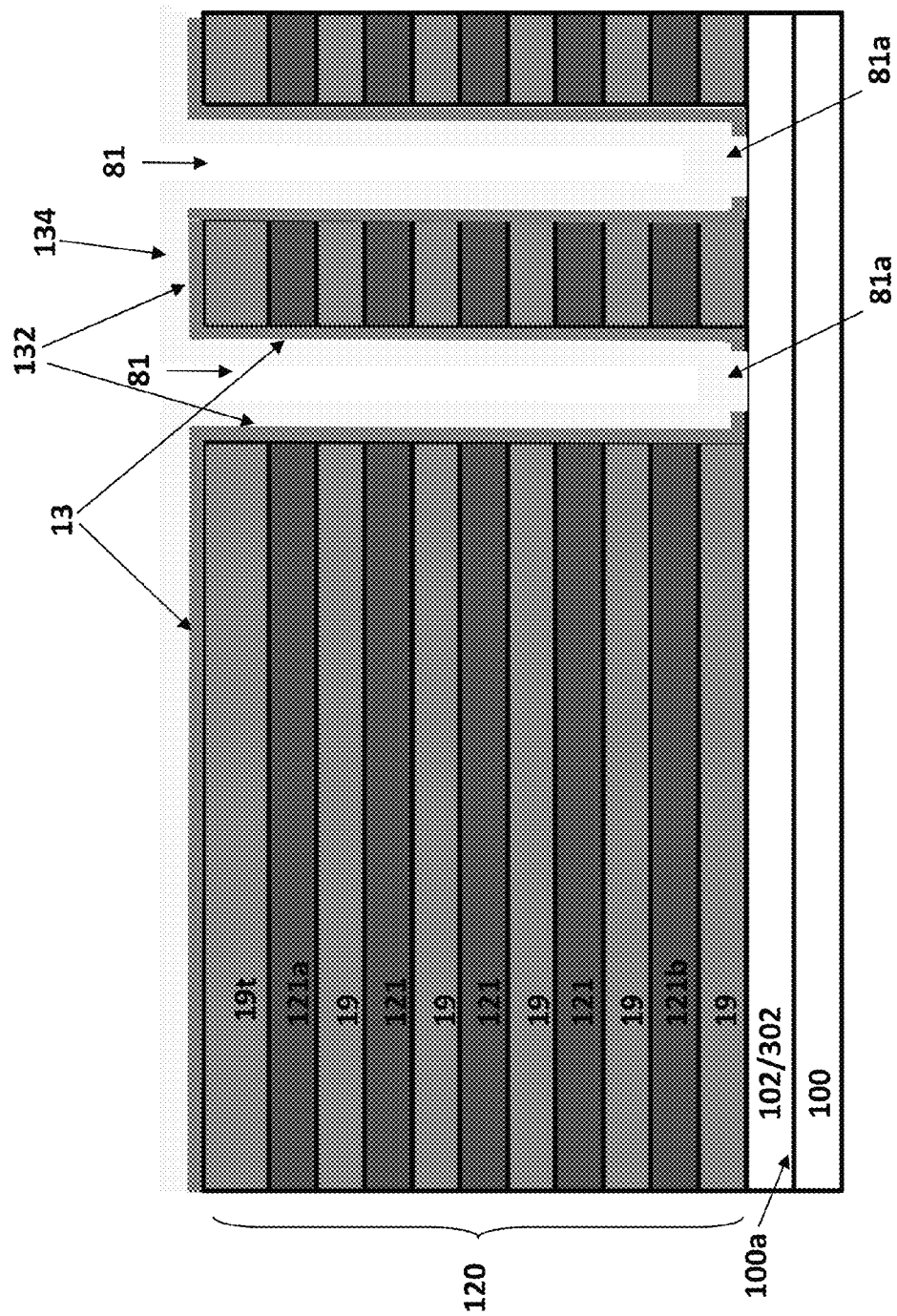

As shown in FIG. 15, a semiconductor channel body layer 134 is formed in the memory openings 81 such that it makes contact with the source contact 102, substrate 100, or p-well 302 exposed in the memory openings 81 (e.g., exposed in portions 81a of memory openings 81). The semiconductor channel body layer 134 comprises a channel material, such as amorphous silicon or polysilicon. Layers 132 and 134 may comprise the same materials, and layer 134 contacts layer 132 on the sidewalls of the memory openings 81.

Figure 16:
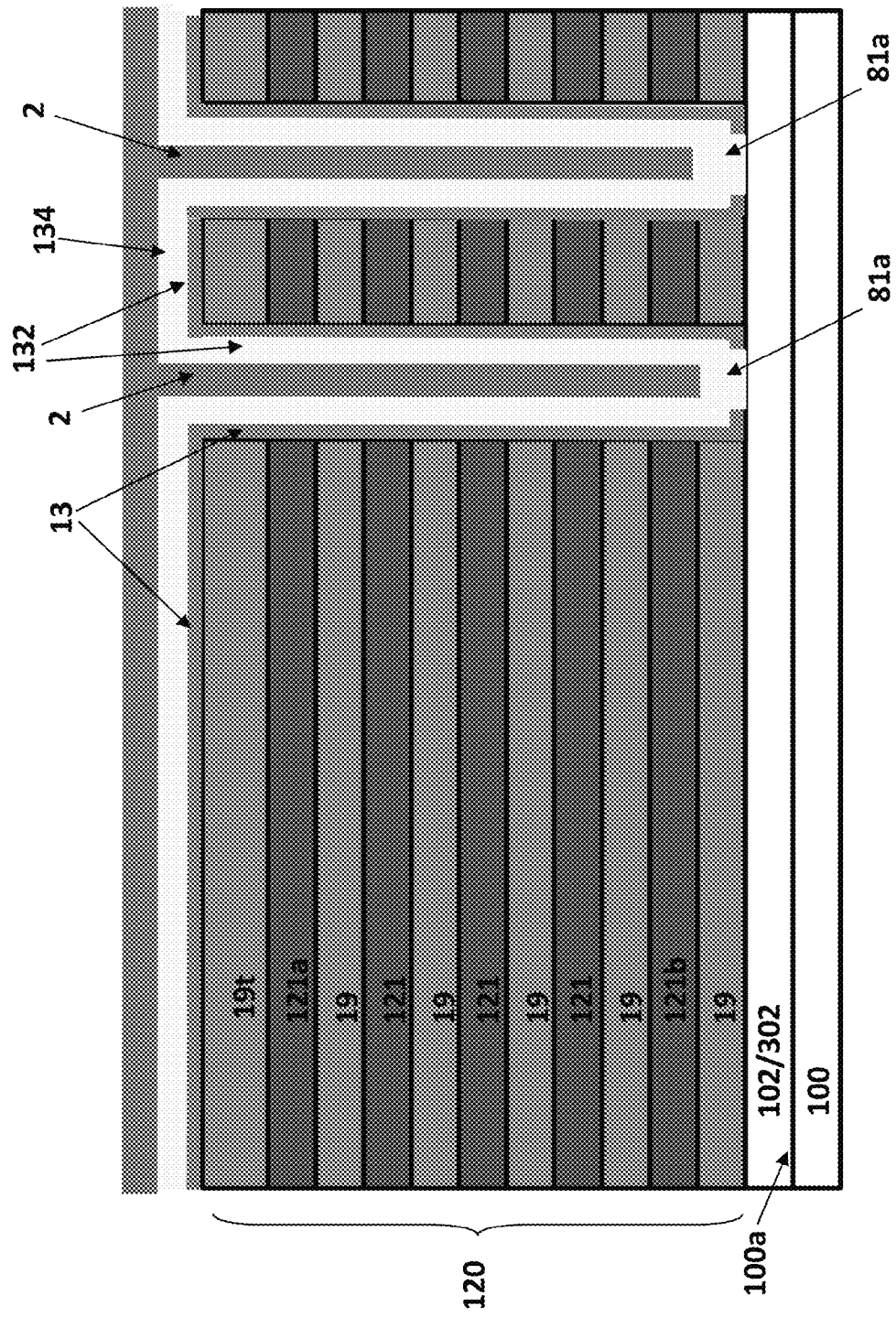
Figure 17:
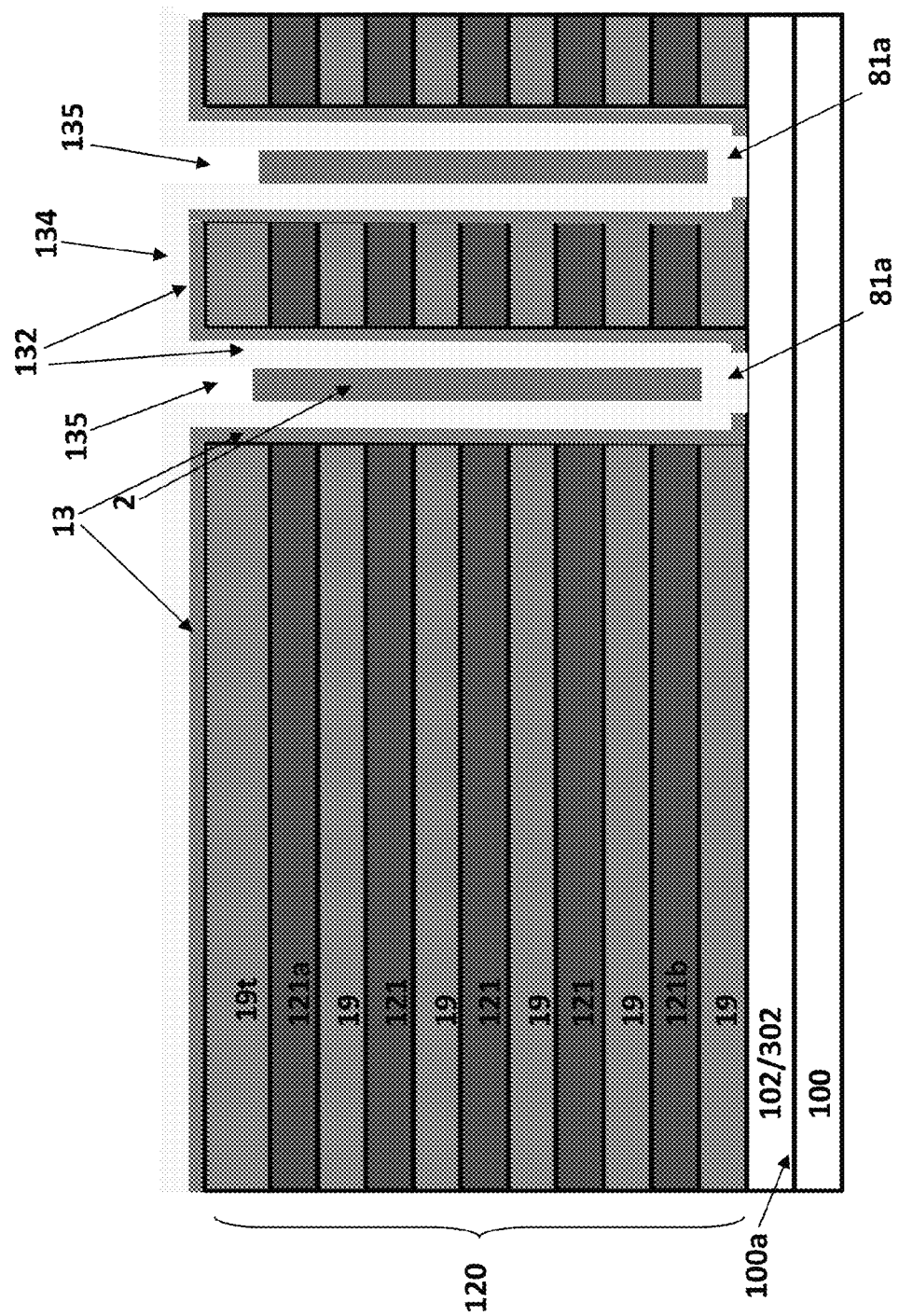

The optional core insulating layer 2, such as a silicon oxide layer is then deposited in the memory openings 81 and over the stack 120, as shown in FIG. 16. Layer 2 is also shown in FIGS. 3A and 3B. The core insulating layer 2 is then recessed from the top of the memory openings 81 by selective etchback to form a recess 135 in the top of the memory openings 81, as shown in FIG. 17.

Figure 18:
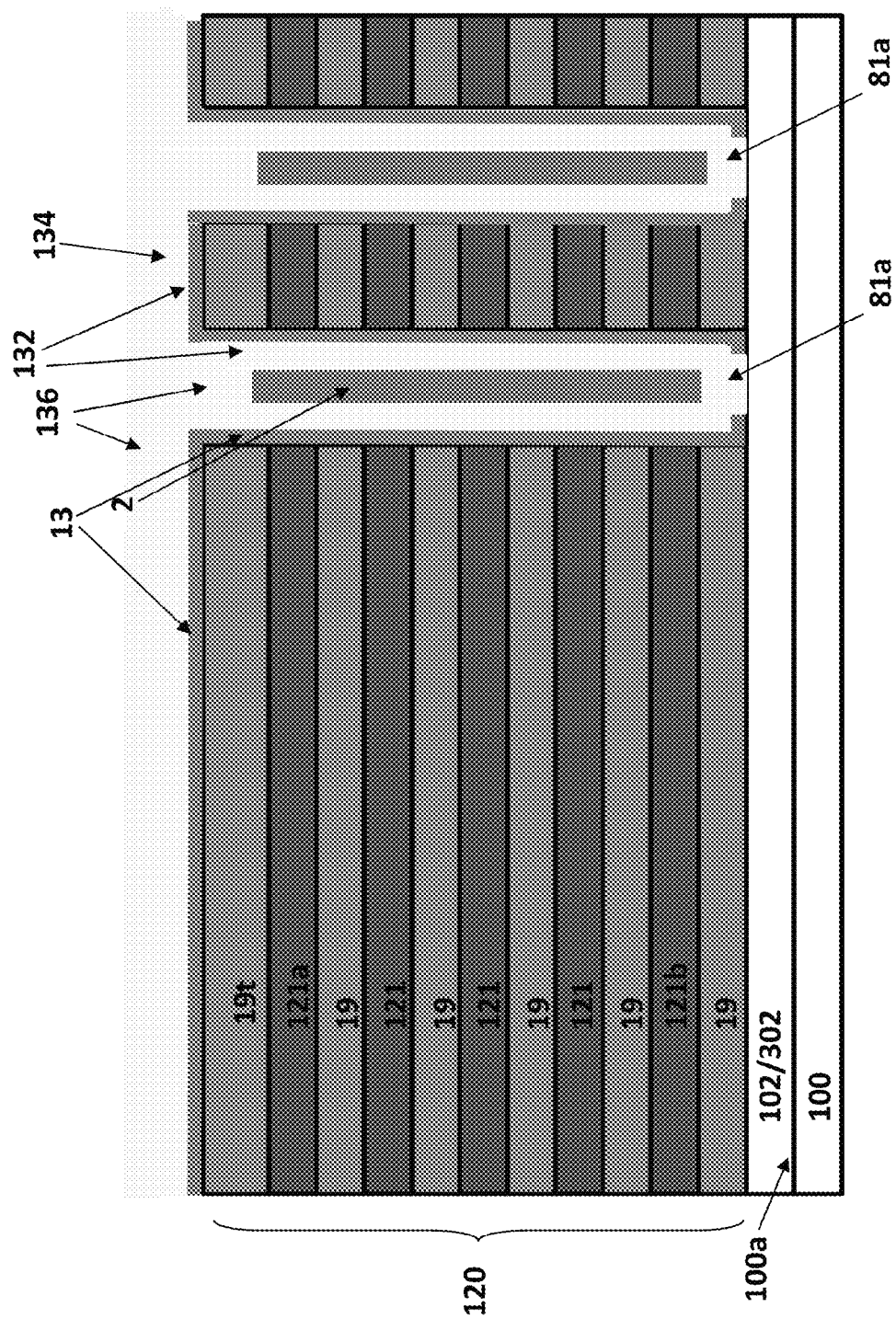

The recess 135 is then filled by a semiconductor cap layer 136 which is deposited conformally over layer 134 on the stack 120 and in the recess 135, as shown in FIG. 18. The cap layer 136 comprises a channel semiconductor material, such as amorphous silicon or polysilicon. Layer 136 may comprise the same material as layers 132 and 134. Layer 136 completely fills the recess 135 and contacts layer 134 on the sidewalls of the recess 135 in the memory openings 81.

Figure 19:
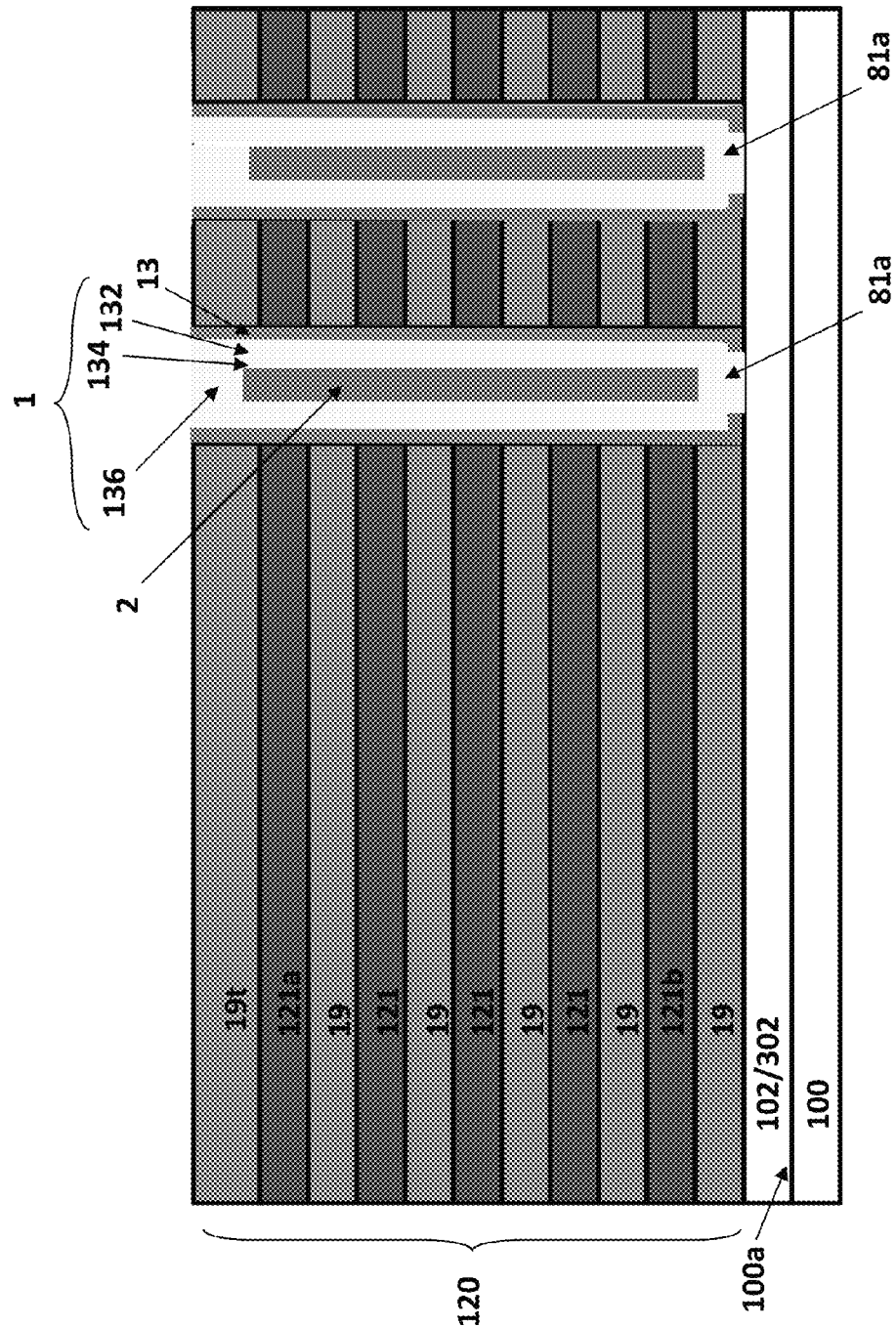

As shown in FIG. 19, the semiconductor channel layers 132, 134 and 136 are then planarized by etch back or CMP to remove these layers from the top of the stack 120 to expose the upper silicon oxide layer 19t of the stack and the top of the cover layer 85. The channel layers 132, 134 and 136 remain in the memory openings 81 and together form the above described channel 1 in the memory device levels 70.

Thus, as shown in FIG. 19, the channel 1 is composed of three sublayers 132, 134, 136. Sublayer 132 comprises an outer hollow cylinder or hollow inverse truncated cone which contacts the memory film 13 with its outer surface. Sublayer 132 does not contact the source contact 102.

Sublayer 134 comprises an inner hollow cylinder or hollow inverse truncated cone which contacts sublayer 132 with its outer surface. Sublayer 134 contacts the core insulating layer 2 with its inner surface in the lower portion of the opening 81 and contacts sublayer 136 with its inner surface in the upper portion of the openings 81. In some embodiments, sublayer 134 completely fills the extension portion 81a of the openings 81 and contacts the source contact 102, substrate 100, or p-well 302.

Sublayer 136 comprises a filled cylinder or filled inverse truncated cone which is located only in the upper portion of the openings 81. Sublayer 136 contacts sublayer 134 with its outer surface. Sublayer 136 also contacts the top of the core insulating layer 2 with its bottom surface.

Figure 20:
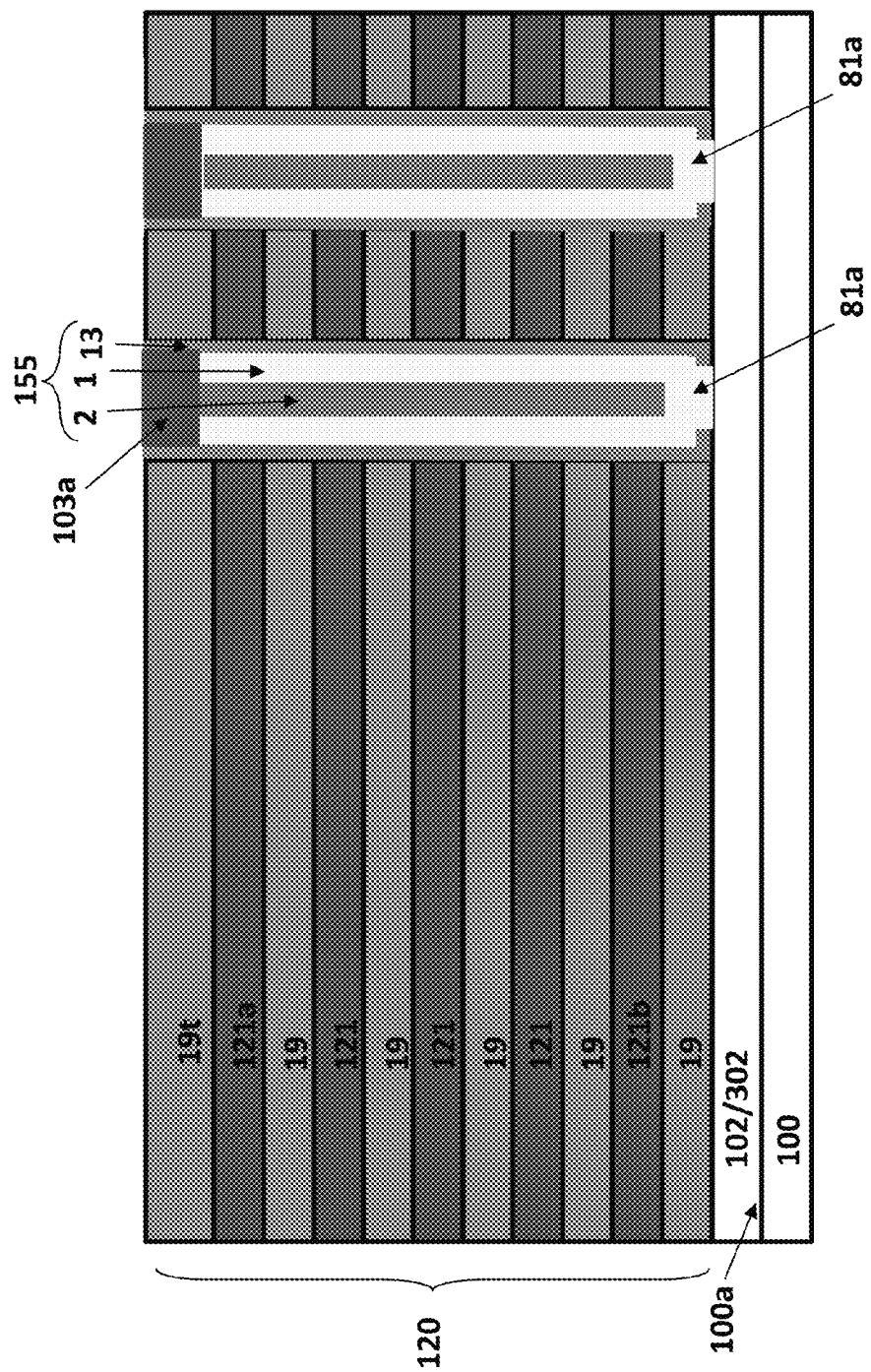

As shown in FIG. 20, a top portion of the polysilicon channel 1 is doped to form a doped drain 103a. The memory film 13, semiconductor channel 1, and core insulating layer 2 together form memory opening material 155.

Figure 21:
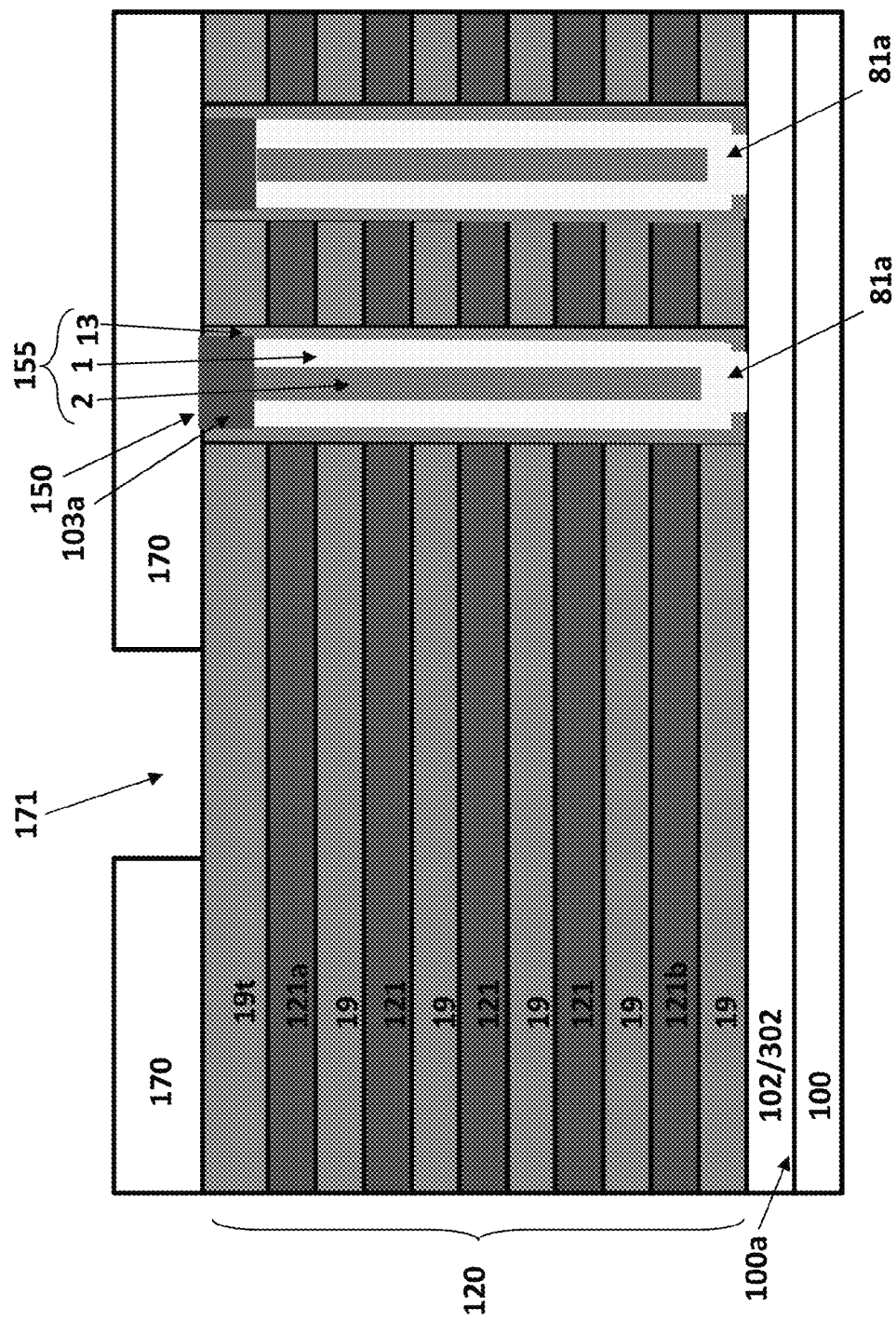
FIGS. 21, 23, and 24 are side cross sectional view of an alternative embodiment of the device illustrated in FIGS. 1A, 1B, and 1C along line D-D' in FIG. 1A.
Figure 22:
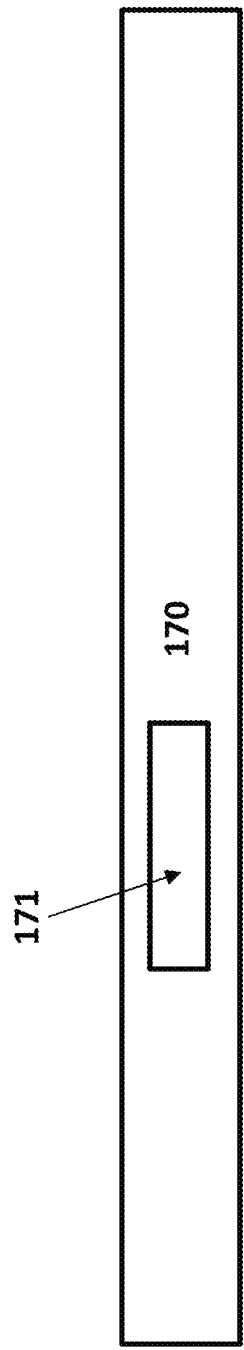
FIG. 22 is a top view of the step shown in FIG. 21.
Figure 23:
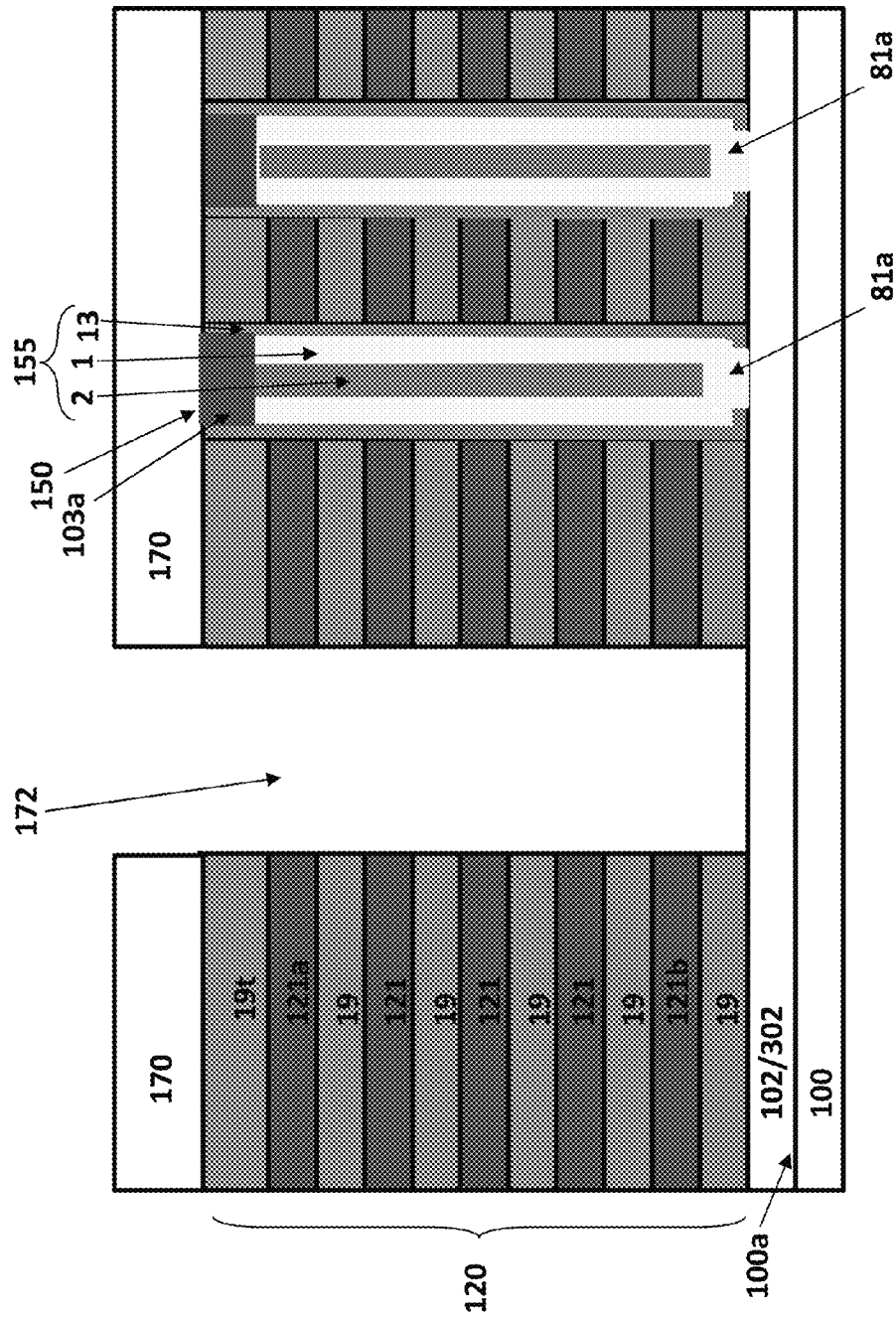
Figure 24:
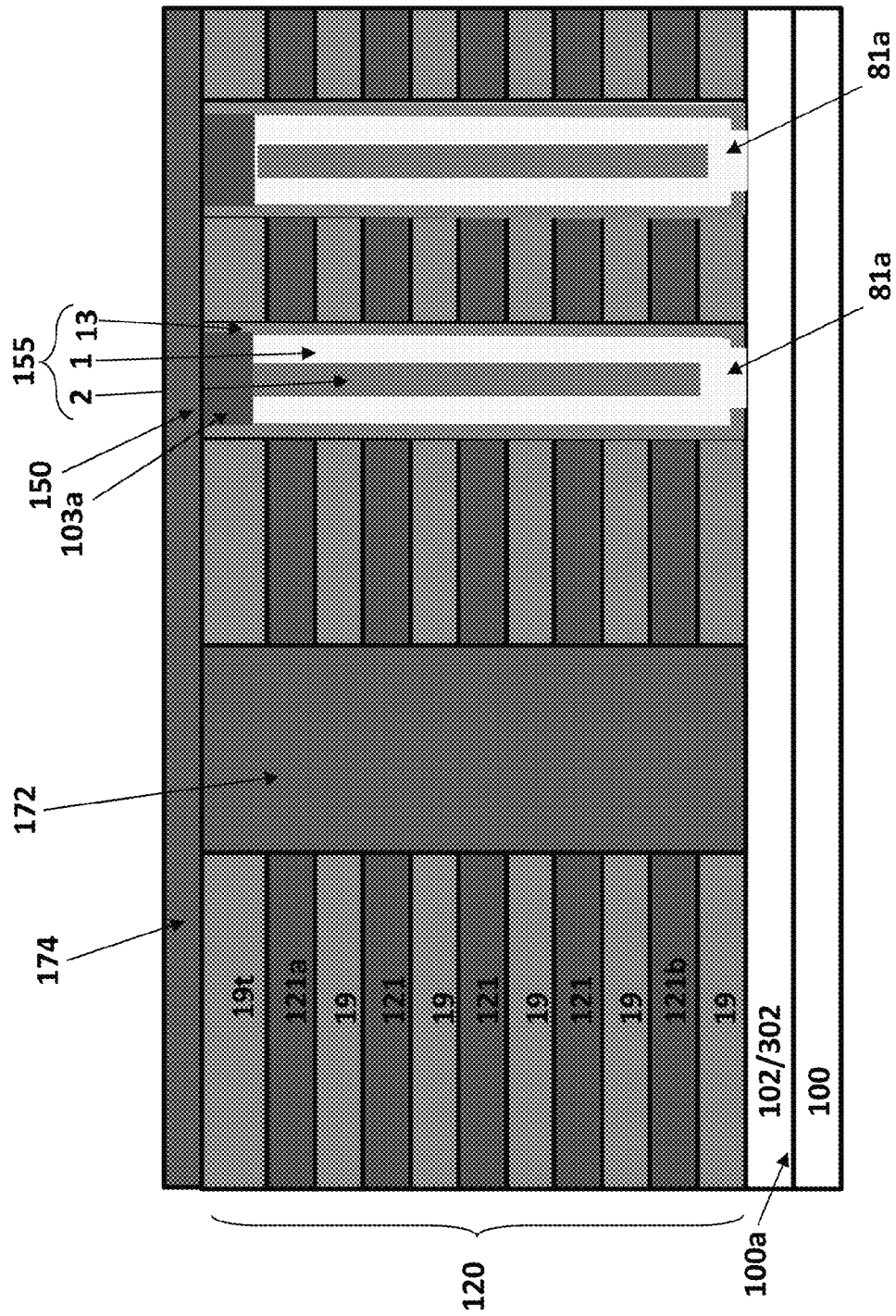

FIGS. 21 to 24 illustrate the formation of a support column which supports the stack layers after the sacrificial layers 121 are removed. FIGS. 21, 23, and 24 are side cross sectional views which have the same direction as the view in FIG. 20, but which are shifted into or out of the plane of the drawing in FIG. 20.

As shown in FIG. 21, a mask 170 is formed over the device and a column opening 171 is formed in the mask 170 to expose the upper silicon oxide layer 19t of the stack.

FIG. 22 shows the top view of the mask 170 having the opening 171.

As shown in FIG. 23, a column opening 172 is etched through all of the layers in the stack to the source contact 102 using RIE or another suitable method.

Finally, as shown in FIG. 24, the insulating support column 173 is formed in the column opening 172. The column 173 may be formed by depositing an insulating layer 174, such as a silicon oxide layer into the opening 172 and over the remaining device layers followed by planarization, such as a CMP planarization. While only one column 173 is shown in the figures, more than one column may be formed at the same time.

Figure 25:
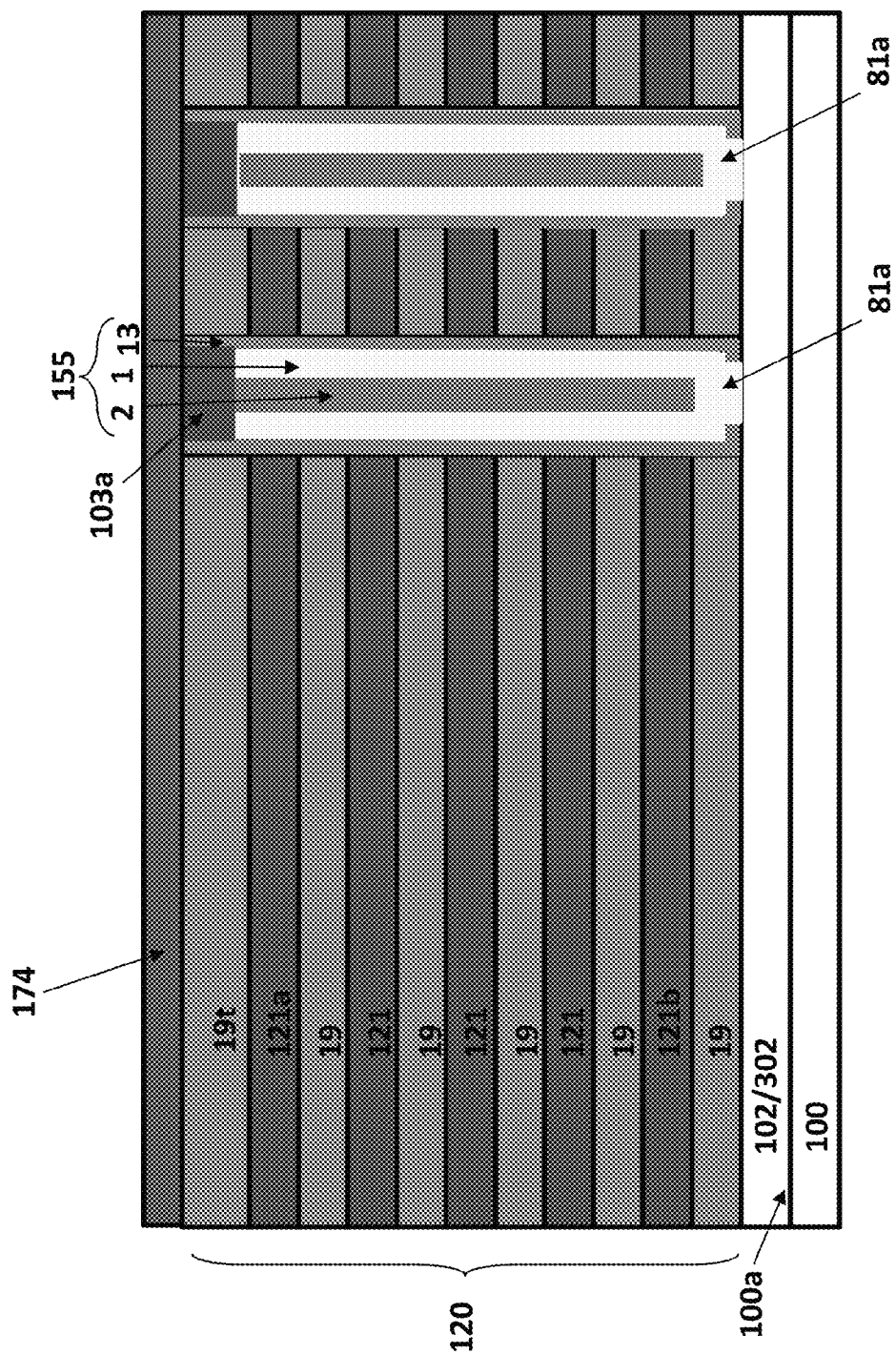

FIG. 25 shows the same cross sectional view as FIG. 20 after the formation of the column(s) 173 and layer 174. The view in FIG. 25 is in or out of the plane of the drawing in FIG. 24, such that the column 173 is not visible in FIG. 25.

FIGS. 26 to 40B illustrate a method of forming the trenches (e.g., back side openings) 84 and the source electrode 202.

Figure 26:
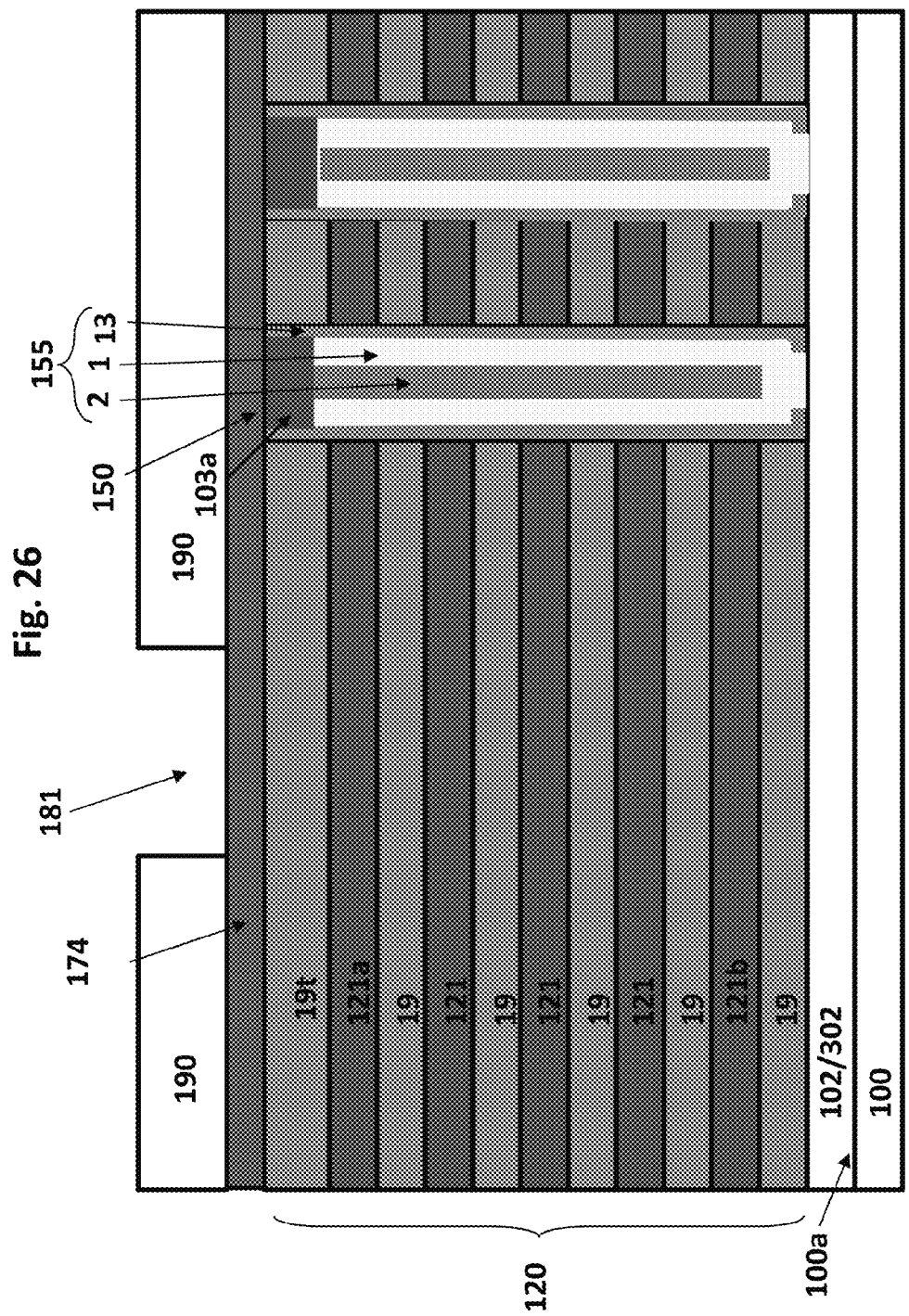

As shown in FIG. 26, a mask 190 is formed over layer 174. The mask 190 may be a photoresist and/or hard mask described above. At least one back side mask opening 181 is formed in the mask. In some embodiments, a plurality of openings 181 are formed in the mask 190.

Figure 27:
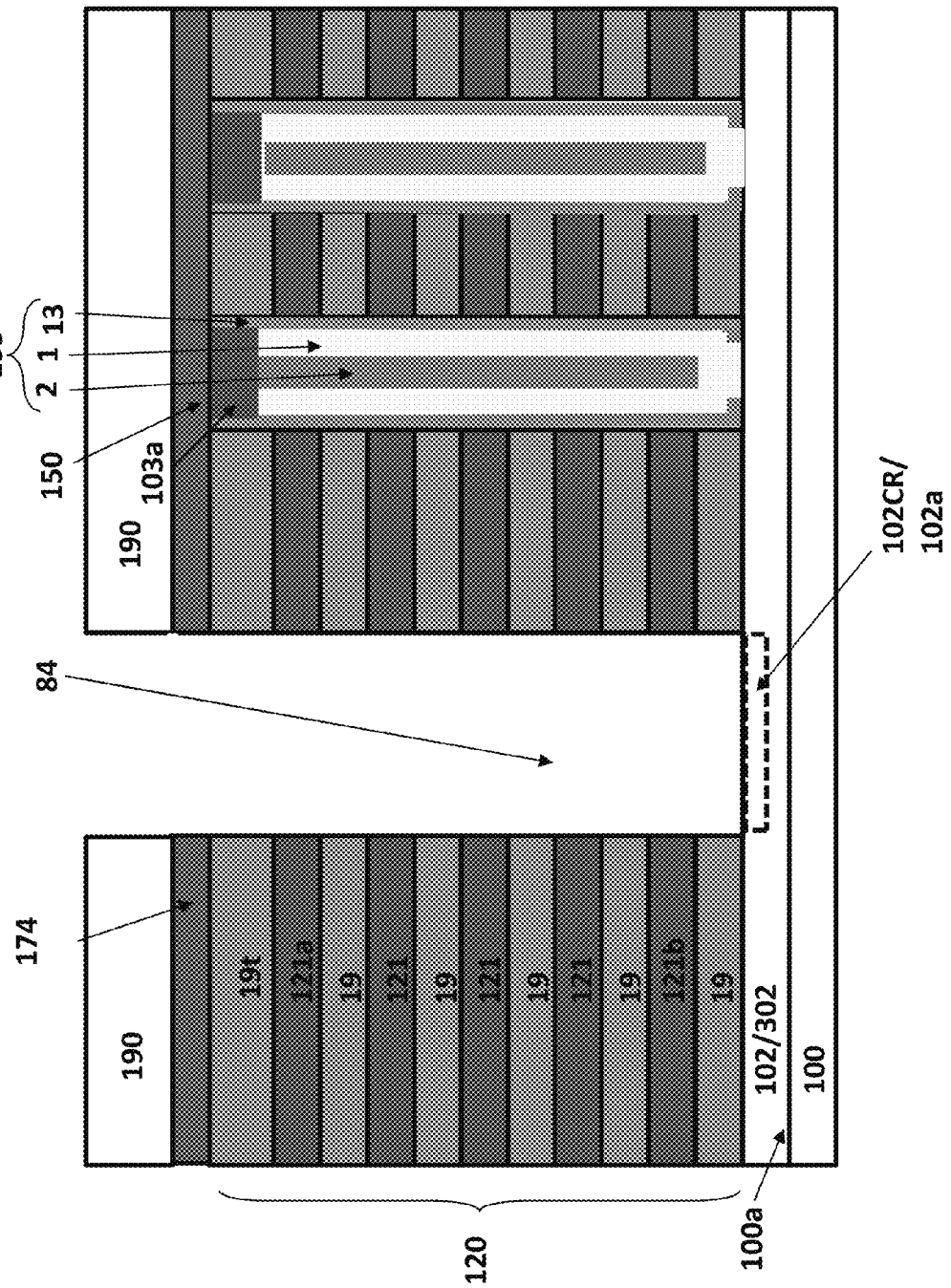

Then, as shown in FIG. 27, layer 174 and the stack 120 are etched through the opening 181 in the mask 190 to form the back side opening (e.g., the trench) 84 in the stack 120 extending to the source contact 102, substrate 100, or p-well 302. Thus, the step of forming the back side opening 84 forms a back side trench which exposes the source contact 102, substrate 100, or p-well 302, which may act as an etch stop.

If the source contact 102 comprises lightly or moderately doped polysilicon (e.g., n-type polysilicon), then dopants (e.g., n-type dopants, such as arsenic or phosphorus and/or p-type dopants, such as boron) may optionally be implanted into the source contact 102 through opening 84 to form a heavily doped contact region 102CR in the source contact 102 which will contact the source electrode 202 which will be formed in the opening 84. In an embodiment both n-type and p-type dopants are implanted to form an N−/P+ region 102CR followed by an activation anneal. If source contact 102 is omitted, then dopants are implanted into the substrate 100 to form doped source region 102a in substrate 100 or p-well 302, as shown in FIGS. 1C and 2C. The mask 190 may then be removed, as shown in FIG. 28.

Then, at least a portion of the sacrificial second material layers 121 are removed through the back side openings 84 to form back side recesses 182 between the first material layers 19, as shown in FIG. 29. Layers 121 may be removed by selective etching, such as a silicon nitride selective etching which removes silicon nitride layers 121 but does not remove the silicon oxide layers 174, 19 and 7 or the silicon regions (e.g., source contact 102). The selective etch may stop on the oxide blocking dielectric, such as a silicon oxide blocking dielectric 7 which forms the outer part of the memory film 13. The support column 173 described above supports the spaced apart layers 19 of the stack 120 and prevents layers 19 from collapsing on each other.

Alternatively, blocking dielectric can optionally be formed in back side recesses 182 instead of being formed in memory opening 81.

Metal or metal alloy control gate electrodes 3 are then formed in the back side recesses 182 through the back side openings 84, as shown in FIG. 30. A portion 183 of the metal or metal alloy control gate material partially or fully fills the back side openings (e.g., trenches) 84 and is located over layer 174. The control gate electrode 3 material may comprise any suitable materials described above. For example, the material may comprise a TiN liner and tungsten gate material. This fill can result in mechanical stress imposed on the substrate, which can lead to substrate and/or wafer warpage.

Then, as shown in FIG. 31, the portion 183 of the metal or metal alloy control gate material is removed by anisotropic etching from the back side openings (e.g., trenches) 84 and from over layer 174 without removing the control gate electrodes 3 to complete the formation of the control gate electrodes 3. The select gate electrodes 33, 34 may be formed above and below the control gate electrodes 3 at the same time or during a different step.

The insulating layer 205, such as a silicon oxide layer, is formed on sidewalls and bottom of the back side trenches 84, as shown in FIG. 32. Layer 205 is also formed over layer 174.

The second trench material 209 is formed in the back side trench 84 and a portion of the second trench material 209a is formed over layer 205, as shown in FIG. 33. The portion of the second trench material 209b formed over layer 205 is then planarized by etch back or CMP to remove the second trench material 209 from the top of the device to expose layer 205, as shown in FIG. 34.

Figure 35C:
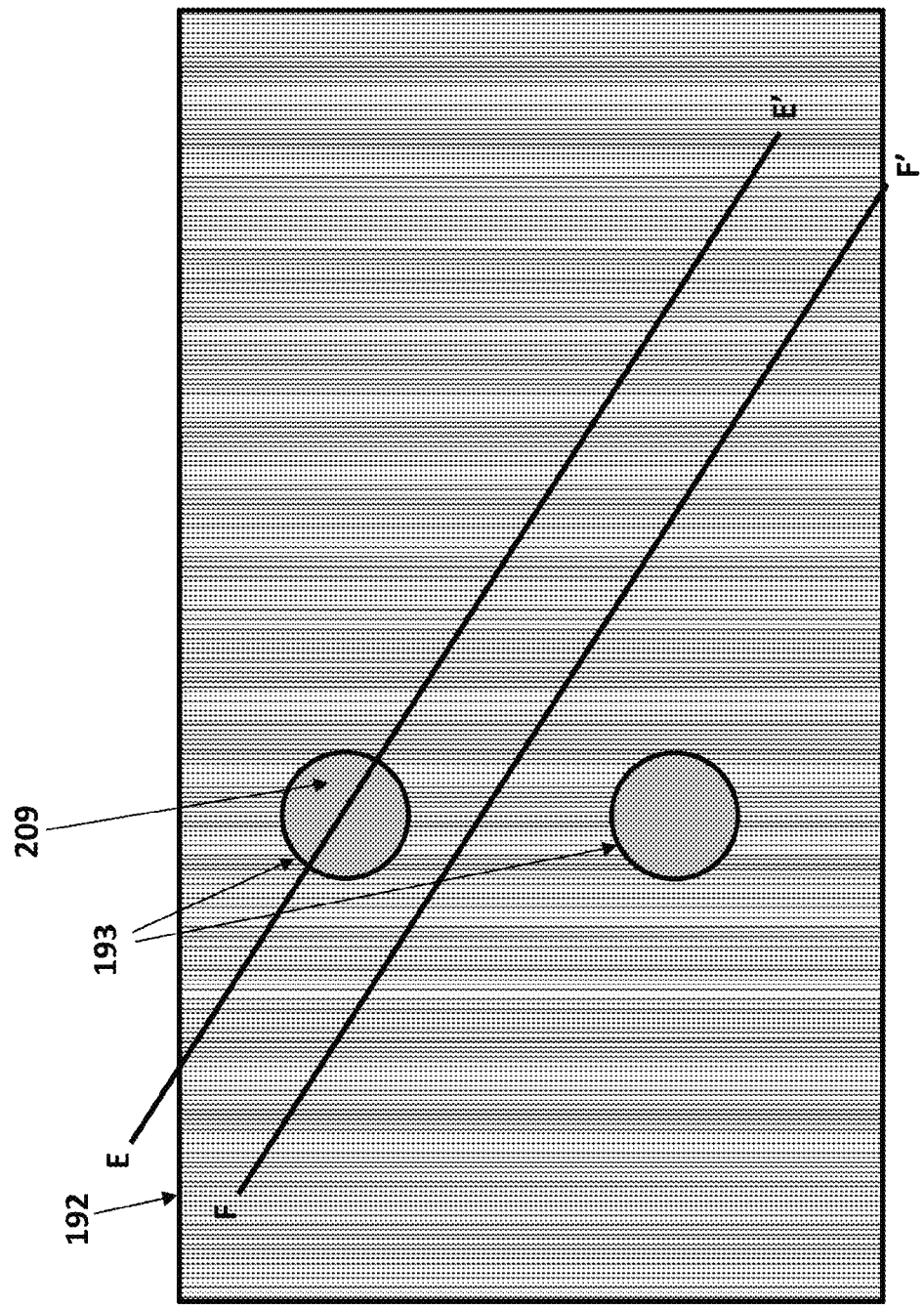
FIG. 35C is a top view of the step shown in FIGS. 35A and 35B.

As shown in FIGS. 35A, 35B, and 35C, a mask 192 is formed over layer 205. The mask 192 may be a photoresist and/or hard mask described above. At least one mask opening 193 is formed in the mask 192, as shown in FIGS. 35A and 35C. In some embodiments, a plurality of openings 193 are formed in the mask 192. As shown in FIG. 35C, the plurality of openings 193 correspond to the intended location of the pillars 206. Thus, the opening 193 of the mask 192 appears in the cross section view taken along E-E', as shown in FIG. 35A. The mask 192 appears solid in the cross section view taken along F-F', as shown in FIG. 35B.

Figure 37:
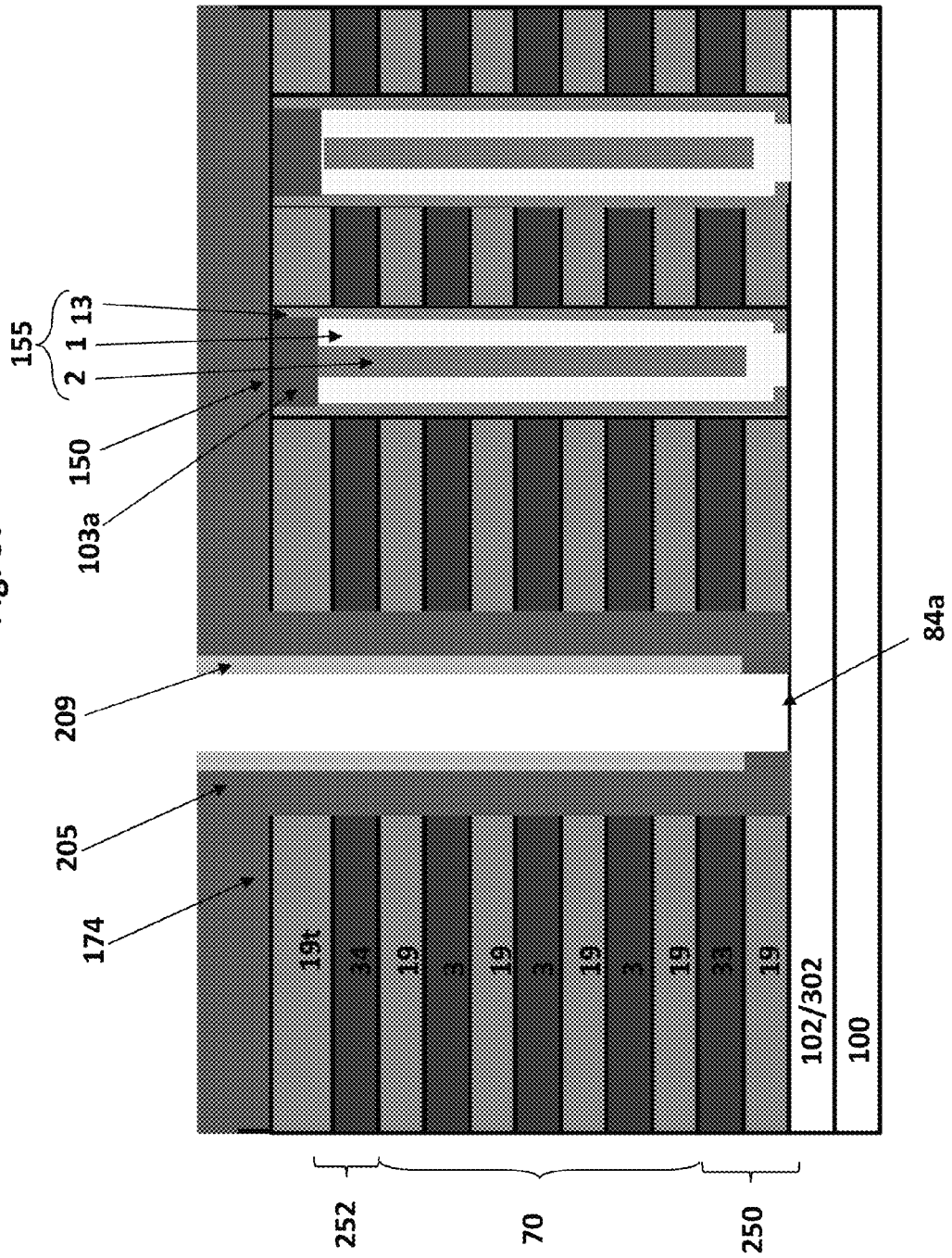

FIGS. 36-38 are side cross sectional views taken along E-E' in FIG. 35C.

As shown in FIG. 36, a portion of the second trench material 209 and a portion of the insulating layer 205 are removed from portions of the back side trench 84 by anisotropic etching (e.g., by RIE spacer etch) through the opening 193 in the mask 192. This exposes the source contact 102, substrate 100, or p-well 302, any of which may act as an etch stop. A portion of the insulating layer 205 may remain on the bottom 84a of the back side trench 84 such that the plurality of electrically conductive pillars 206 may make electrical contact with the source contact 102, substrate 100, or p-well 302, but the second trench material 209 does not make contact with the source contact 102 or p-well 302, as shown in FIGS. 1B, 1C, 2B, and 2C.

Mask 192 is then removed, as shown in FIG. 37. Alternatively, mask 192 may remain in place, and the first trench material comprising at least one electrically conductive pillar 206 may be formed through the openings 193 in the mask 192.

The first trench material comprising at least one electrically conductive pillar 206 is then formed in the back side trench 84, as shown in FIG. 38. The electrically conductive pillar 206 forms the source electrode 202. The first trench material may be any suitable metal or metal alloy, such as TiN, ruthenium, and/or tungsten.

Figure 39B:
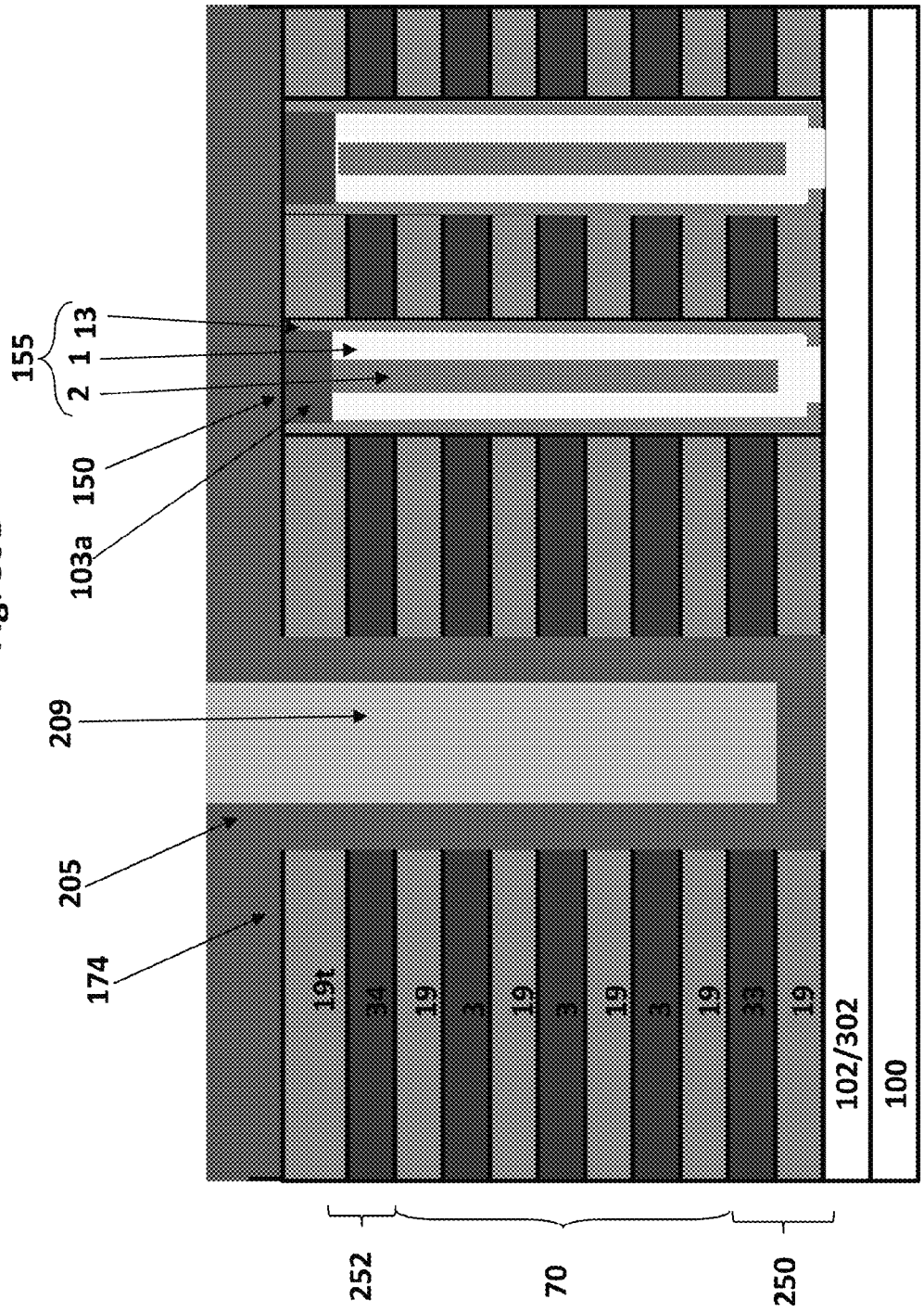
FIG. 39B is a side cross sectional view of the device along line F-F' in FIG. 39C.
Figure 39C:
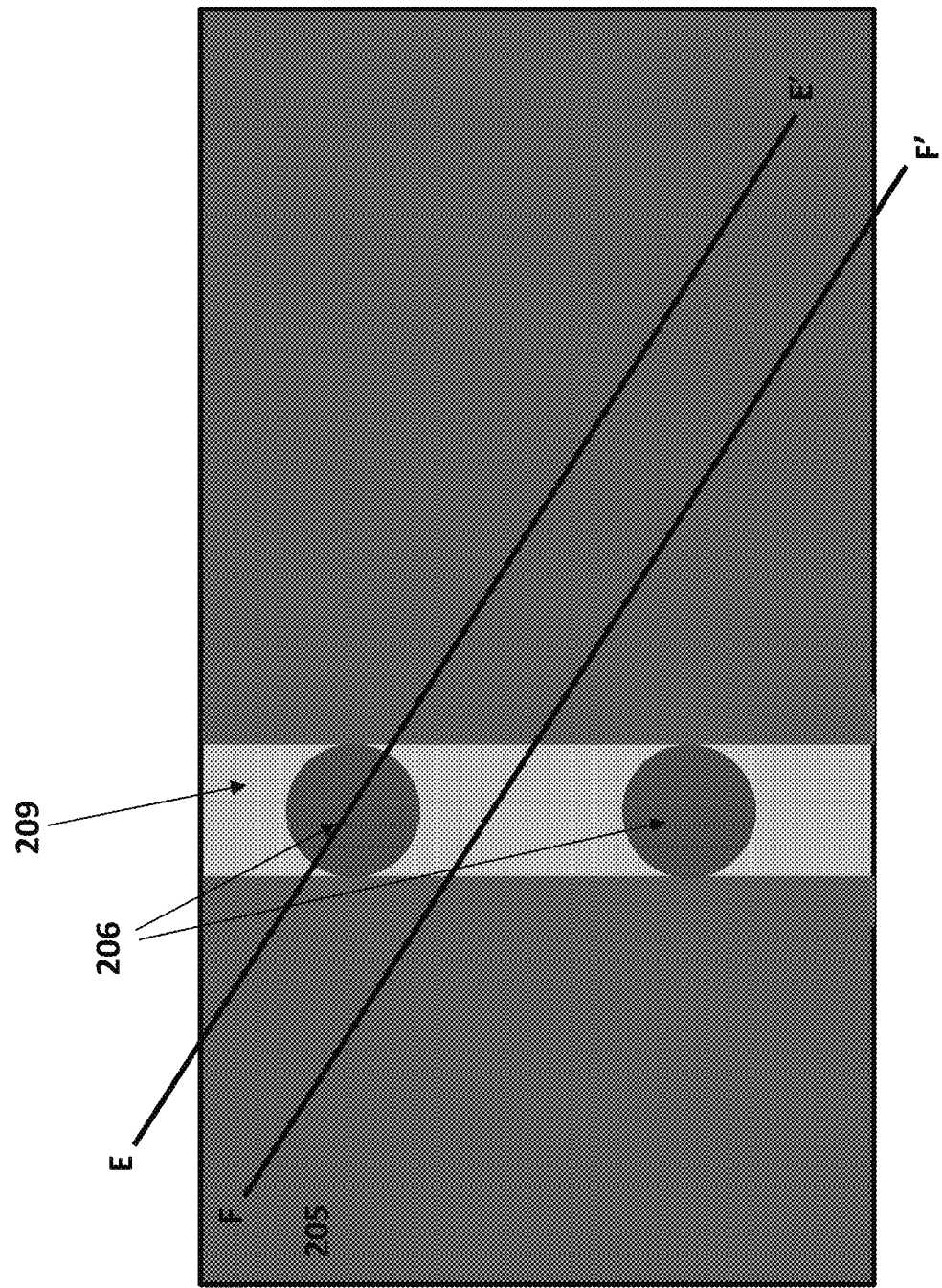
FIG. 39C is a top view of the step shown in FIGS. 39A and 39B.

A portion 186 of the source electrode material located over the device is removed by CMP or etching to leave the first material only in the back side trench 84, as shown in FIG. 39A. FIG. 39C is a top view of the step shown in FIGS. 39A and 39B. FIG. 39A is a side cross sectional view of the device along line E-E' in FIG. 39C. FIG. 39B is a side cross sectional view of the device along line F-F' in FIG. 39C.

Figure 40A:
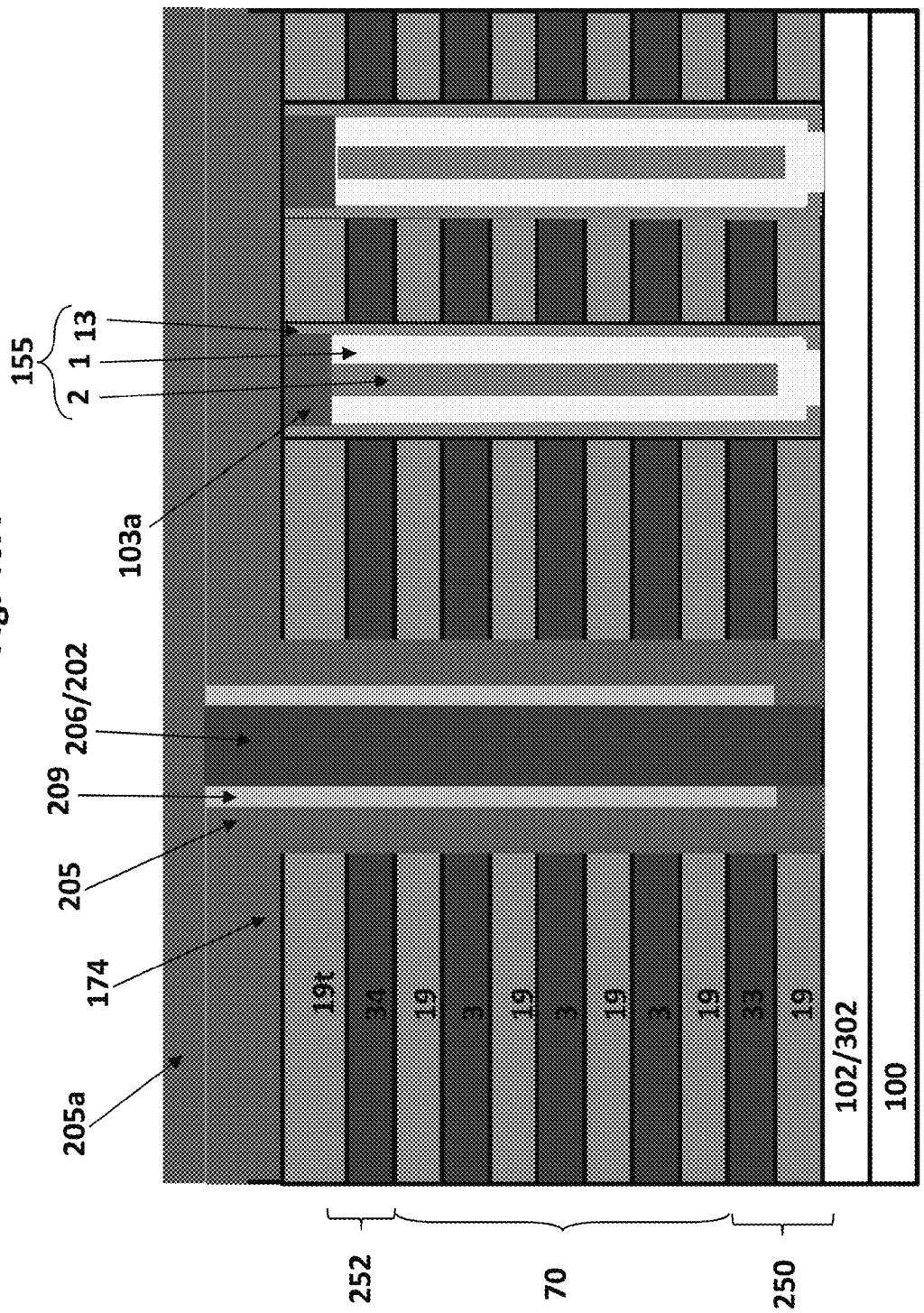

An insulator layer 205a is formed over layer 205, second trench material 209, and conductive pillar 206, as shown in FIG. 40A.

Figure 40B:
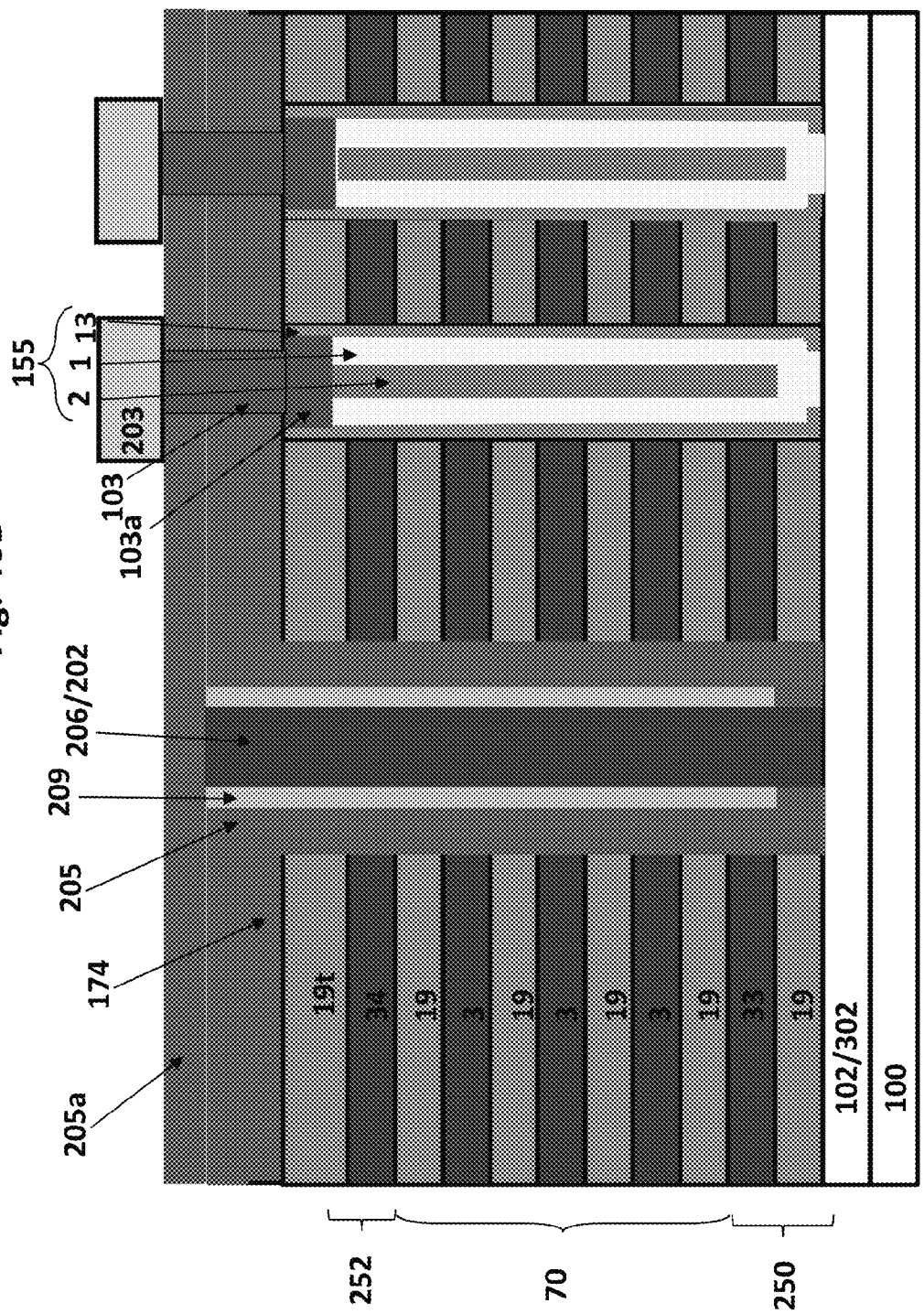

A drain contact 103 in contact with doped drain 103a is formed in an opening in layers 174, 205, and 205a. A bit line (drain electrode) 203 in contact with drain contact 103 is formed above the drain, as shown in FIG. 40B.

FIGS. 41A, 42, 43A, 44A, and 44B are side cross sectional views illustrating steps in an alternative embodiment method of making the device illustrated in FIGS. 2A, 2B, and 2C along line C-C' in FIG. 2A.

Figure 41A:
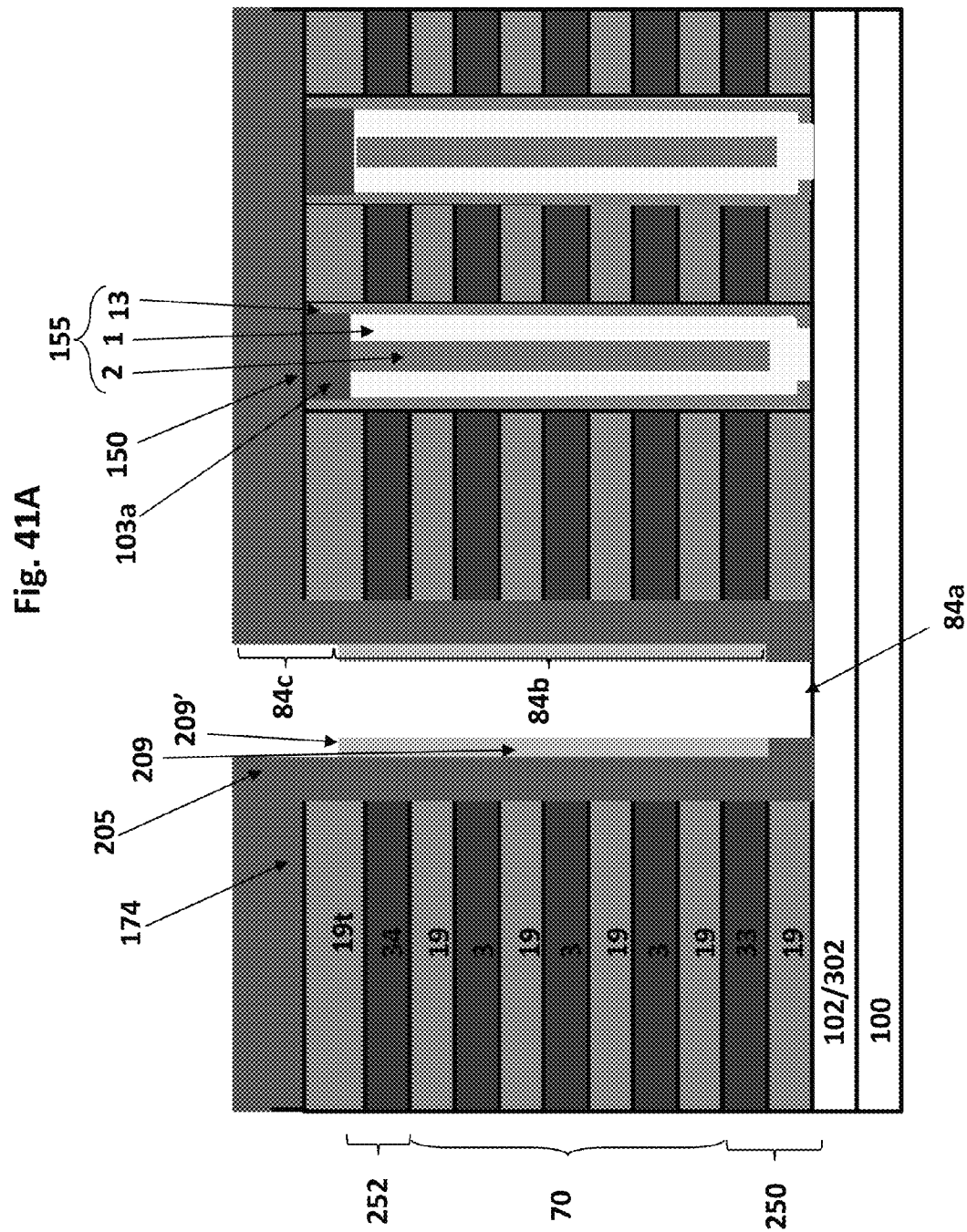
Figure 41B:
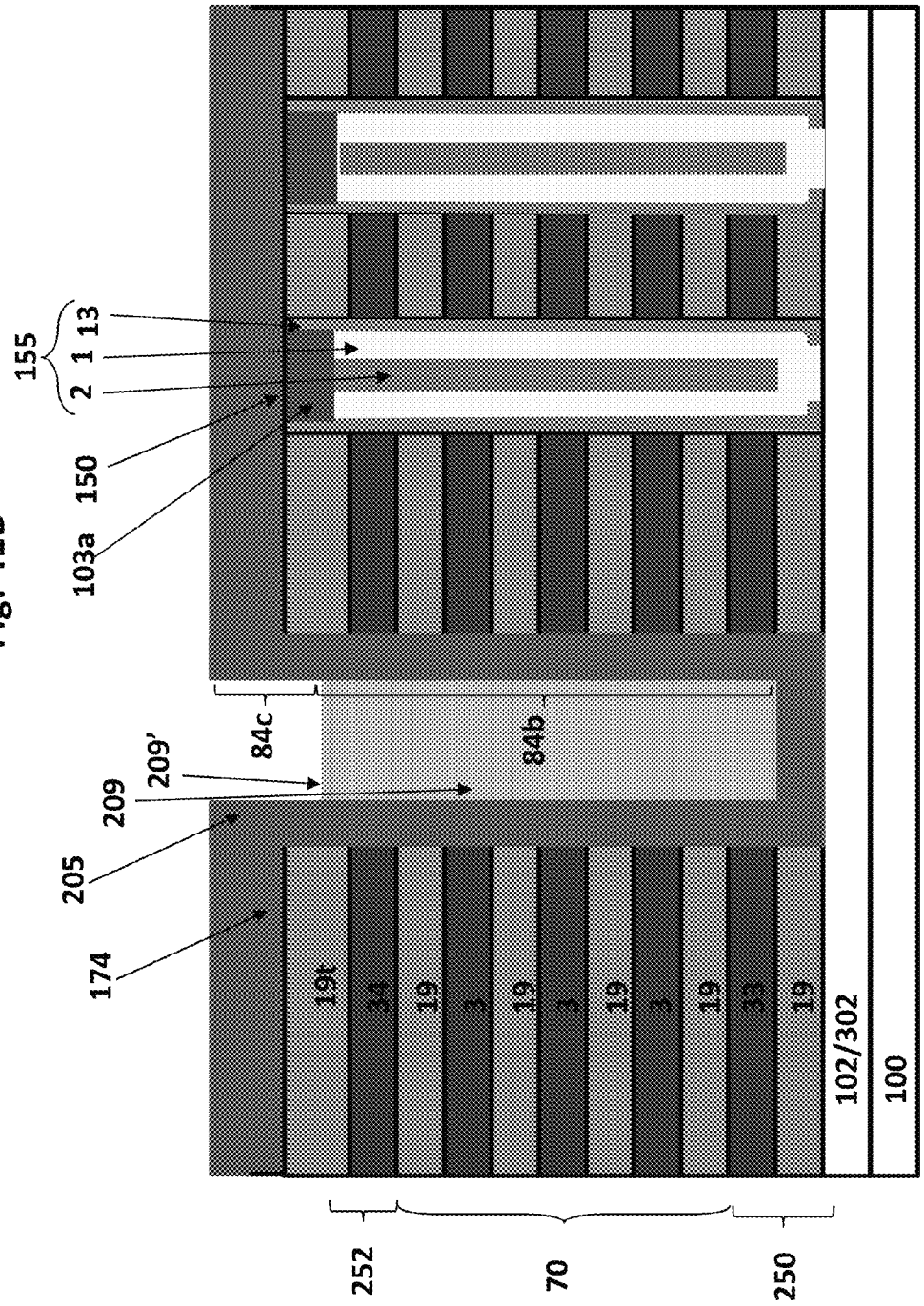
FIG. 41B is a side cross sectional view of the device along line F-F' in FIG. 41C.

In this alternative embodiment, following the anisotropic etch of the second trench material 209 as shown in FIG. 37, the second trench material 209 is then partially removed from a portion of the back side trench 84 to form a recessed portion 209' of the second trench material 209 in the back side trench 84, as shown in FIGS. 41A, 41B, and 41C. FIG. 41C is a top view of the step shown in FIGS. 41A and 41B. FIG. 41A is a side cross sectional view of the device along line E-E' in FIG. 41C. FIG. 41B is a side cross sectional view of the device along line F-F' in FIG. 41C. The second trench material 209 may be removed from an upper portion 84c of the back side trench 84, as shown in FIGS. 41A and 41B. The second trench material 209 may remain in a lower portion 84b of the back side trench 84, as shown in FIGS. 41A and 41B.

Figure 42:
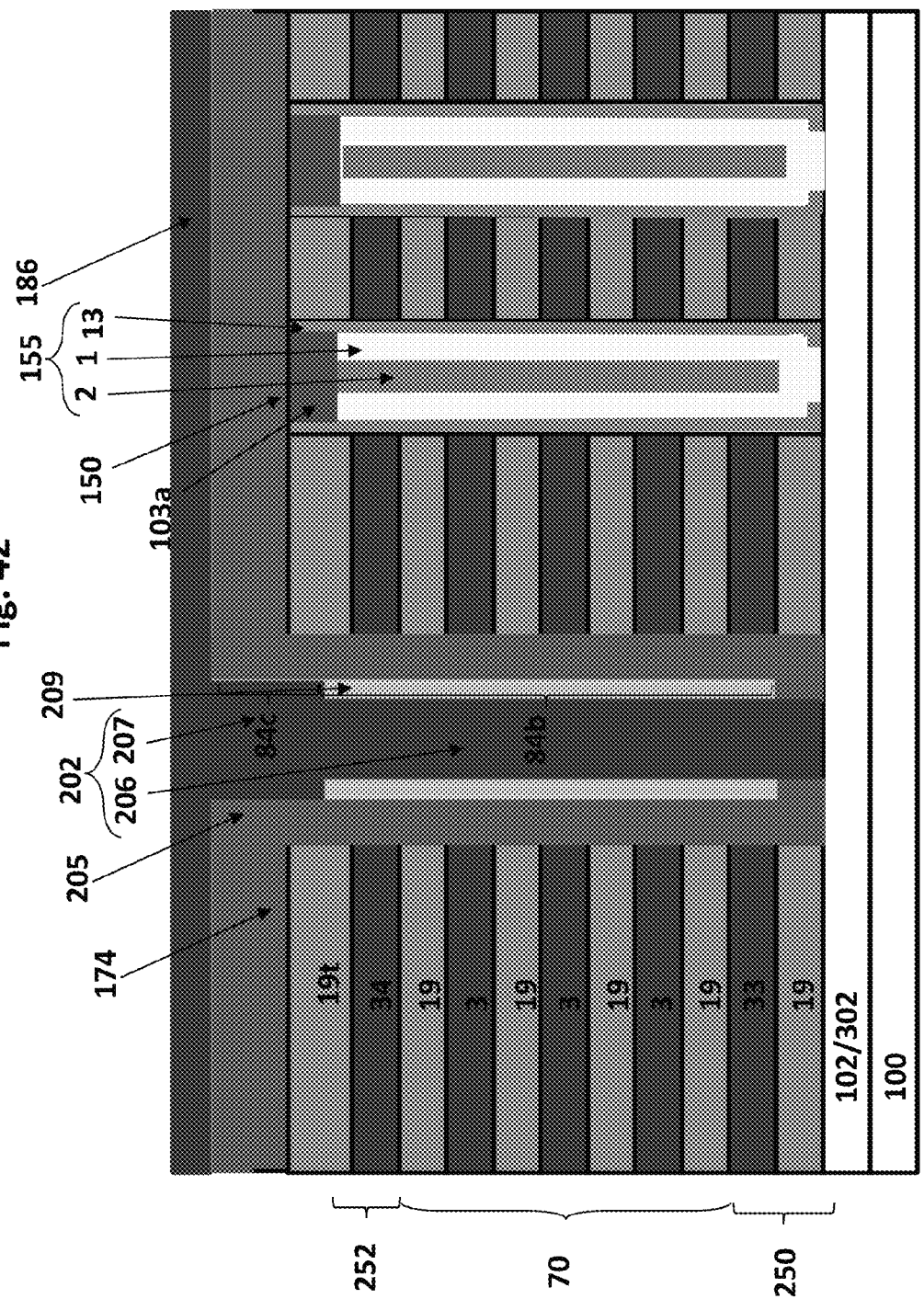

The first trench material comprising at least one electrically conductive pillar 206 and an electrically conductive layer 207 is then formed in the back side trench 84, as shown in FIG. 42. The electrically conductive pillar 206 is formed in the lower portion 84b of the back side trench 84, while the electrically conductive layer 207 is formed in the upper portion 84c of the back side trench 84. The electrically conductive pillar 206 and the electrically conductive layer 207 together form the source electrode 202. The first trench material may be any suitable metal or metal alloy, such as TiN, ruthenium, and/or tungsten.

Figure 43A:
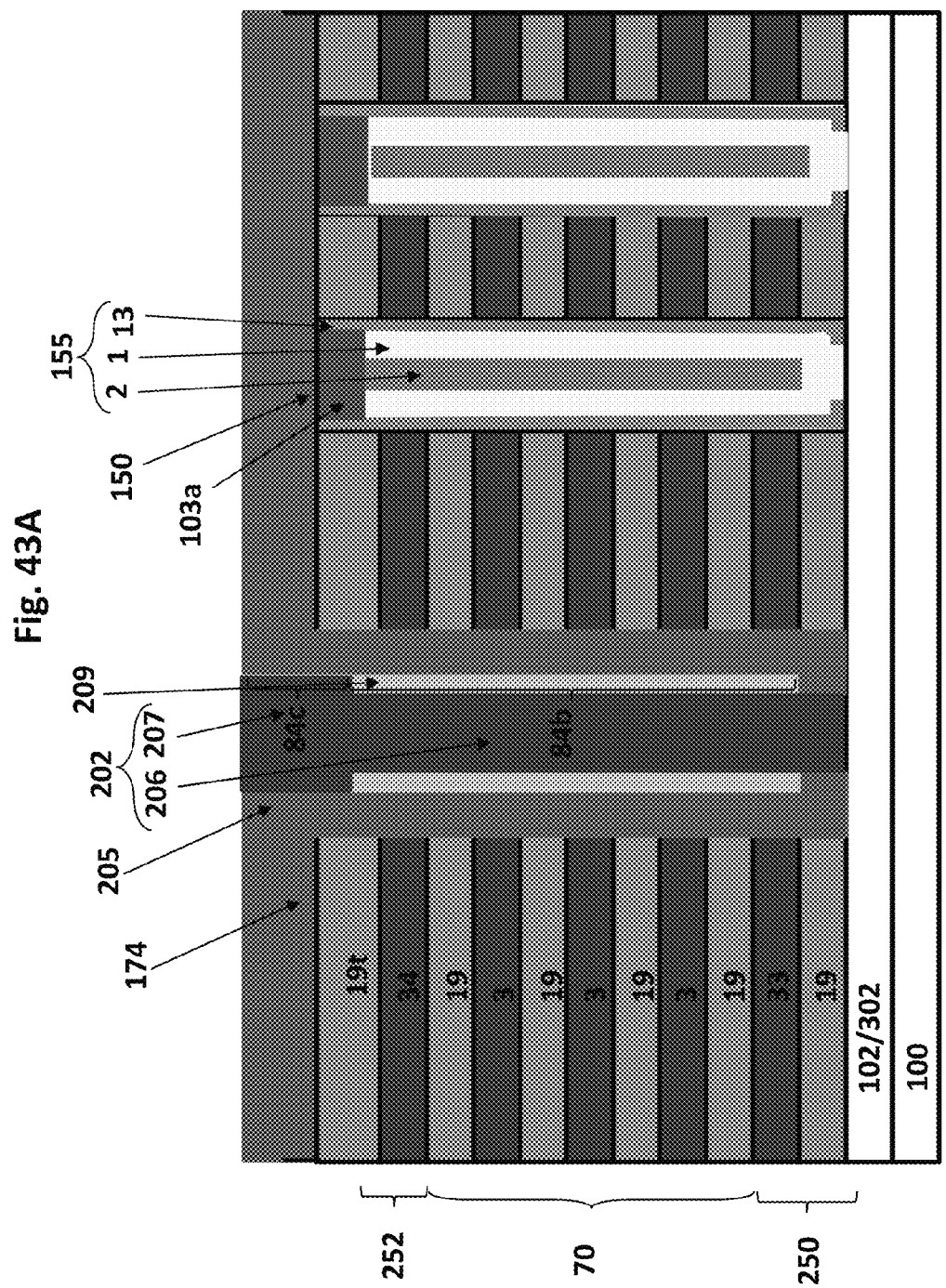
Figure 43C:
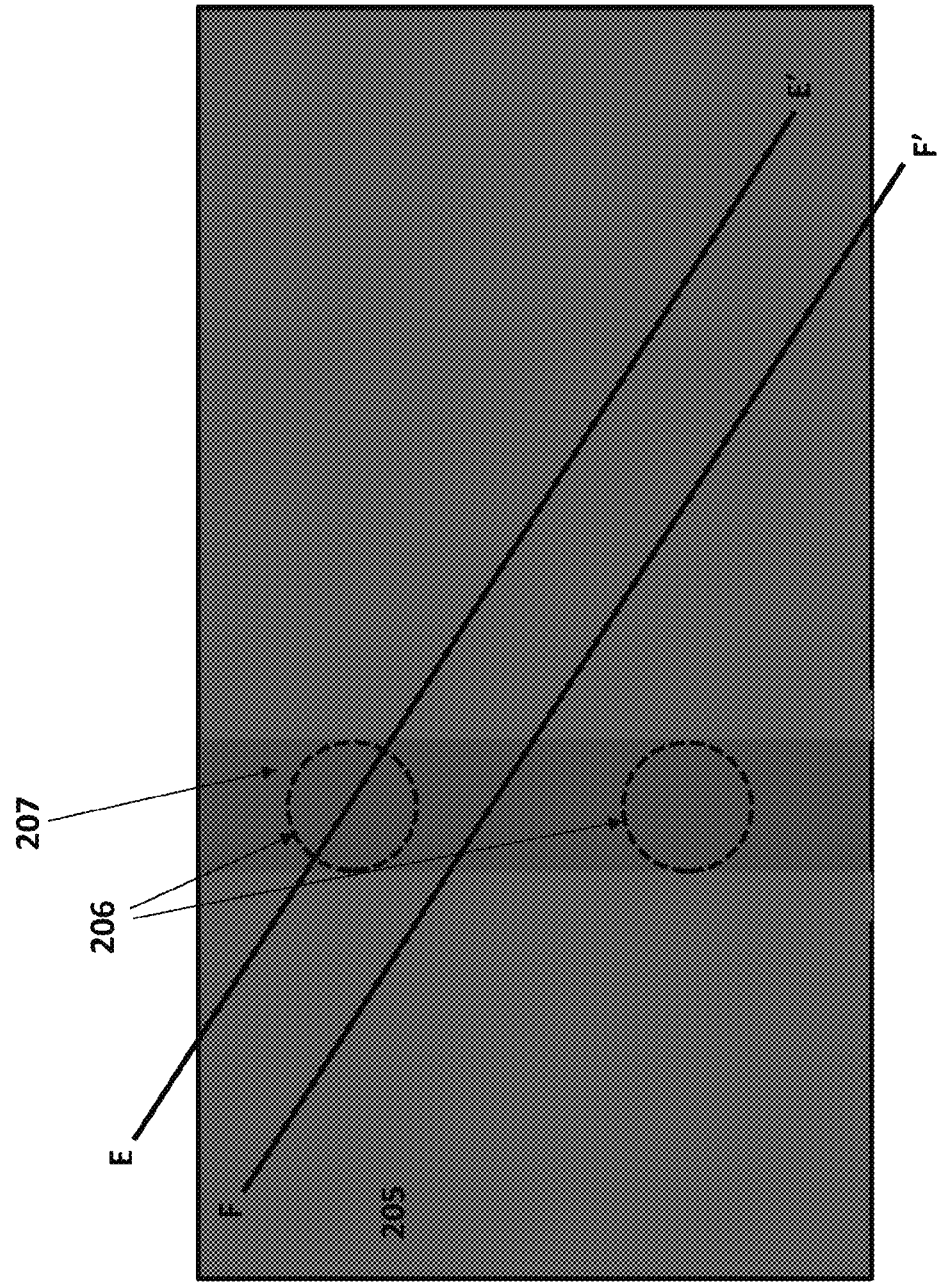
FIG. 43C is a top view of the step shown in FIGS. 43A and 43B.

A portion 186 of the source electrode material located over the device is removed by CMP or etching to leave the first material only in the back side trench 84, as shown in FIG. 43A. FIG. 43C is a top view of the step shown in FIGS. 43A and 43B. FIG. 43A is a side cross sectional view of the device along line E-E' in FIG. 43C. FIG. 43B is a side cross sectional view of the device along line F-F' in FIG. 43C. As shown in FIG. 43C, the electrically conductive layer 207 extends over the back side trench 84. FIG. 43B shows the electrically conductive layer 207 is located in the upper portion 84c of the back side trench 84 even in portions of the back side trench 84 that do not include an electrically conductive pillar 206.

An insulator layer 205a is formed over layer 205 and electrically conductive layer 207, as shown in FIG. 44A.

Figure 44B:
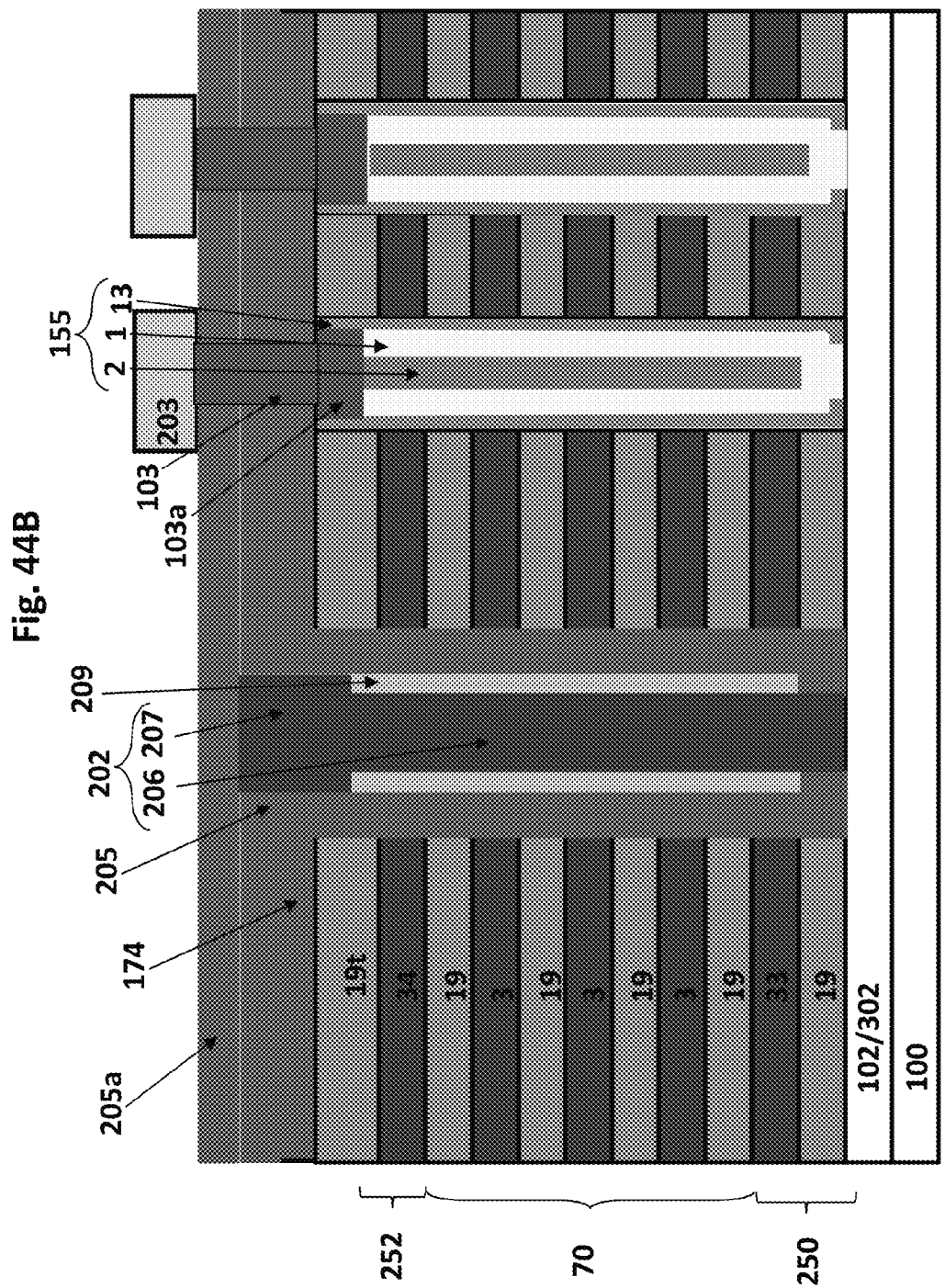

A drain contact 103 in contact with doped drain 103a is formed in an opening in layers 174, 205, and 205a. A bit line (drain electrode) 203 in contact with drain contact 103 is formed above the drain, as shown in FIG. 44B.

While formation of a portion of one memory block 400 is shown in FIGS. 6 to 47, it should be understood that the same method may be used to form one or more than one memory blocks 400 shown in FIGS. 1A and 2A. The method to form other memory block(s) 400 includes forming a second back side trench 84b, forming a second source electrode 202a in the second back side trench, and forming at least one row of front side memory openings 81, such as an least a 4×4 array of front side memory openings, between the first back side trench 84 and the second back side trench 84b. The method also includes forming an optional blocking dielectric 7 in each of the memory openings 81, forming a charge storage region 9 over the blocking dielectric in each of the memory openings, and forming a tunnel dielectric 11 over the charge storage region in each of the memory openings. The method also includes removing the blocking dielectric, the charge storage region and the tunnel dielectric from the bottom of each of the memory openings 81, forming a semiconductor channel in each of the memory openings in contact with the optional source contact 102, or the substrate 100 or p-well 302.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three dimensional NAND memory device, comprising:

a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level;

an interlevel insulating layer located between the first control gate electrode and the second control gate electrode;

a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;

at least one memory film located between each of the plurality of control gate electrodes and each respective semiconductor channel of the plurality of semiconductor channels; and at least one first trench extending substantially perpendicular to the major surface of the substrate, the at least one first trench filled with at least a first trench material and a second trench material;

wherein trench further comprises an electrically insulating material located on the walls of the trench to electrically insulate the plurality of control gate electrodes from the first trench material; and wherein the first trench material comprises a material under a first magnitude of a first stress type, and the second trench material comprises a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate.

2. The monolithic three dimensional NAND memory device of claim 1,
wherein the first stress type is tensile stress and the first trench material comprises the material under first magnitude of tensile stress, and
wherein the second stress type is compressive stress and the second trench material comprises the material under compressive stress.

3. The monolithic three dimensional NAND memory device of claim 1,
wherein the first stress type is compressive stress and the first trench material comprises the material under first magnitude of compressive stress, and
wherein the second stress type is tensile stress and the second trench material comprises the material under tensile stress.

4. The monolithic three dimensional NAND memory device of claim 1,
wherein the first stress type is tensile stress and the first trench material comprises the material under first magnitude of tensile stress;
wherein the second stress type is compressive stress and the second trench material comprises a material under compressive stress; and
wherein the plurality of control gate electrodes are under tensile stress.

5. The monolithic three dimensional NAND memory device of claim 1, wherein the first trench material comprises a plurality of electrically conductive pillars having a major axis substantially perpendicular to the major surface of the substrate.

6. The monolithic three dimensional NAND memory device of claim 5, wherein the first trench material further comprises an electrically conductive layer contacting the plurality of pillars, wherein the electrically conductive layer is substantially parallel to the major surface of the substrate.

7. The monolithic three dimensional NAND memory device of claim 1, wherein:
the plurality of control gate electrodes comprise an electrically conductive material;
the first trench material comprises an electrically conductive source electrode material contacting a source region in the substrate; and
the second trench material comprises an electrically insulating, electrically conductive, or semiconductor material.

8. The monolithic three dimensional NAND memory device of claim 7, wherein:
the plurality of control gate electrodes comprise tungsten or a tungsten alloy;
the first trench material comprises tungsten or a tungsten alloy; and
the second trench material comprises a material selected from diamond-like carbon, N+ doped polycrystalline silicon, amorphous carbon, silicon carbide, silicon nitride, silicon oxynitride, and silicon carbonitride.

9. The monolithic three dimensional NAND memory device of claim 7, wherein:

the plurality of control gate electrodes comprise tungsten or a tungsten alloy;
the first trench material comprises tungsten or a tungsten alloy; and
the second trench material comprises an air gap.

10. The monolithic three dimensional NAND memory device of claim 1, wherein:
the first trench material comprises a plurality of electrically conductive pillars having a major axis substantially perpendicular to the major surface of the substrate; and
the second trench material is located between each of the plurality of electrically conductive pillars.

11. The monolithic three dimensional NAND memory device of claim 1,
wherein the semiconductor channel has a pillar shape and extends substantially perpendicular to the major surface of the substrate; and
further comprising one of a source or drain electrode which contacts the pillar-shaped semiconductor channel from above, and another one of a source or drain electrode which contacts the pillar-shaped semiconductor channel from below.

12. The monolithic three dimensional NAND memory device of claim 1, wherein:
the semiconductor channel has J-shaped pipe shape;
a wing portion of the J-shaped pipe shape semiconductor channel extends substantially perpendicular to the major surface of the substrate and a connecting portion of the J-shaped pipe shape semiconductor channel which connects to the wing portion extends substantially parallel to the major surface of the substrate;
a source region and a drain region each contact the semiconductor channel;
a drain electrode contacts the drain region in the first wing portion of the semiconductor channel from above; and
the first trench material comprises a pillar shaped source electrode which contacts the source region in the connecting portion of the semiconductor channel from above.

13. The monolithic three dimensional NAND memory device of claim 11, further comprising:
a rail shaped source line which electrically contacts an electrode shunt and the source electrode, wherein:
the source line is located in the trench, and
the source line extends substantially parallel to the plurality of control gate electrodes; and
a bit line which is electrically connected to the drain electrode, wherein the bit line is located above the semiconductor channel, and the bit line extends substantially perpendicular to the plurality of control gate electrodes and to the source line.

14. A monolithic three dimensional NAND memory device, comprising:
a silicon substrate;
an array of monolithic three dimensional NAND strings having a plurality of device levels disposed above the silicon substrate; and
a driver circuit associated with the array located above or in the silicon substrate;
wherein each monolithic three dimensional NAND string of the array of monolithic three dimensional NAND strings comprises:
a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level;

an interlevel insulating layer located between the first control gate electrode and the second control gate electrode;

a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;

at least one memory film located between each of the plurality of control gate electrodes and each respective semiconductor channel of the plurality of semiconductor channels; and at least one first trench extending substantially perpendicular to the major surface of the substrate, the at least one first trench filled with at least a first trench material and a second trench material;

wherein the first trench material comprises a plurality of electrically conductive pillars having a major axis substantially perpendicular to the major surface of the substrate, and wherein the first trench material comprises a material under a first magnitude of a first stress type, and the second trench material comprises a material under no stress, a second stress type opposite the first stress type, or a second magnitude of the first stress type lower than the first magnitude of the first stress type to offset warpage of the substrate due to the stress imposed by at least one of the first trench material or the plurality of control gate electrodes on the substrate.

* * * * *